(12) United States Patent
Iriguchi et al.

(10) Patent No.: US 11,888,494 B2
(45) Date of Patent: Jan. 30, 2024

(54) SEMICONDUCTOR INTEGRATED CIRCUIT

(71) Applicant: Nuvoton Technology Corporation Japan, Kyoto (JP)

(72) Inventors: Masao Iriguchi, Kanagawa (JP); Yosuke Goto, Osaka (JP)

(73) Assignee: Nuvoton Technology Corporation Japan, Kyoto (JP)

( * ) Notice: Subject to any disclaimer, the term of this patent is extended or adjusted under 35 U.S.C. 154(b) by 50 days.

(21) Appl. No.: 17/680,544

(22) Filed: Feb. 25, 2022

(65) Prior Publication Data

US 2022/0182066 A1 Jun. 9, 2022

Related U.S. Application Data

(63) Continuation of application No. PCT/JP2020/032770, filed on Aug. 28, 2020.

(30) Foreign Application Priority Data

Aug. 29, 2019 (JP) ................................ 2019-156598

(51) Int. Cl.
*H03M 1/10* (2006.01)
*H03M 1/00* (2006.01)

(52) U.S. Cl.
CPC ......... *H03M 1/1071* (2013.01); *H03M 1/002* (2013.01)

(58) Field of Classification Search
CPC ...... H03M 1/468; H03M 1/804; H03M 1/462; H03M 1/1047; H03M 1/46; H03M 1/466; H03M 1/12; H03M 1/38; H03M 1/00; H03M 1/1009; H03M 1/1023; H03M 1/0607; H03M 1/1061; H03M 1/109;
(Continued)

(56) References Cited

U.S. PATENT DOCUMENTS 4,399,426 A * 8/1983 Tan ...................... H03M 1/183
341/172
5,175,547 A 12/1992 Lyon et al.
(Continued)

FOREIGN PATENT DOCUMENTS

JP 2010-273118 A 12/2010
JP 5412369 B2 2/2014
(Continued)

OTHER PUBLICATIONS

International Search Report issued in International Patent Application No. PCT/JP2020/032770, dated Nov. 17, 2020; with English translation.
(Continued)

*Primary Examiner* — Linh V Nguyen
(74) *Attorney, Agent, or Firm* — Rimon, P.C.

(57) ABSTRACT

A semiconductor circuit includes: an analog circuit that inputs a measured signal; and a digital circuit that outputs a digital output signal. The analog circuit includes: a correction element group including one or more correction elements each for correcting an offset that is an amount of shift caused by a variation in characteristics of the analog circuit to occur in a path for transmitting the measured signal; and a test element group including one or more test elements for testing the one or more correction elements. The digital circuit tests the correction element group using the test element group.

21 Claims, 53 Drawing Sheets

(58) Field of Classification Search
CPC ............. H03M 1/1038; H03M 1/1071; H03M 1/1245; H03M 1/10; H03M 1/40; H03M 1/18
USPC .................... 341/118–121, 155, 161, 172
See application file for complete search history.

(56) References Cited

U.S. PATENT DOCUMENTS

| | | | | |
|---|---|---|---|---|
| 6,445,319 | B1* | 9/2002 | Bugeja | H03M 1/1038 |
| | | | | 341/138 |
| 8,421,658 | B1* | 4/2013 | Yau | H03M 1/1004 |
| | | | | 341/172 |
| 8,638,248 | B2* | 1/2014 | Wu | H03M 1/1047 |
| | | | | 341/118 |
| 8,947,290 | B2* | 2/2015 | Miki | H03M 1/1061 |
| | | | | 341/172 |
| 9,013,442 | B2* | 4/2015 | Hotelling | G06F 3/04166 |
| | | | | 345/173 |
| 9,106,243 | B2* | 8/2015 | Lee | H03M 1/1245 |
| 9,154,146 | B1* | 10/2015 | Chiu | H03M 1/1042 |
| 9,559,716 | B1* | 1/2017 | Matsui | H03M 1/1061 |
| 9,698,804 | B1* | 7/2017 | Funato | H03M 1/0617 |
| 9,954,545 | B2* | 4/2018 | Haneda | H03M 1/06 |
| 2010/0295590 | A1 | 11/2010 | Yoshihara et al. | |
| 2011/0260899 | A1* | 10/2011 | Snedeker | H03M 1/1047 |
| | | | | 341/118 |
| 2011/0268170 | A1 | 11/2011 | Masuhara et al. | |
| 2015/0188557 | A1 | 7/2015 | Umezaki et al. | |
| 2017/0045578 | A1 | 2/2017 | Okuda et al. | |
| 2021/0250039 | A1* | 8/2021 | Konno | H03M 1/0656 |

FOREIGN PATENT DOCUMENTS

| | | |
|---|---|---|
| JP | 2015-128203 A | 7/2015 |
| JP | 2017-038200 A | 2/2017 |
| JP | 2017-046252 A | 3/2017 |

OTHER PUBLICATIONS

Verbruggen et al., "A 2.1 mW 11b 410 MS/s Dynamic Pipelined SAR ADC with Background Calibration in 28 nm Digital CMOS," VLSI Symposium 2013.

Kobayashi et al., "Digitally-Assisted Analog Test Technology," The Institute of Electronics, Information and Communication Engineers Technical Committee on Integrated Circuits and Devices, Jul. 22, 2010 with partial English translation (pp. 36-40).

Malki et al., "A Complementary Dynamic Residue Amplifier for a 67 dB SNDR 1.36 mW170 MS/S Pipelined SAR ADF," ESSCIRC 2014 Gain correction function in FIG. 31.

* cited by examiner

FIG. 9

<Mapping 1>

| Code | Comparator offset correction control code | | | | | | | | Amount of offset correction [mV] | | | |
|---|---|---|---|---|---|---|---|---|---|---|---|---|
| | CC3p | CC2p | CC1p | CC0p | CC3n | CC2n | CC1n | CC0n | Vcalp | Vcalm | Vcalp-Vcalm | Vincp |
| 15 | 1 | 1 | 1 | 1 | 0 | 0 | 0 | 0 | 11.872 | 0.000 | 11.872 | Vin-Voff-11.872 |
| 14 | 1 | 1 | 1 | 0 | 0 | 0 | 0 | 0 | 10.872 | 0.000 | 10.872 | Vin-Voff-10.872 |
| 13 | 1 | 1 | 0 | 1 | 0 | 0 | 0 | 0 | 10.072 | 0.000 | 10.072 | Vin-Voff-10.072 |
| 12 | 1 | 1 | 0 | 0 | 0 | 0 | 0 | 0 | 9.072 | 0.000 | 9.072 | Vin-Voff-9.072 |
| 11 | 1 | 0 | 1 | 1 | 0 | 0 | 0 | 0 | 8.632 | 0.000 | 8.632 | Vin-Voff-8.632 |
| 10 | 1 | 0 | 1 | 0 | 0 | 0 | 0 | 0 | 7.632 | 0.000 | 7.632 | Vin-Voff-7.632 |
| 9 | 1 | 0 | 0 | 1 | 0 | 0 | 0 | 0 | 6.832 | 0.000 | 6.832 | Vin-Voff-6.832 |
| 8 | 1 | 0 | 0 | 0 | 0 | 0 | 0 | 0 | 5.832 | 0.000 | 5.832 | Vin-Voff-5.832 |
| 7 | 0 | 1 | 1 | 1 | 0 | 0 | 0 | 0 | 6.04 | 0.000 | 6.040 | Vin-Voff-6.040 |
| 6 | 0 | 1 | 1 | 0 | 0 | 0 | 0 | 0 | 5.04 | 0.000 | 5.040 | Vin-Voff-5.040 |
| 5 | 0 | 1 | 0 | 1 | 0 | 0 | 0 | 0 | 4.24 | 0.000 | 4.240 | Vin-Voff-4.240 |
| 4 | 0 | 1 | 0 | 0 | 0 | 0 | 0 | 0 | 3.24 | 0.000 | 3.240 | Vin-Voff-3.240 |
| 3 | 0 | 0 | 1 | 1 | 0 | 0 | 0 | 0 | 2.8 | 0.000 | 2.800 | Vin-Voff-2.800 |
| 2 | 0 | 0 | 1 | 0 | 0 | 0 | 0 | 0 | 1.8 | 0.000 | 1.800 | Vin-Voff-1.800 |
| 1 | 0 | 0 | 0 | 1 | 0 | 0 | 0 | 0 | 1 | 0.000 | 1.000 | Vin-Voff-1.000 |
| 0 | 0 | 0 | 0 | 0 | 0 | 0 | 0 | 0 | 0 | 0.000 | 0.000 | Vin-Voff-0.000 |
| -1 | 0 | 0 | 0 | 0 | 0 | 0 | 0 | 1 | 0 | 1.000 | -1.000 | Vin-Voff+1.000 |
| -2 | 0 | 0 | 0 | 0 | 0 | 0 | 1 | 0 | 0 | 1.800 | -1.800 | Vin-Voff+1.800 |
| -3 | 0 | 0 | 0 | 0 | 0 | 0 | 1 | 1 | 0 | 2.800 | -2.800 | Vin-Voff+2.800 |
| -4 | 0 | 0 | 0 | 0 | 0 | 1 | 0 | 0 | 0 | 3.240 | -3.240 | Vin-Voff+3.240 |
| -5 | 0 | 0 | 0 | 0 | 0 | 1 | 0 | 1 | 0 | 4.240 | -4.240 | Vin-Voff+4.240 |
| -6 | 0 | 0 | 0 | 0 | 0 | 1 | 1 | 0 | 0 | 5.040 | -5.040 | Vin-Voff+5.040 |
| -7 | 0 | 0 | 0 | 0 | 0 | 1 | 1 | 1 | 0 | 6.040 | -6.040 | Vin-Voff+6.040 |
| -8 | 0 | 0 | 0 | 0 | 1 | 0 | 0 | 0 | 0 | 5.832 | -5.832 | Vin-Voff+5.832 |
| -9 | 0 | 0 | 0 | 0 | 1 | 0 | 0 | 1 | 0 | 6.832 | -6.832 | Vin-Voff+6.832 |
| -10 | 0 | 0 | 0 | 0 | 1 | 0 | 1 | 0 | 0 | 7.632 | -7.632 | Vin-Voff+7.632 |
| -11 | 0 | 0 | 0 | 0 | 1 | 0 | 1 | 1 | 0 | 8.632 | -8.632 | Vin-Voff+8.632 |
| -12 | 0 | 0 | 0 | 0 | 1 | 1 | 0 | 0 | 0 | 9.072 | -9.072 | Vin-Voff+9.072 |
| -13 | 0 | 0 | 0 | 0 | 1 | 1 | 0 | 1 | 0 | 10.072 | -10.072 | Vin-Voff+10.072 |
| -14 | 0 | 0 | 0 | 0 | 1 | 1 | 1 | 0 | 0 | 10.872 | -10.872 | Vin-Voff+10.872 |
| -15 | 0 | 0 | 0 | 0 | 1 | 1 | 1 | 1 | 0 | 11.872 | -11.872 | Vin-Voff+11.872 |
| | 5.832C | 3.24C | 1.8C | 1C | 5.832C | 3.24C | 1.8C | 1C | | | | |
| | 5.832 | 3.24 | 1.8 | 1 | 5.832 | 3.24 | 1.8 | 1 | [mV] | | | |

← Weighting for capacitor
← Weighting for amount of correction

FIG. 10

<Mapping 2>

| Code | Comparator offset correction control code ||||||||| Amount of offset correction [mV] ||||
|---|---|---|---|---|---|---|---|---|---|---|---|---|---|
| | CC3p | CC2p | CC1p | CC0p | CC3n | CC2n | CC1n | CC0n | Vcalp | Vcalm | Vcalp-Vcalm | Vincp |
| 15 | 1 | 1 | 1 | 1 | 0 | 0 | 0 | 0 | 11.872 | 0.000 | 11.872 | Vin-Voff-11.872 |
| 14 | 1 | 1 | 1 | 0 | 0 | 0 | 0 | 1 | 11.872 | 1.000 | 10.872 | Vin-Voff-10.872 |
| 13 | 1 | 1 | 0 | 1 | 0 | 0 | 1 | 0 | 10.872 | 1.000 | 9.872 | Vin-Voff-9.872 |
| 12 | 1 | 1 | 1 | 0 | 0 | 0 | 1 | 1 | 10.872 | 1.800 | 9.072 | Vin-Voff-9.072 |
| 11 | 1 | 1 | 0 | 1 | 0 | 0 | 1 | 1 | 10.072 | 1.800 | 8.272 | Vin-Voff-8.272 |
| 10 | 1 | 1 | 0 | 0 | 0 | 0 | 1 | 1 | 10.072 | 2.800 | 7.272 | Vin-Voff-7.272 |
| 9 | 1 | 0 | 1 | 1 | 0 | 1 | 0 | 0 | 9.072 | 2.800 | 6.272 | Vin-Voff-6.272 |
| 8 | 1 | 0 | 1 | 0 | 0 | 1 | 0 | 1 | 9.072 | 3.240 | 5.832 | Vin-Voff-5.832 |
| 7 | 1 | 0 | 0 | 1 | 0 | 1 | 1 | 0 | 8.632 | 3.240 | 5.392 | Vin-Voff-5.392 |
| 6 | 1 | 0 | 1 | 0 | 0 | 1 | 1 | 1 | 8.632 | 4.240 | 4.392 | Vin-Voff-4.392 |
| 5 | 1 | 0 | 0 | 1 | 0 | 1 | 1 | 1 | 7.632 | 4.240 | 3.392 | Vin-Voff-3.392 |
| 4 | 1 | 0 | 0 | 0 | 0 | 1 | 1 | 1 | 7.632 | 5.040 | 2.592 | Vin-Voff-2.592 |
| 3 | 0 | 1 | 1 | 1 | 1 | 0 | 0 | 0 | 6.832 | 5.040 | 1.792 | Vin-Voff-1.792 |
| 2 | 0 | 1 | 1 | 0 | 1 | 0 | 0 | 1 | 6.832 | 6.040 | 0.792 | Vin-Voff-0.792 |
| 1 | 0 | 1 | 0 | 1 | 1 | 0 | 1 | 0 | 5.832 | 6.040 | -0.208 | Vin-Voff--0.208 |
| 0 | 0 | 1 | 0 | 0 | 1 | 0 | 1 | 1 | 5.832 | 5.832 | 0.000 | Vin-Voff-0.000 |
| -1 | 0 | 1 | 1 | 1 | 1 | 0 | 0 | 0 | 6.04 | 5.832 | 0.208 | Vin-Voff+-0.208 |
| -2 | 0 | 0 | 1 | 1 | 1 | 1 | 0 | 0 | 6.04 | 6.832 | -0.792 | Vin-Voff+0.792 |
| -3 | 0 | 0 | 1 | 0 | 1 | 1 | 0 | 1 | 5.04 | 6.832 | -1.792 | Vin-Voff+1.792 |
| -4 | 0 | 0 | 0 | 1 | 1 | 1 | 1 | 0 | 5.04 | 7.632 | -2.592 | Vin-Voff+2.592 |
| -5 | 0 | 0 | 1 | 0 | 1 | 1 | 1 | 1 | 4.24 | 7.632 | -3.392 | Vin-Voff+3.392 |
| -6 | 0 | 0 | 0 | 1 | 1 | 1 | 1 | 1 | 4.24 | 8.632 | -4.392 | Vin-Voff+4.392 |
| -7 | 0 | 0 | 0 | 0 | 1 | 1 | 1 | 1 | 3.24 | 8.632 | -5.392 | Vin-Voff+5.392 |
| -8 | 0 | 0 | 0 | 1 | 1 | 0 | 1 | 0 | 3.24 | 9.072 | -5.832 | Vin-Voff+5.832 |
| -9 | 0 | 0 | 0 | 0 | 1 | 0 | 1 | 1 | 2.8 | 9.072 | -6.272 | Vin-Voff+6.272 |
| -10 | 0 | 0 | 0 | 1 | 1 | 1 | 0 | 0 | 2.8 | 10.072 | -7.272 | Vin-Voff+7.272 |
| -11 | 0 | 0 | 0 | 0 | 1 | 1 | 0 | 1 | 1.8 | 10.072 | -8.272 | Vin-Voff+8.272 |
| -12 | 0 | 0 | 0 | 1 | 1 | 1 | 1 | 0 | 1.8 | 10.872 | -9.072 | Vin-Voff+9.072 |
| -13 | 0 | 0 | 0 | 0 | 1 | 1 | 1 | 0 | 1 | 10.872 | -9.872 | Vin-Voff+9.872 |
| -14 | 0 | 0 | 0 | 0 | 1 | 0 | 1 | 1 | 1 | 11.872 | -10.872 | Vin-Voff+10.872 |
| -15 | 0 | 0 | 0 | 0 | 1 | 1 | 1 | 1 | 0 | 11.872 | -11.872 | Vin-Voff+11.872 |

| 5.832C | 3.24C | 1.8C | 1C | 5.832C | 3.24C | 1.8C | 1C | ← Weighting for capacitor |
| 5.832 | 3.24 | 1.8 | 1 | 5.832 | 3.24 | 1.8 | 1 | [mV] ← Weighting for amount of correction |

FIG. 12
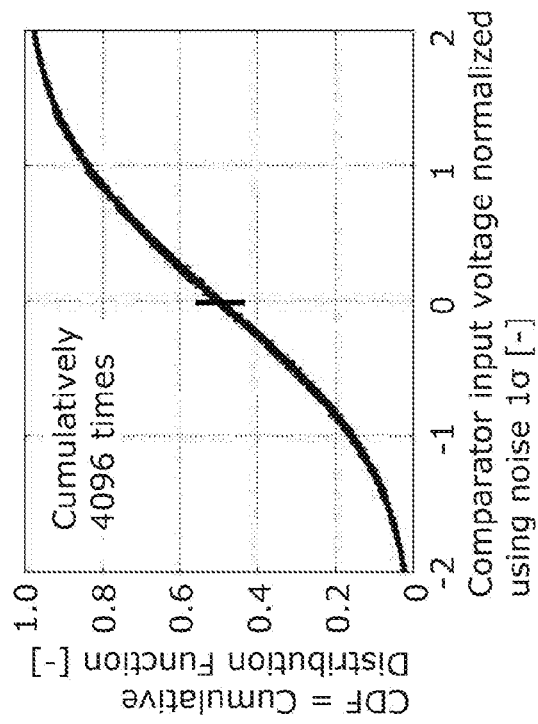
(a)
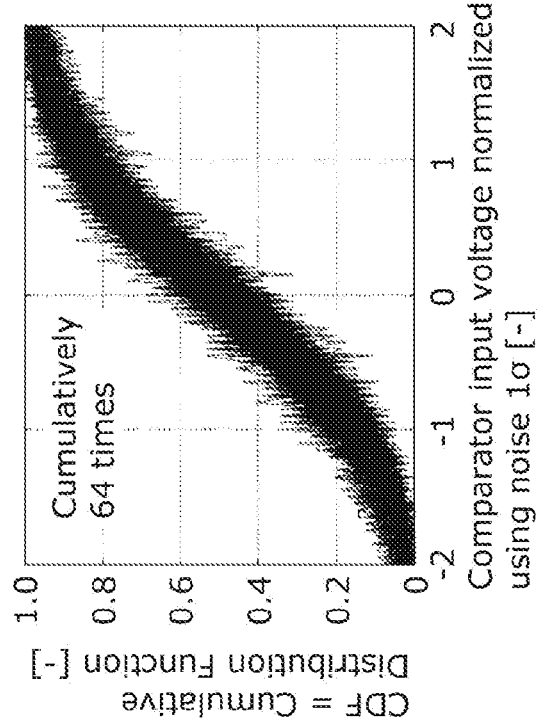
(b)

FIG. 17

(a) At time of setting first fixed code

| Code | Comparator offset correction control code | | | | | | | | | |
|---|---|---|---|---|---|---|---|---|---|---|
| | CC3p | CC2p | CC1p | CC0p | CCdp | CC3n | CC2n | CC1n | CC0n | CCdn |
| 8 | 1 | 0 | 0 | 0 | 0 | 0 | 0 | 0 | 0 | 0 |
| 7 | 1 | 0 | 0 | 0 | 0 | 0 | 0 | 0 | 1 | 0 |
| 6 | 1 | 0 | 0 | 0 | 0 | 0 | 0 | 1 | 0 | 0 |
| 5 | 1 | 0 | 0 | 0 | 0 | 0 | 0 | 1 | 1 | 0 |
| 4 | 1 | 0 | 0 | 0 | 0 | 0 | 1 | 0 | 0 | 0 |
| 3 | 1 | 0 | 0 | 0 | 0 | 0 | 1 | 0 | 1 | 0 |
| 2 | 1 | 0 | 0 | 0 | 0 | 0 | 1 | 1 | 0 | 0 |
| 1 | 1 | 0 | 0 | 0 | 0 | 0 | 1 | 1 | 1 | 0 |
| 0 | 1 | 0 | 0 | 0 | 0 | 1 | 0 | 0 | 0 | 0 |
| -1 | 1 | 0 | 0 | 0 | 0 | 1 | 0 | 0 | 1 | 0 |
| -2 | 1 | 0 | 0 | 0 | 0 | 1 | 0 | 1 | 0 | 0 |
| -3 | 1 | 0 | 0 | 0 | 0 | 1 | 0 | 1 | 1 | 0 |
| -4 | 1 | 0 | 0 | 0 | 0 | 1 | 1 | 0 | 0 | 0 |
| -5 | 1 | 0 | 0 | 0 | 0 | 1 | 1 | 0 | 1 | 0 |
| -6 | 1 | 0 | 0 | 0 | 0 | 1 | 1 | 1 | 0 | 0 |
| -7 | 1 | 0 | 0 | 0 | 0 | 1 | 1 | 1 | 1 | 0 |
| Weighting for capacitor → | 5.832C | 3.24C | 1.8C | 1C | 1C | 5.832C | 3.24C | 1.8C | 1C | 1C |
| Weighting for amount of correction → | 5.832 | 3.24 | 1.8 | 1 | 1 | 5.832 | 3.24 | 1.8 | 1 | 1 [mV] |

(b)

| Code | Amount of offset correction [mV] | | | |
|---|---|---|---|---|
| | Vcalp | Vcalm | Vcalpm | Vincp |
| 8 | 5.832 | 0.000 | 5.832 | Vin-Voff-5.832 |
| 7 | 5.832 | 1.000 | 4.832 | Vin-Voff-4.832 |
| 6 | 5.832 | 1.800 | 4.032 | Vin-Voff-4.032 |
| 5 | 5.832 | 2.800 | 3.032 | Vin-Voff-3.032 |
| 4 | 5.832 | 3.240 | 2.592 | Vin-Voff-2.592 |
| 3 | 5.832 | 4.240 | 1.592 | Vin-Voff-1.592 |
| 2 | 5.832 | 5.040 | 0.792 | Vin-Voff-0.792 |
| 1 | 5.832 | 6.040 | -0.208 | Vin-Voff+0.208 |
| 0 | 5.832 | 5.832 | 0.000 | Vin-Voff+0.000 |
| -1 | 5.832 | 6.832 | -1.000 | Vin-Voff+1.000 |
| -2 | 5.832 | 7.632 | -1.800 | Vin-Voff+1.800 |
| -3 | 5.832 | 8.632 | -2.800 | Vin-Voff+2.800 |
| -4 | 5.832 | 9.072 | -3.240 | Vin-Voff+3.240 |
| -5 | 5.832 | 10.072 | -4.240 | Vin-Voff+4.240 |
| -6 | 5.832 | 10.872 | -5.040 | Vin-Voff+5.040 |
| -7 | 5.832 | 11.872 | -6.040 | Vin-Voff+6.040 |

FIG. 18

(a) At time of setting second fixed code

Comparator offset correction control code

| Code | CC3p | CC2p | CC1p | CC0p | CCdp | CC3n | CC2n | CC1n | CC0n | CCdn |
|---|---|---|---|---|---|---|---|---|---|---|
| 8 | 0 | 1 | 1 | 1 | 1 | 0 | 0 | 0 | 0 | 0 |
| 7 | 0 | 1 | 1 | 1 | 1 | 0 | 0 | 1 | 0 | 0 |
| 6 | 0 | 1 | 1 | 1 | 1 | 0 | 0 | 1 | 1 | 0 |
| 5 | 0 | 1 | 1 | 1 | 1 | 0 | 1 | 0 | 0 | 0 |
| 4 | 0 | 1 | 1 | 1 | 1 | 0 | 1 | 0 | 1 | 0 |
| 3 | 0 | 1 | 1 | 1 | 1 | 0 | 1 | 1 | 0 | 0 |
| 2 | 0 | 1 | 1 | 1 | 1 | 0 | 1 | 1 | 1 | 0 |
| 1 | 0 | 1 | 1 | 1 | 1 | 1 | 0 | 0 | 0 | 0 |
| 0 | 0 | 1 | 1 | 1 | 1 | 1 | 0 | 0 | 1 | 0 |
| −1 | 0 | 1 | 1 | 1 | 1 | 1 | 0 | 1 | 0 | 0 |
| −2 | 0 | 1 | 1 | 1 | 1 | 1 | 0 | 1 | 1 | 0 |
| −3 | 0 | 1 | 1 | 1 | 1 | 1 | 1 | 0 | 0 | 0 |
| −4 | 0 | 1 | 1 | 1 | 1 | 1 | 1 | 0 | 1 | 0 |
| −5 | 0 | 1 | 1 | 1 | 1 | 1 | 1 | 1 | 0 | 0 |
| −6 | 0 | 1 | 1 | 1 | 1 | 1 | 1 | 1 | 1 | 0 |
| −7 | 0 | 1 | 1 | 1 | 1 | 1 | 1 | 1 | 1 | 1 |

Weighting for capacitor → 5.832C, 3.24C, 1.8C, 1C, 1C, 5.832C, 3.24C, 1.8C, 1C, 1C Weighting for amount of correction → 5.832, 3.24, 1.8, 1, 1, 5.832, 3.24, 1.8, 1, 1 [mV]

(b)

Amount of offset correction [mV]

| Code | Vcalp | Vcalm | Vcalpm | Vincp |
|---|---|---|---|---|
| 8 | 7.04 | 0.000 | 7.040 | Vin−Voff−7.040 |
| 7 | 7.04 | 1.000 | 6.040 | Vin−Voff−6.040 |
| 6 | 7.04 | 1.800 | 5.240 | Vin−Voff−5.240 |
| 5 | 7.04 | 2.800 | 4.240 | Vin−Voff−4.240 |
| 4 | 7.04 | 3.240 | 3.800 | Vin−Voff−3.800 |
| 3 | 7.04 | 4.240 | 2.800 | Vin−Voff−2.800 |
| 2 | 7.04 | 5.040 | 2.000 | Vin−Voff−2.000 |
| 1 | 7.04 | 6.040 | 1.000 | Vin−Voff−1.000 |
| 0 | 7.04 | 5.832 | 1.208 | Vin−Voff−1.208 |
| −1 | 7.04 | 6.832 | 0.208 | Vin−Voff−0.208 |
| −2 | 7.04 | 7.632 | −0.592 | Vin−Voff+0.592 |
| −3 | 7.04 | 8.632 | −1.592 | Vin−Voff+1.592 |
| −4 | 7.04 | 9.072 | −2.032 | Vin−Voff+2.032 |
| −5 | 7.04 | 10.072 | −3.032 | Vin−Voff+3.032 |
| −6 | 7.04 | 10.872 | −3.832 | Vin−Voff+3.832 |
| −7 | 7.04 | 11.872 | −4.832 | Vin−Voff+4.832 |

FIG. 39
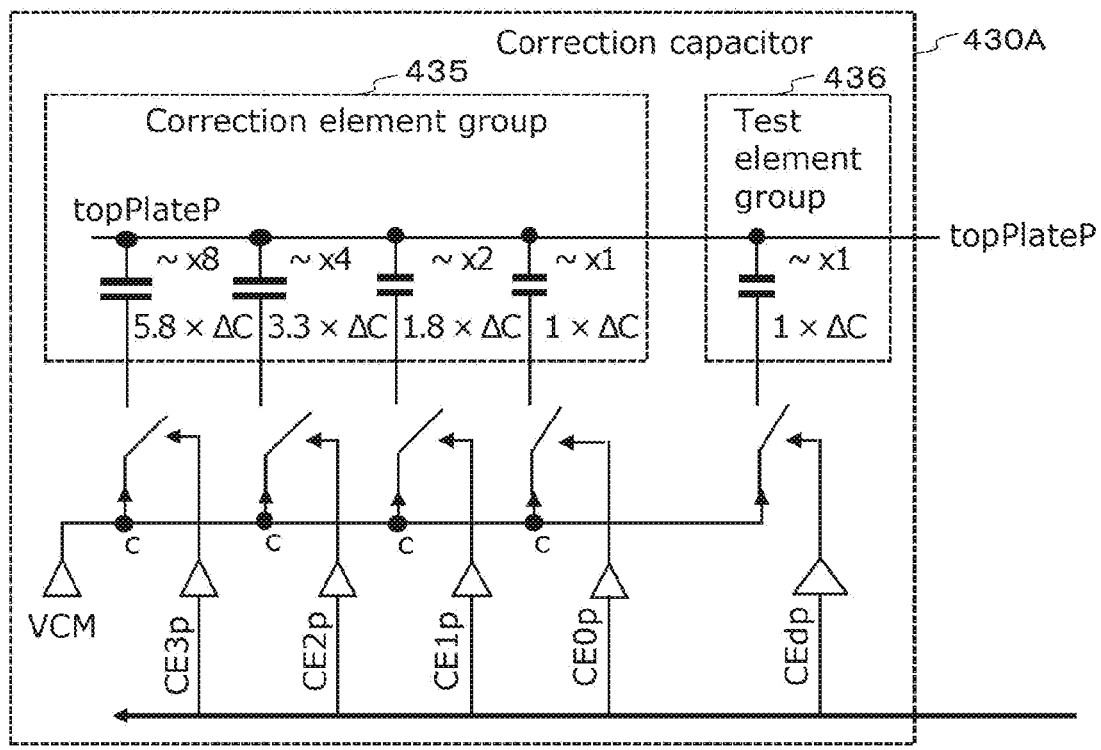
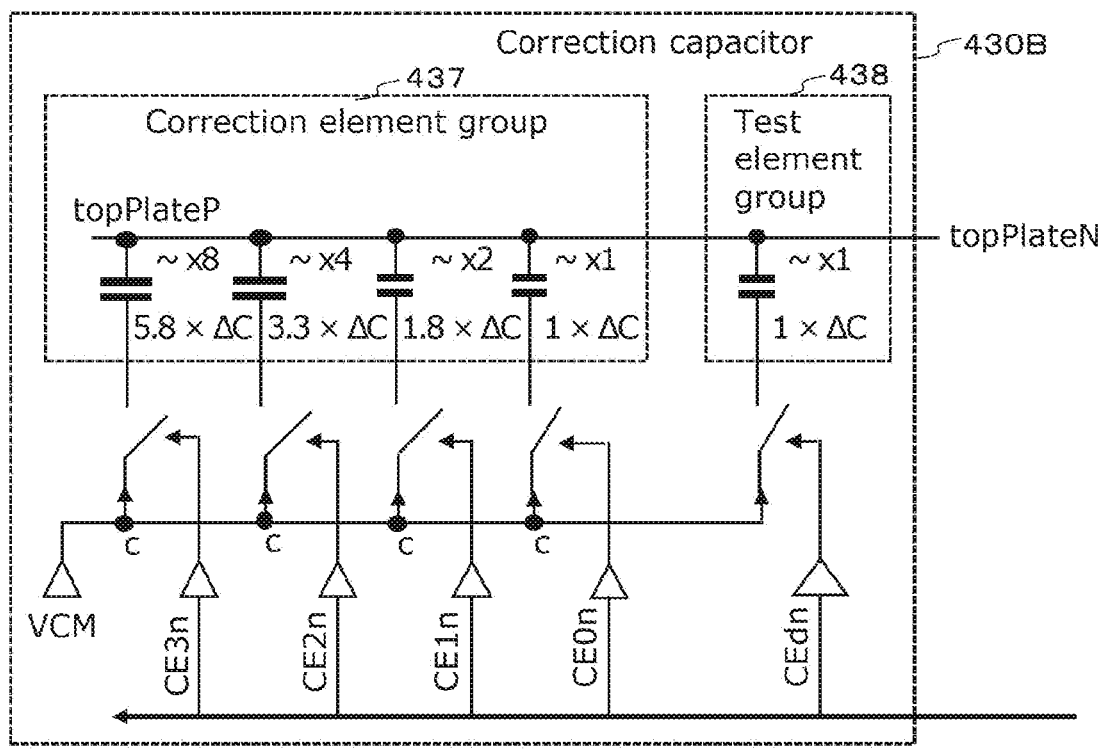

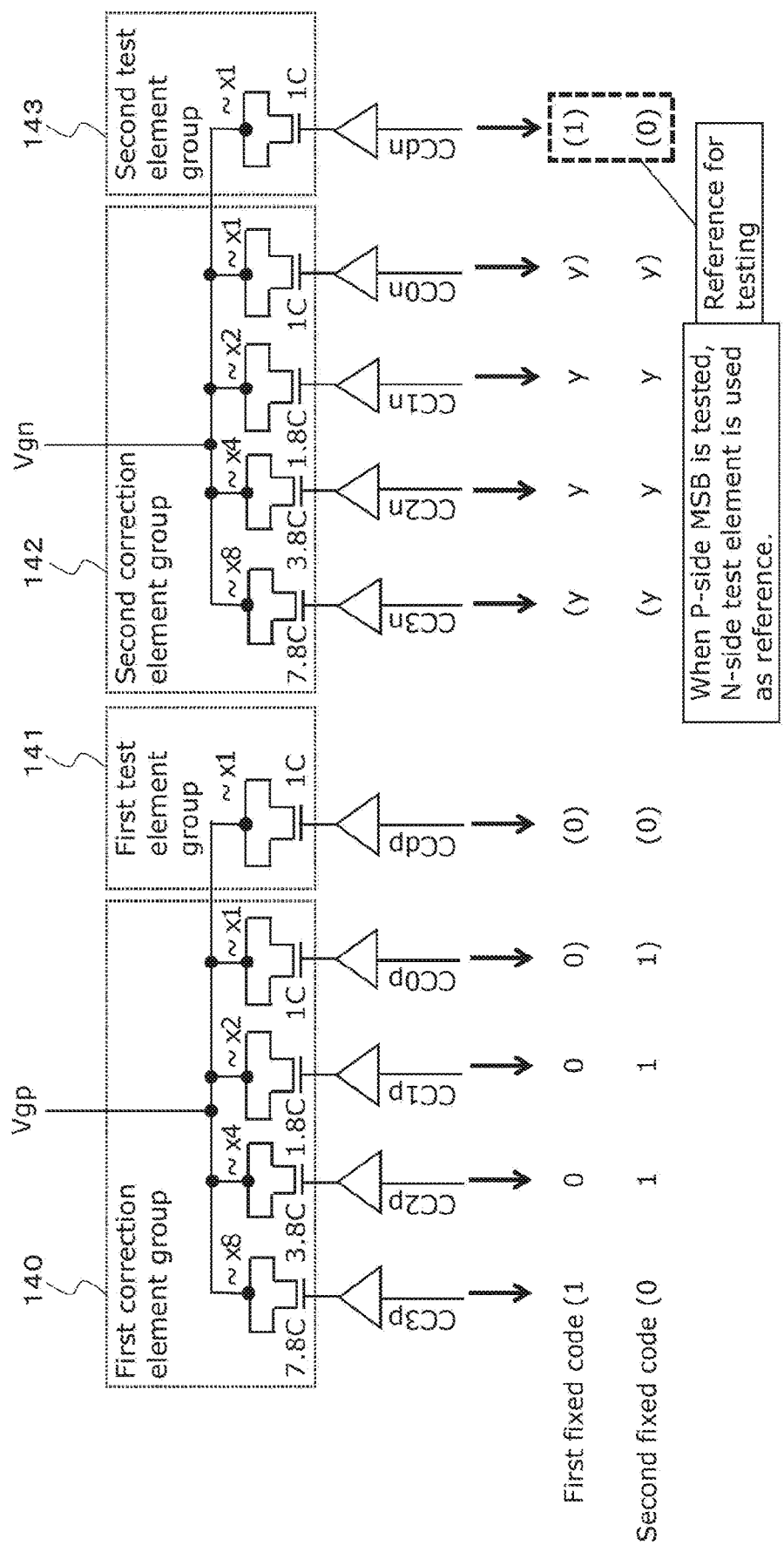

FIG. 49
(a) Amount of offset correction
(Adjacent elements at weight ratio of 2 to 1)
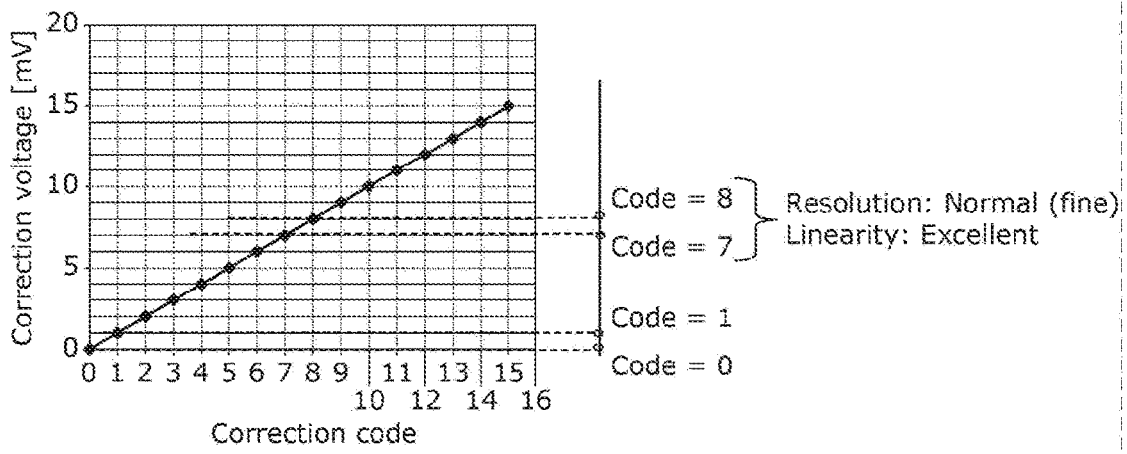
(b) Amount of offset correction
(Adjacent elements at weight ratio of 1.8 to 1)
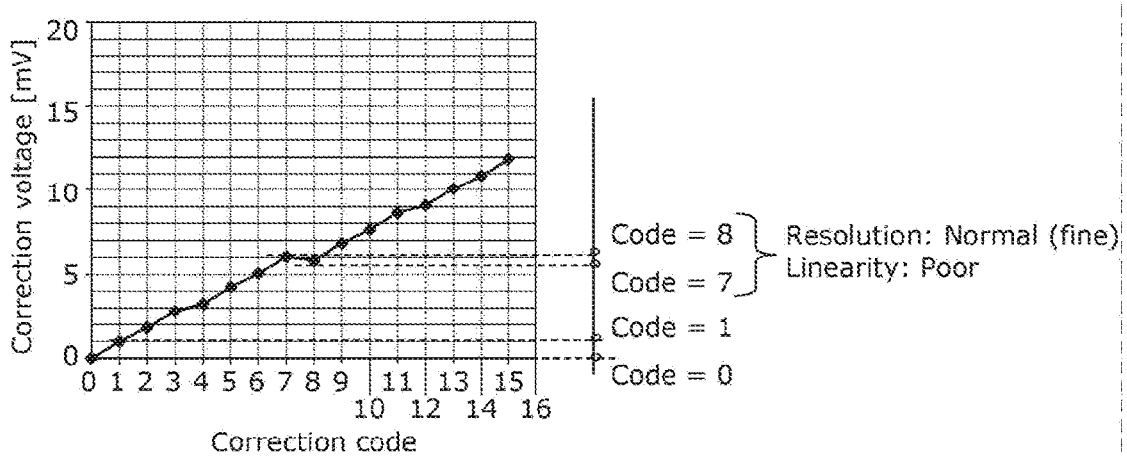
(c) Amount of offset correction
(Adjacent elements at weight ratio of 2.2 to 1)
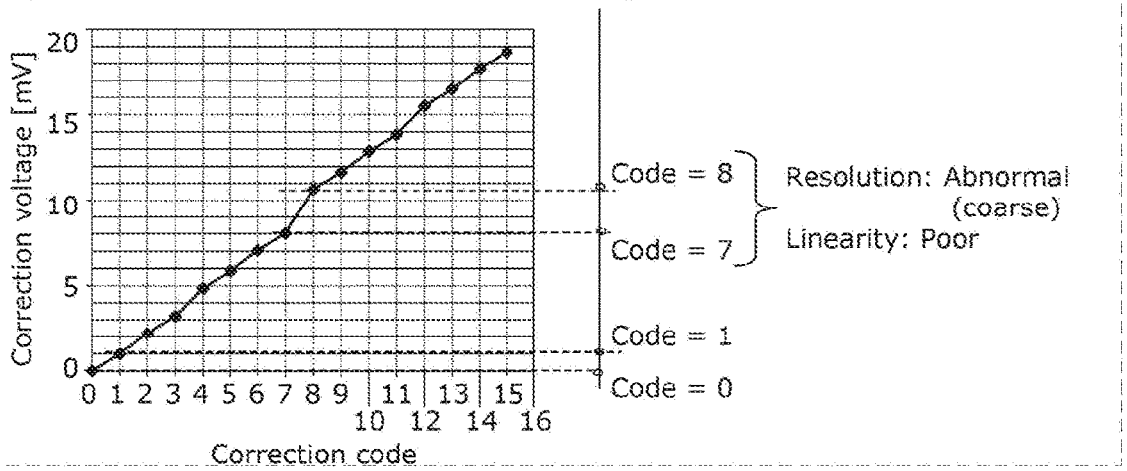

SEMICONDUCTOR INTEGRATED CIRCUIT

CROSS REFERENCE TO RELATED APPLICATIONS

This is a continuation application of PCT International Application No. PCT/JP2020/032770 filed on Aug. 28, 2020, designating the United States of America, which is based on and claims priority of Japanese Patent Application No. 2019-156598 filed on Aug. 29, 2019. The entire disclosures of the above-identified applications, including the specifications, drawings and claims are incorporated herein by reference in their entirety.

FIELD

The present disclosure relates to a semiconductor circuit, and more specifically relates to a test and diagnosis circuit capable of testing and diagnosing a correction element in a data converter.

BACKGROUND

Data converters, such as analog-to-digital converters (ADCs) or time-to-digital converters (TDCs), have been used to measure physical quantities for various purposes.

Examples of a data converter include a successive AD converter contained in a microcomputer, a high precision AD converter used for a sensor analog front-end (AFE), an AD converter for detecting a remaining battery level, a broadband AD converter that achieves software radio, a high precision TD converter that measures time in picosecond order for time-of-flight (ToF) purposes, and a TD converter used as an element of an all-digital PLL (ADPLL) for wireless communication purposes.

In the field of data converter, there has been a demand for enhancing performance and reducing costs, such as speeding up, accuracy improvement, a reduction of power consumption, and a reduction of area.

For example, for a successive approximation register analog-to-digital converter (SAR-ADC) that is used widely, a resolution is limited to approximately 10 to 12 bits due to limits to element accuracy.

In response, in recent years, techniques for causing a digital circuit to actively correct a wide variety of variations in elements in an analog circuit have been disclosed, and circuit digitization has been advanced.

The following describes examples of correction techniques disclosed by patent literatures and non patent literatures.

The ADC disclosed in Patent Literature (PTL) 1 includes a capacitor array for correction so as to correct an offset and high-order capacitance of an internal DAC, and sets a capacitance value to compensate for nonlinearity.

PTL 2 discloses an offset compensation circuit of a comparator that is an element of an ADC.

In the offset compensation circuit of the comparator, an offset voltage compensation circuit is provided to an output of a differential preamplifier circuit, and a variable capacitor is provided to each of differential outputs.

By adjusting a balance between capacitance values connected to a positive side and a negative side of a differential output to offset a circuit offset, the offset of the comparator is reduced to zero.

An offset correction technique for a comparator relates to linearity (accuracy) of an ADC.

As described in PTL 1 and PTL 2, by including a correction element in an analog circuit and causing a digital circuit to make a correction so as to offset a variation in elements due to a manufacturing variation, it is possible to downsize elements, reduce a circuit area, and improve accuracy.

The following describes examples of testing techniques disclosed by patent literatures and non patent literatures.

PTL 3 and PTL 4 each disclose a technique for testing a DAC capacitor in an ADC.

The testing method disclosed in PTL 3 includes determining the accuracy of each of testing capacitors by comparing a potential of an internal DAC capacitor and a potential of the testing capacitor.

The testing method disclosed in PTL 4 includes arraying MOS transistors for testing at nodes of respective internal DAC capacitors, forming AND and OR logics, and detecting a fault of each of DAC capacitors (main elements).

In the method disclosed in PTL 3, since there is a worry that a testing accuracy decreases when capacitors for testing themselves are faulty or less accurate, it is necessary to ensure the accuracy of the capacitors for testing.

In the method disclosed in PTL 4, since the gate of an additional MOS transistor is connected to an analog node of a DAC capacitor, there is a worry that a setting time of the DAC capacitor is delayed, and a conversion rate decreases.

As described above, a testing method is usually a method of testing a constituent element (hereinafter referred to as a main element), such as a capacitor of a DAC mainly contributing to AD conversion, and is not a method of testing a correction element. There are no methods of testing a correction element itself.

In contrast to the analog testing approaches of PTL 3 and PTL 4, Non Patent Literature (NPL) 2 and PTL 5 each discloses a digital method of diagnosing a fault using a digital value reflecting an analog error.

As described in NPL 2, at the time of testing, it is desirable to actively read a value of a memory for self-calibration and use the value for the testing.

To put it another way, since a value of a register indicates the amount of correction corresponding to the amount of error, when the value of the register is excessively high, an error in an analog circuit can be indirectly determined to be too great, and the analog circuit can be rejected as being faulty.

However, such a digital method is an indirect method, is incapable of distinguishing whether a main element has become degraded or faulty, whether a correction element has become degraded or faulty, whether a driver circuit driving a correction element has become degraded or faulty, etc., and has difficulty identifying a real faulty part.

PTL 6 discloses a time-to-digital converter (TDC) as a data converter.

NPL 3 discloses an open-loop integrating amplifier for advancing a reduction of power consumption.

CITATION LIST

Patent Literature

PTL 1: U.S. Pat. No. 8,638,248
PTL 2: Japanese Patent No. 5412369
PTL 3: Japanese Unexamined Patent Application Publication No. 2015-128203
PTL 4: U.S. Pat. No. 5,175,547
PTL 5: Japanese Unexamined Patent Application Publication No. 2017-38200

PTL 6: Japanese Unexamined Patent Application Publication No. 2010-273118

Non Patent Literature

NPL 1: Bob Verbruggen, "A 2.1 mW 11b 410 MS/s Dynamic Pipelined SAR ADC with Background Calibration in 28 nm Digital CMOS", VLSI Symposium 2013

NPL 2: Haruo Kobayashi, "Digitally-Assisted Analog Test Technology", The Institute of Electronics, Information and Communication Engineers, Jul. 22, 2010

NPL 3: Badr Malki, "A complementary dynamic residue amplifier for a 67 dB SNDR 1.36 mW170 MS/s pipelined SAR ADC", ESSCIRC 2014 Gain correction function in FIG. 31

SUMMARY

Technical Problem

When the amount of correction such as background correction may change in a data converter containing a correction element at the time of normal use after shipping due to accuracy improvement, speeding up, and a reduction of power consumption, there is a need for a testing method before shipping and a self-diagnostic function after shipping in order to ensure all correction states.

The present disclosure provides a semiconductor circuit that includes a data converter and tests a correction function of the data converter.

Solution to Problem

The present disclosure gives an outline of a configuration as a solution to problem.

It should be noted that the numerals and symbols in the parentheses in the following configuration indicate corresponding numerals and symbols in the embodiments disclosed herein, are used to simply clarify correspondence relationships between the numerals and symbols, and are not intended to limit the present disclosure.

A semiconductor device according to one aspect of the present disclosure is a semiconductor circuit (1) including a data converter that outputs a digital output signal corresponding to a measured signal. The semiconductor circuit (1) includes: an analog circuit (100) that inputs the measured signal; and a digital circuit (102) that outputs the digital output signal. The analog circuit (101) includes: a correction element group (10) including one or more correction elements each for correcting nonlinearity that occurs during a process of converting the measured signal into the digital output signal in the analog circuit (10); and a test element group (20) including one or more test elements for testing the one or more correction elements. The digital circuit (102) tests the correction element group (10) using the test element group (20).

Advantageous Effects

The present disclosure enables testing of a correction function in a semiconductor circuit including a data converter.

BRIEF DESCRIPTION OF DRAWINGS

These and other advantages and features will become apparent from the following description thereof taken in conjunction with the accompanying Drawings, by way of non-limiting examples of embodiments disclosed herein.

FIG. 9 is a diagram illustrating an example of a first correspondence table for comparator offset correction control codes and the amounts of offset correction.

FIG. 10 is a diagram illustrating an example of a second correspondence table for comparator offset correction control codes and the amounts of offset correction.

FIG. 12 is a diagram illustrating an influence of noise of a comparator.

FIG. 17 is a table showing the amounts of correction offset at the time of setting a first fixed code according to Embodiment 2.

FIG. 18 is a table showing the amounts of correction offset at the time of setting a second fixed code according to Embodiment 2.

FIG. 39 is a circuit diagram illustrating an example of a capacitor corrector according to Embodiment 9.

FIG. 43B is a continuation of FIG. 43A and is a diagram illustrating an example when the test elements having the reverse polarity are controlled.

FIG. 49 is a diagram illustrating differences in correction resolution due to weights for correction elements.

DESCRIPTION OF EMBODIMENTS

Figure 1:
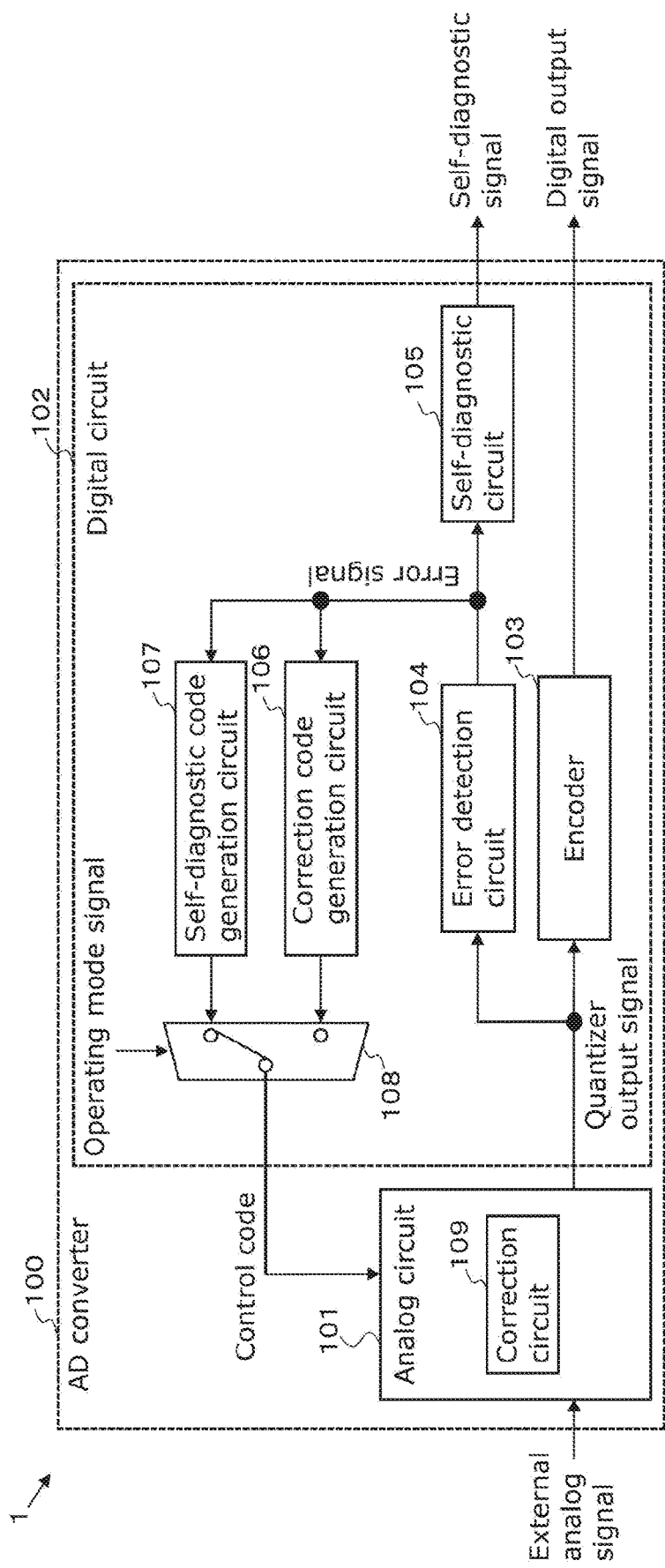
FIG. 1 is a block diagram illustrating a configuration example of a semiconductor circuit including a data converter according to Embodiment 1.

Underlying Knowledge Forming the Basis of the Present Disclosure

The inventors have found that the following problems occur with regard to the data converters described in the "Background" section.

More specifically, when the amount of correction may change at the time of normal use after shipping, there is a need for a testing method before shipping and a self-diagnostic function after shipping in order to ensure all correction states.

In particular, the inventors have found that, when a data converter is used as an in-vehicle component, internal controllability such as detection of a fault and identification of a faulty part in an analog circuit is a necessary requirement, and it is necessary to test correction elements themselves.

When an analog circuit is added to perform test and diagnosis, an AD conversion speed itself is reduced.

Moreover, when a digital method of reading a register value of a memory which indicates the amount of correction is employed so as to perform test and diagnosis, it is difficult to identify a faulty part because such method is an indirect method.

Furthermore, as stated above, the conventional configurations are each the method of testing a main element (e.g., a DAC, a comparator, or an amplifier) mainly contributing to a data converter, or a value or state obtained by adding a main element and a correction element. The conventional configurations are incapable of comprehensively testing and diagnosing a correction element itself.

Additionally, as will be described later in the Description, when correction elements are included on both the positive and negative sides of a differential circuit, it is difficult to identify a faulty part in the differential circuit, such as determining what element on which side out of the positive and negative sides has become faulty.

In addition, as will be described later in the Description, in testing and diagnosing of an offset compensation circuit of a comparator, since an input-output function of the comparator is nonlinear, it is impossible to test all weights of offset correction elements for the comparator.

On the other hand, it is necessary to perform control different from a normal operation in order to perform correction.

Examples of a correction control method include trimming performed before shipping and foreground correction performed during a period in which a normal operation is suspended. Unfortunately, the trimming and the foreground correction have a susceptibility to an environmental change, such as temperature, voltage, and aged deterioration.

NPL 1 discloses a background correction technique in which an ADC corrects an element in tandem with a normal operation.

In NPL 1, an offset of a comparator and a gain of a residue amplifier of a pipelined ADC are corrected in tandem with the normal operation.

Since characteristic degradation that occurs in response to an environmental change (e.g., temperature, voltage, aged deterioration) the trimming and the foreground correction are incapable of addressing can be corrected in tandem with the normal operation, it is possible to maintain robustness of a system.

On the other hand, since a selective state of a correction element is switched to perform correction according to the environmental change, testing before shipping for ensuring all correction states and a diagnostic method when a fault occurs at the time of normal use are problematic.

The above statement indicates the methods such as the trimming, the foreground correction, and the background correction made possible by including a correction element in an analog circuit so as to perform correction, and a correction timing.

Such a correction circuit detects an error of the analog circuit by performing special control for correction, and performs correction by providing feedback to a constituent element of a data converter.

Feedback can be provided broadly in the following two ways.

Figure 46:
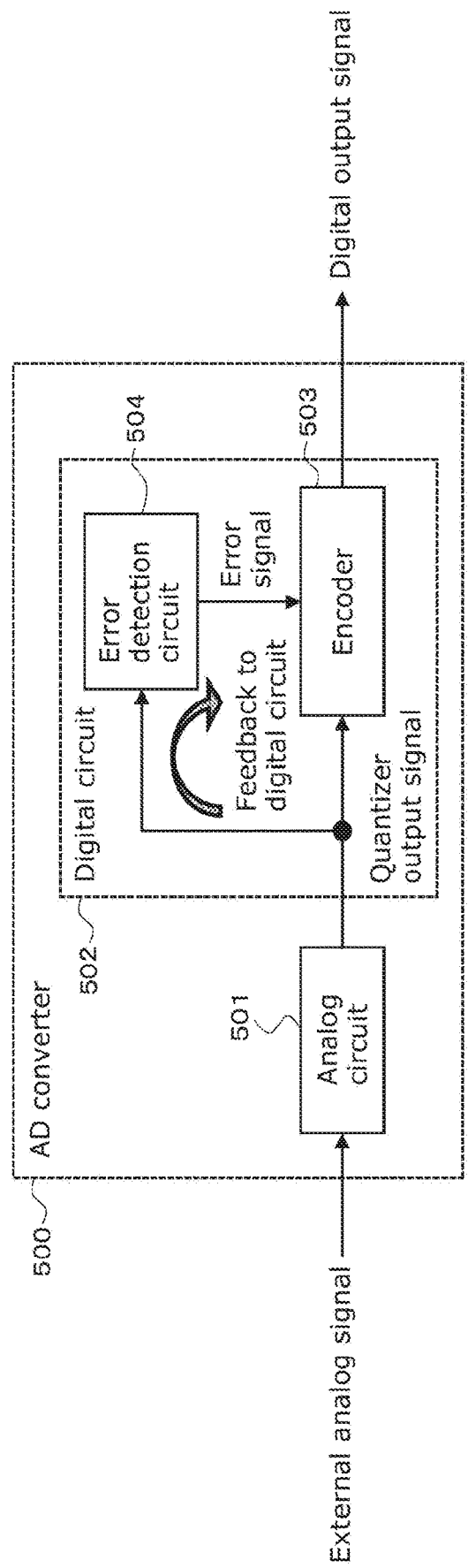
FIG. 46 is a diagram illustrating an example of correction performed by an AD converter.

In the first way, in AD converter 500 shown by FIG. 46, a conventional example, analog circuit 501 outputs a quantizer output signal obtained by converting analog information into digital information.

Moreover, in digital circuit 502 to which the quantizer output signal is inputted, error detection circuit 504 detects an error of analog circuit 501 and outputs an error signal, and encoder 502 to which the error signal has been inputted performs correction calculation on the quantizer output signal according to the error signal.

This method is one of correction methods by which a digital circuit provides feedback to itself.

Figure 47:
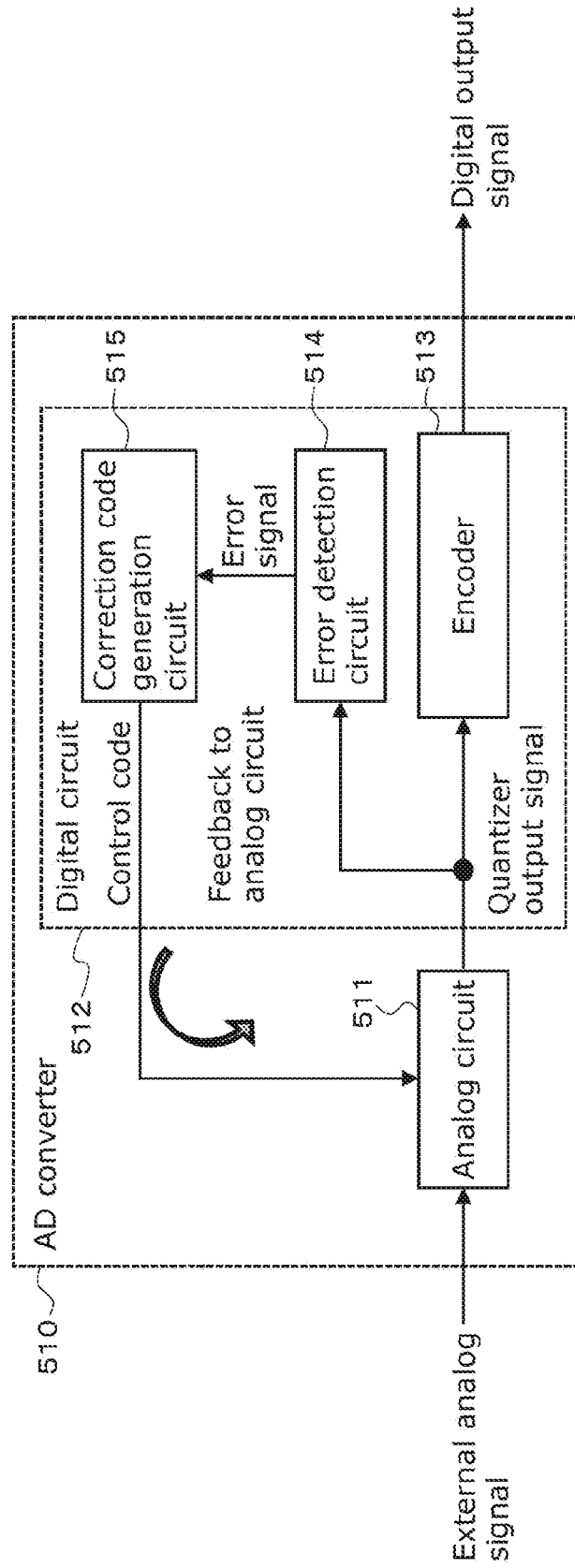
FIG. 47 is a diagram illustrating an example of correction performed by an AD converter.

In the second way, in AD converter 510 shown by FIG. 47, a conventional example, analog circuit 511 outputs a quantizer output signal.

Furthermore, in digital circuit 512 to which the quantizer output signal is inputted, error detection circuit 514 detects an error of analog circuit 511 and outputs an error signal, correction code generation circuit 515 outputs a control code for correcting an element in analog circuit 511, analog circuit 511 to which the control code has been inputted corrects an element constant and outputs a corrected quantizer output signal, and encoder 513 performs digital calculation using a normal weight.

This method is one of correction methods by which a digital circuit provides feedback to an analog circuit.

In the correction method by which the digital circuit provides feedback to itself shown by FIG. 46, when elements in analog circuit 501 vary excessively, that is, when analog circuit 501 has an error greater than or equal to 1 LSB of AD converter 500, the correction cannot be completed using only the digital calculation.

In contrast, in the correction method by which the digital circuit provides feedback to the analog circuit shown by FIG. 47, even when elements in analog circuit 511 vary excessively, the correction can be performed so long as a correction element that corrects the excessive variation is included, and it is possible to maintain a reduction of circuit area and accuracy improvement.

On the other hand, since multiple buses for the control code fed back from digital circuit 512 to analog circuit 511 are provided, a circuit complexity increases.

As stated above, although it is best to perform the correction in which the digital circuit provides feedback to the analog circuit, and the background correction, from a standpoint of the characteristics and the robustness, testing and diagnosing before shipping are required.

In order to explain specifications required for a correction element, a supplementary explanation on a relationship between a weight of a correction element and a resolution will be provided below.

(a) to (c) in FIG. 49 show differences in correction resolution due to weights for correction elements.

In FIG. 49, the horizontal axis represents a correction code (a value of a control code), and the vertical axis represents an offset correction voltage.

In an example shown by FIG. 49, the amount of offset correction is calculated while changing a weight for an offset correction element.

To put it another way, in (a) in FIG. 49, a weight for adjacent correction elements is "2," and a weight ratio from the LSB to the MSB is "1:2:4:8" with the LSB being set to 1.

In (b) in FIG. 49, a weight for adjacent correction elements is "1.8," and a weight ratio from the LSB to the MSB is "1.0:1.8:$1.8^2$:$1.8^3$."

In (c) in FIG. 49, a weight for adjacent correction elements is "2.2," and a weight ratio from the LSB to the MSB is "1:2.2:$2.2^2$:$2.2^3$."

A correction resolution is determined by the maximum value of a step voltage between adjacent codes.

In (a) in FIG. 49, since all of the step voltages are 1 my, a correction resolution is 1 my.

In (b) in FIG. 49, since a difference between "Code=0" and "Code=1" is equivalent to 1 mV, and a difference between "Code=7" and "Code=8" is equivalent to 0.208 mV, a correction resolution is 1 mv.

In (c) in FIG. 49, since a difference between "Code=7" and "Code=8" is maximum and equivalent to 2.608 mV, a correction resolution is 2.608 my.

As is clear from the supplementary explanation using the example shown by FIG. 49, test specifications required for correction elements need not include ensuring linearity between main elements such as DAC capacitors, but need include testing a resolution (the maximum value of a step voltage), and testing whether a weight for adjacent correction elements is set to be "less than or equal to 2 (≤2)."

In order to solve the problems as described above, a semiconductor device according to one aspect of the present disclosure is a semiconductor circuit including a data converter that outputs a digital output signal corresponding to a measured signal. The semiconductor circuit includes: an analog circuit that quantizes the measured signal inputted; and a digital circuit that outputs the digital output signal. The analog circuit includes: a correction element group including one or more correction elements each for correcting non-linearity that occurs during a process of converting the measured signal into the digital output signal in the analog circuit; and a test element group including one or more test elements for testing the one or more correction elements. The digital circuit tests the correction element group using the test element group.

Since this configuration makes it possible to test and diagnose functions and weights of the one or more correction elements, it is possible to test the correction element group.

For example, the digital circuit may include: a self-diagnostic code generation circuit that generates a self-diagnostic code for (i) enabling or disabling each of the one or more correction elements included in the correction element group and (ii) enabling or disabling each of the one or more test elements included in the test element group; an error detection circuit that detects, as an error signal, a difference between a quantizer output signal of the analog circuit and a predetermined threshold value, the quantizer output signal being outputted in response to the self-diagnostic code; and a self-diagnostic circuit that generates a self-diagnostic signal indicating a diagnostic result of the correction element group, based on the error signal.

This configuration makes it possible to supply the control code generated by the self-diagnostic code generation circuit to one or more correction elements in the data converter, and to cause the self-diagnostic circuit to test and diagnose functions and weights of the one or more correction elements. To put it another way, the configuration makes it easy to test each of the one or more correction elements included in the correction element group.

For example, the self-diagnostic code may include a first fixed code and an optimum code, the one or more correction elements may be three or more correction elements, the first fixed code may be for (i) enabling a single correction element selected as a test target from the correction element group and (ii) disabling other correction elements included in the correction element group and the one or more test elements, the optimum code may be for minimizing the error signal relative to the first fixed code and is generated by binary search, and the self-diagnostic circuit may: calculate an integrated value of the error signal corresponding to a combination of the first fixed code and the optimum code; and determine whether the integrated value falls within a predetermined range, and determines the correction element group as being faulty when the integrated value falls outside the predetermined range.

With this configuration, when an error cannot be minimized within the range, the correction element group is determined as being faulty, that is, one of the one or more correction elements is determined as being faulty.

For example, the self-diagnostic code may include a first fixed code, a second fixed code, and an optimum code, the one or more correction elements may be three or more correction elements, the first fixed code may be for (i) enabling a single correction element selected as a test target from the correction element group and (ii) disabling other correction elements included in the correction element group and the one or more test elements, the optimum code may be for minimizing the error signal relative to the first fixed code and may be generated by binary search, the measured signal may be a differential signal including a first polarity signal and a second polarity signal, the correction element group may include a first element group connected to a transmission path for the first polarity signal, and a second element group connected to a transmission path for the second polarity signal, the first fixed code may correspond to the first element group and may be for disabling the second element group, the second fixed code may be for (i) disabling a single correction element selected as a test target from the first element group, (ii) enabling, among other correction elements included in the first element group, a correction element having a weight smaller than a weight of the single correction element selected, and (iii) enabling the one or more test elements, the optimum code may correspond to the second element group and may be for disabling the first element group, and the self-diagnostic circuit may: calculate a first integrated value by integrating the error signal corresponding to a combination of the first fixed code and the optimum code; calculate a second integrated value by integrating the error signal corresponding to a combination of the second fixed code and the optimum code; and determine a magnitude relationship between the first integrated value and the second integrated value, and determine the single correction element selected as the test target as being faulty when the magnitude relationship fails to satisfy a predetermined condition.

With this configuration, it is possible to set, using the optimum code, an operating point for self-diagnosis to an operating point at which the above-described error is minimized. In other words, whichever correction element is to be tested, it is possible to use the operating point at which the error is minimized, and to facilitate self-diagnosis of each correction element to be tested. Stated differently, the configuration facilitates the testing of the individual correction elements.

For example, the self-diagnostic circuit may sequentially select a single correction element as a test target from the correction element group.

With this configuration, even when the measured signal is a differential signal, in the case where the error cannot be minimized within the range, it is possible to determine that the correction element group is faulty, that is, one of the one or more correction elements is faulty.

For example, the one or more correction elements may double as the one or more test elements.

Even when the measured signal is a differential signal, this configuration facilitates the self-diagnosis of each of the one or more correction elements.

A semiconductor device according to one aspect of the present disclosure includes a data converter that outputs a digital output signal corresponding to a measured signal, the semiconductor device including an analog circuit (101) and a digital control circuit (102). The analog circuit (101) includes at least the following: a main element group (114) with one or more elements each having a reference weight for quantizing the measured signal; a correction element group (140) with one or more correction elements each having an adjustment weight for adjusting various analog amounts; a test element group (141) with one or more test elements each having a test weight for testing a weight of the correction element group (140); a quantizer (116) that converts information of the measured signal into a digital signal; and an analog controller (117) that performs control in the analog circuit (101). The digital circuit (102) includes at least the following: an encoder (103) that converts a quantizer output signal of the quantizer (116) into a digital output signal weighted in a predetermined manner and outputs the digital output signal; an error detection circuit (104, 119) that compares a predetermined threshold value and an integration result so as to detect an error in one of the adjustment weights of the correction element group (140) with reference to one or more of the test weights of the test element group (141), and outputs an error signal, the integration result being obtained by integrating the digital output signal a predetermined number of times; a self-diagnostic code generation circuit (107, 122) that controls the correction element group (140) and outputs a control code including a plurality of bit signals for testing each of the one or more correction elements; and a self-diagnostic circuit (120) that outputs a self-diagnostic output signal in response to the error signal. The self-diagnostic circuit (120) performs self-diagnosis of each of the one or more correction elements included in the correction element group (140).

The quantizer (116) according to one embodiment of the present disclosure may be one or more in number.

Moreover, an output result of a comparator used for testing and diagnosis may be one or more in number.

A weight may be tested and diagnosed by setting a size of the test element group (141) according to one embodiment of the present disclosure to less than or equal to a size of the LSB of the one or more test elements (140).

The correction element group (140) and the test element group (141) according to the one embodiment of the present disclosure may each be a capacitor (400, 401), an MOS transistor (372, 373, 374, 375), or a resistor (456, 457).

The self-diagnostic code generation circuit (107) has: an optimum correction code output mode for outputting an optimum correction code (292, 288, 289) in response to the error signal so that a quantization error of the quantizer (116) becomes minimum; and a logic inversion code output mode for outputting a logic inversion code (301A, 301B) obtained by logically inverting a first bit signal for controlling a single correction element selected as a test target from the correction element group, the first bit signal being included in the optimum correction code. At time of testing and diagnosis, the digital circuit performs: a first step (261, 262, 263) of entering the optimum correction code output mode, supplying the optimum correction code to the analog circuit (101), and obtaining an output of the error detection circuit (104, 119) as a first error signal; a second step (265, 266) of entering the logic inversion code output mode, supplying the logic inversion code to the analog circuit (101), and obtaining the output of the error detection circuit (104, 119) a second error signal, based on the error signal from the error detection circuit; and a third step (267, 268, 269) of comparing magnitudes of the first error signal and the second error signal, and performing a fault diagnosis on the single correction element selected as the test target.

Moreover, the self-diagnostic code generation circuit (107) according to another embodiment has: a first weight test code output mode (182, 185) for (i) setting a first bit signal to 1 or 0, the first bit signal being for controlling a first correction element selected as a test target from the correction element group, (ii) causing a second correction bit signal group to have an inverted logical value of the first bit signal, the second correction bit signal group being for controlling a correction element having an adjustment weight smaller than an adjustment weight of the first correction element, (iii) causing a test bit signal to have the inverted logical value of the first bit signal, the test bit signal being for controlling the one or more test elements, and (iv) outputting one or more other bit signals as one or more predetermined fixed signals; and a second weight test code output mode (184, 187, 188, 189) for (i) causing the first bit signal to have an inverted logical value when the first weight test code output mode is set, (ii) causing the second correction bit signal group to have the inverted logical value of the first bit signal, (iii) causing the test bit signal to have the inverted logical value of the first bit signal, and (iv) outputting one or more other bit signals as one or more predetermined fixed signals. At time of testing and diagnosis, the digital circuit performs: a first step (152, 153) of entering the first weight test code output mode, supplying the specified bit signals to the analog circuit (101), and obtaining an output of the error detection circuit as a first error signal; a second step (156, 157) of entering the second weight test code output mode, supplying the specified bit signals to the analog circuit (101), and obtaining the output of the error detection circuit (104, 119) as a second error signal; and a third step (158, 159, 160) of calculating a difference between the first error signal and the second error signal and performing a weight diagnosis on the correction element group (140).

Furthermore, as still another embodiment, when a correction element group of a circuit (114, 130) having a differential configuration (or two sets) is tested and diagnosed, a CDF is brought close to 0.5 by obtaining, using a correction element group having a polarity on a test side, an optimum correction code (184, 187, 188, 189) so that a quantization error is minimized in the first step (152, 153), which facilitates the testing and diagnosis.

Moreover, as yet another embodiment, the digital circuit (102) may perform: a first step (217, 218) of inputting a first reference signal (252) and obtaining the optimum correction code as a first optimum correction code; a second step (219, 220) of inputting a second reference signal and obtaining the optimum correction code as a second optimum correction code; and a third step (221, 222, 224) of calculating a difference between the first optimum correction code and the second optimum correction code and performing a range diagnosis on the correction element group.

Furthermore, as further embodiment, when a correction element group of a circuit (114, 130) having a differential configuration (or two sets) is tested and diagnosed, a test element group (355) having a polarity on a test target side (or a set on a test target side) or a test element group (357) having a polarity on the opposite side (or a set not on the test target side) may be used as a test element group serving as a reference for testing.

Moreover, as still further embodiment, the data converter may be an analog-to-digital converter (ADC, 110) or a time-to-digital converter (TDC, 440).

Furthermore, as yet further embodiment, the test element group (471) may be used as the correction element group (470).

However, it is impossible to test the LSB in this embodiment.

Hereinafter, embodiments will be described with reference to the drawings.

In order to avoid making the subsequent description verbose and facilitate understanding of a person skilled in the art, repetitive description may be omitted.

Moreover, the subsequent description and detailed illustration using the drawings are not intended to limit the subject matter described in the claims.

Embodiment 1

Hereinafter, a circuit configuration and functions according to Embodiment 1 will be described with reference to the drawings.

Embodiment 1 describes basic functions of a semiconductor circuit including a data converter according to the present disclosure.

Figure 2:
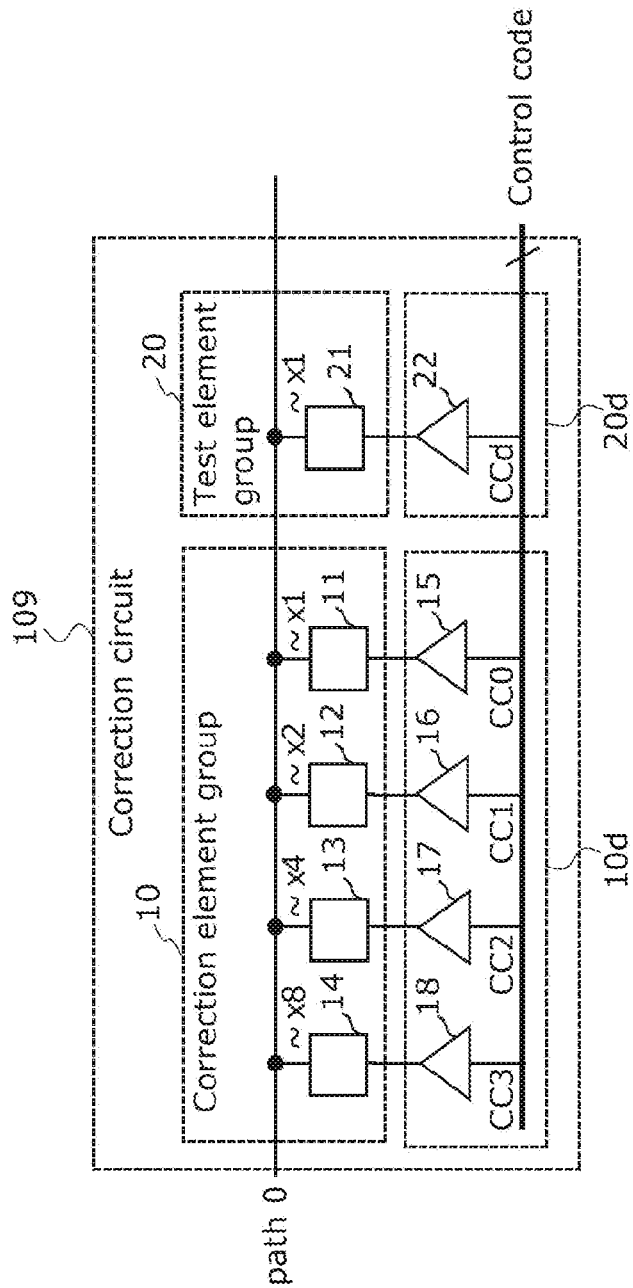
FIG. 2 is a diagram illustrating a configuration example of a correction circuit according to Embodiment 1.

FIG. 1 is a block diagram illustrating a configuration example of semiconductor circuit 1 including analog-to-digital converter (ADC) 100 as a data converter according to Embodiment 1. FIG. 2 is a diagram illustrating a configuration example of correction circuit 109 according to Embodiment 1.

Semiconductor circuit 1 shown by FIG. 1 is a circuit disposed in a semiconductor device such as an LSI. Semiconductor circuit 1 shown by the figure includes ADC 100 as an example of a data converter. It should be noted that a data converter is not limited to ADC 100. Apart from ADC 100, a data converter may be a time-to-digital converter (TDC).

ADC 100 includes analog circuit 101 and digital circuit 102, and analog circuit 101 includes correction circuit 109. In an example shown by FIG. 2, correction circuit 109 includes correction element group 10, test element group 20, and drivers 15 to 18 and 22.

Correction element group 10 corrects nonlinearity that occurs during a process of converting a measured signal into a digital output signal in analog circuit 101. The term "nonlinearity" includes, for example, an offset (the amount of shift that occurs in a signal), a gain (a difference between scale factors), and a capacitance value (a relative difference between reference element arrays). The following describes an offset as a specific example of the nonlinearity to be corrected by correction element group 10. In FIG. 2, path 0 denotes a path for transmitting a measured signal that is an external analog signal. It is assumed that an offset, the amount of shift, occurs in path 0 due to a variation in characteristics of analog circuit 101. An offset results from a variation in characteristics of a circuit element at the time of manufacturing or a variation in characteristics caused by an environmental change or aged deterioration. The control code shown by the figure includes: a correction code for controlling correction element group 10 at the time of a normal operation; and a voluntary correction code for controlling test element group 20 and correction element group 10 at the time of self-diagnosis.

Correction element group 10 includes correction elements 11 to 14. Correction elements 11 to 14 are given, for example, a weight of 1X, a weight of 2X, a weight of 4 X, and a weight of 8X. Each of correction elements 11 to 14 is enabled or disabled by a corresponding one of drivers 15 to 18. Any enabled correction element among correction elements 11 to 14 adds the amount of correction corresponding to a weight to path 0. Any disabled correction element among correction elements 11 to 14 does not add the amount of correction to path 0. The term "amount of correction" means a physical quantity such as a voltage and a current. Correction elements 11 to 14 each include, for example, a voltage source, a current source, a capacitive element, or a resistive element for generating the amount of correction.

Drivers 15 and 16 drive, that is, enable or disable correction elements 11 and 12, respectively, according to corresponding bits in a control code. Drivers 15 and 16 each include, for example, a gate circuit that outputs a binary signal corresponding to bits in a control code, and a switch circuit.

It should be noted that the amount of correction is not limited to a voltage or a current, and may be a delay time, the amount of applied heat, or a physical quantity such as the amount of applied pressure.

Test element group 20 includes at least one test element 21. Test element 21 shown by FIG. 2 has the same weight as correction element 11. In other words, test element 21 has the same configuration as correction element 11 having the minimum weight among correction elements 11 to 14 included in correction element group 10.

It should be noted that test element group 20 may include another test element having the same weight as test element 21, or another test element having a weight different from the weight of test element 21. In addition, test element 21 may have a weight smaller than the minimum weight of correction element 11.

In FIG. 1, digital circuit 102 includes at least encoder 103, error detection circuit 104, self-diagnostic circuit 105, correction code generation circuit 106, self-diagnostic code generation circuit 107, and selector 108.

An external analog signal is inputted as an input signal of ADC 100.

Analog circuit 101 contains a reference voltage source that is not shown and generates a reference voltage, and is capable of performing AD conversion on either an external analog signal or an internal reference voltage.

At the time of a normal operation, analog circuit 101 to which an external analog signal has been inputted quantizes information of the external analog signal into a digital signal, and outputs the digital signal as a quantizer output signal.

A quantizer output signal is inputted to encoder 103.

Encoder 103 adds a predetermined weight to at least one quantizer output signal, performs digital calculation on the at least one quantizer output signal, and outputs a digital output signal. When analog circuit 101 tests and diagnoses a correction element not shown in analog circuit 101, analog circuit 101 performs AD conversion on an internal reference voltage.

After the AD conversion is performed, the quantizer output signal is inputted to error detection circuit 104.

Error detection circuit 104 compares the quantizer output signal and a predetermined threshold value (e.g., an expected value), and outputs an error signal.

An error signal indicates error information for testing and diagnosing a correction signal, and may be a code for error information (indicating whether an error is positive or negative) or may be quantitative information about error information.

Moreover, an error signal may be obtained by integrating an error signal one or more times in order to remove noise from the error signal.

An error signal is inputted to self-diagnostic circuit 105, correction code generation circuit 106, and self-diagnostic code generation circuit 107.

Correction code generation circuit 106 to which the error signal has been inputted outputs a correction code.

Self-diagnostic code generation circuit 107 to which the error signal has been inputted outputs a self-diagnostic code.

A correction code is a digital signal including bits that is used to control a state of a correction element that corrects analog characteristics in analog circuit 101.

A self-diagnostic code is a digital signal including bits that is used to test and diagnose a control function and a weight of each correction element.

Self-diagnostic circuit 105 to which the error signal has been inputted holds, compares, and calculates items of error information each for testing a state of a correction element, and outputs a self-diagnostic signal.

Self-diagnostic circuit 105 may set a threshold value and determine a diagnosis, based on the error signal, or may hold two items of error information in different states and determine a diagnosis of a weight in order to determine a relative weight for a correction element.

Moreover, self-diagnostic circuit 105 may output position information indicating what correction element among correction elements has become faulty, or may output a signal indicating a single weight of a correction element to be tested and diagnosed.

A correction code and a self-diagnostic code are inputted to selector 108.

Selector 108 outputs a control code including bits for controlling correction element states of analog circuit 101.

In order to control selector 108, an operating mode signal is inputted, and whether to output a correction code as a correction mode for correcting various characteristics of analog circuit 101 or to output a self-diagnostic code as a self-diagnostic mode for testing and diagnosing each correction element of a correction element group in analog circuit 101 is switched based on the operating mode signal.

When a control code is a correction code, analog circuit 101 to which the control code has been inputted outputs a quantizer output signal in a state in which various analog characteristics of analog circuit 101 are corrected.

Furthermore, when a correction code is a self-diagnostic code, analog circuit 101 outputs a quantizer output signal indicating a state in which a correction element in analog circuit 101 is weighted.

As stated above, ADC 100 according to Embodiment 1 is semiconductor circuit 1 including a data converter that outputs a digital output signal corresponding to a measured signal. ADC 100 includes: analog circuit 101 that quantizes the measured signal to be inputted; and digital circuit 102 that outputs the digital output signal. Analog circuit 101 includes: correction element group 10 including one or more correction elements for correcting nonlinearity that occurs during a process of converting the measured signal into the digital output signal in analog circuit 101; and test element group 20 including one or more test elements for testing the one or more correction elements. Digital circuit 102 tests correction element group 10 using test element group 20.

Since this configuration makes it possible to test and diagnose functions and weights of correction elements, it is possible to test a correction element group.

Here, digital circuit 102 may include: self-diagnostic code generation circuit 107 that generates a self-diagnostic code for (i) enabling or disabling each of the one or more correction elements included in correction element group 10 and (ii) enabling or disabling each of the one or more test elements included in test element group 20; error detection circuit 104 that detects, as an error signal, a difference between a quantizer output signal of analog circuit 101 and a predetermined threshold value; and self-diagnostic circuit 105 that generates a self-diagnostic signal indicating a diagnosis of correction element group 10, based on the error signal.

This configuration makes it possible to supply the control code generated by self-diagnostic code generation circuit 107 to one or more correction elements in the data converter, and to cause self-diagnostic circuit 105 to test and diagnose functions and weights of the one or more correction elements. To put it another way, the configuration makes it easy to test each of the one or more correction elements included in correction element group 10.

Accordingly, since ADC 100 according to Embodiment 1 (i) includes not only a correction code generation circuit for correcting analog circuit 101 but also self-diagnostic code generation circuit 107 for testing the function and weight of each of the one or more correction elements, and (ii) generates a self-diagnostic code for the correction element and performs comprehensive test and diagnosis, ADC 100 is capable of testing and diagnosing all the correction elements.

In other words, the present embodiment produces an advantage effect of ensuring all correction states by ensuring normality of each correction element, whereas the conventional techniques have tested linearity and a partial fault in a state of a main element or a state in which the main element and correction elements are added, and have successfully ensured normality only in a limited correction state.

As stated above, a semiconductor circuit according to Embodiment 1 is semiconductor circuit 1 including data converter 100 that outputs a digital output signal corresponding to a measured signal. The semiconductor circuit includes: analog circuit 101 that quantizes the measured signal to be inputted; and digital circuit 102 that outputs the digital output signal. Analog circuit 101 includes: correction element group 10 including one or more correction elements for correcting nonlinearity that occurs during a process of converting the measured signal into the digital output signal in analog circuit 101; and test element group 20 including one or more test elements for testing the one or more correction elements. Digital circuit 102 tests correction element group 10 using test element group 20.

Here, digital circuit 102 may include: self-diagnostic code generation circuit 107 that generates a self-diagnostic code for (i) enabling or disabling each of the one or more correction elements included in correction element group 10 and (ii) enabling or disabling each of the one or more test elements included in test element group 20; error detection circuit 104 that detects, as an error signal, a difference between a quantizer output signal of analog circuit 101 and a predetermined threshold value; and self-diagnostic circuit 105 that generates a self-diagnostic signal indicating a diagnosis of correction element group 10, based on the error signal.

Here, analog circuit 107 may include a quantizer that quantizes the measured signal corrected by correction element group 10 or a reference signal into a quantizer output signal. Digital circuit 102 may include: an encoder that converts the quantizer output signal into a digital output signal weighted in a predetermined manner, and outputs the digital output signal; an error detection circuit that outputs, as an error signal, a result of integrating a difference between the quantizer output signal and a predetermined threshold value multiple times; a self-diagnostic code generation circuit that outputs a self-diagnostic code for (i) enabling or disabling each of the one or more correction elements included in correction element group 10 and (ii) enabling or disabling each of the one or more test elements included in test element group 20; and a self-diagnostic circuit that outputs, in response to the error signal, a self-diagnostic output signal indicating whether correction element group 10 is faultless or faulty. Digital circuit 102 may cause the self-diagnostic circuit to self-diagnose each of the one or more correction elements included in correction element group 10.

Embodiment 2

Hereinafter, a circuit configuration and an operation according to Embodiment 2 will be described with reference to the drawings. Embodiment 2 describes a more specific configuration example in which each of correction elements in a correction element group that performs offset correction on a comparator is tested and diagnosed, focusing on, as an example, the successive ADC (FIG. 2) as a data converter.

It should be noted that among constituent elements that appear in Embodiments 2 to 13, those having the same names as the constituent elements that appear in Embodiment 1 or the other embodiments are more specific examples of the same constituent elements even if they have different reference signs.

Figure 3:
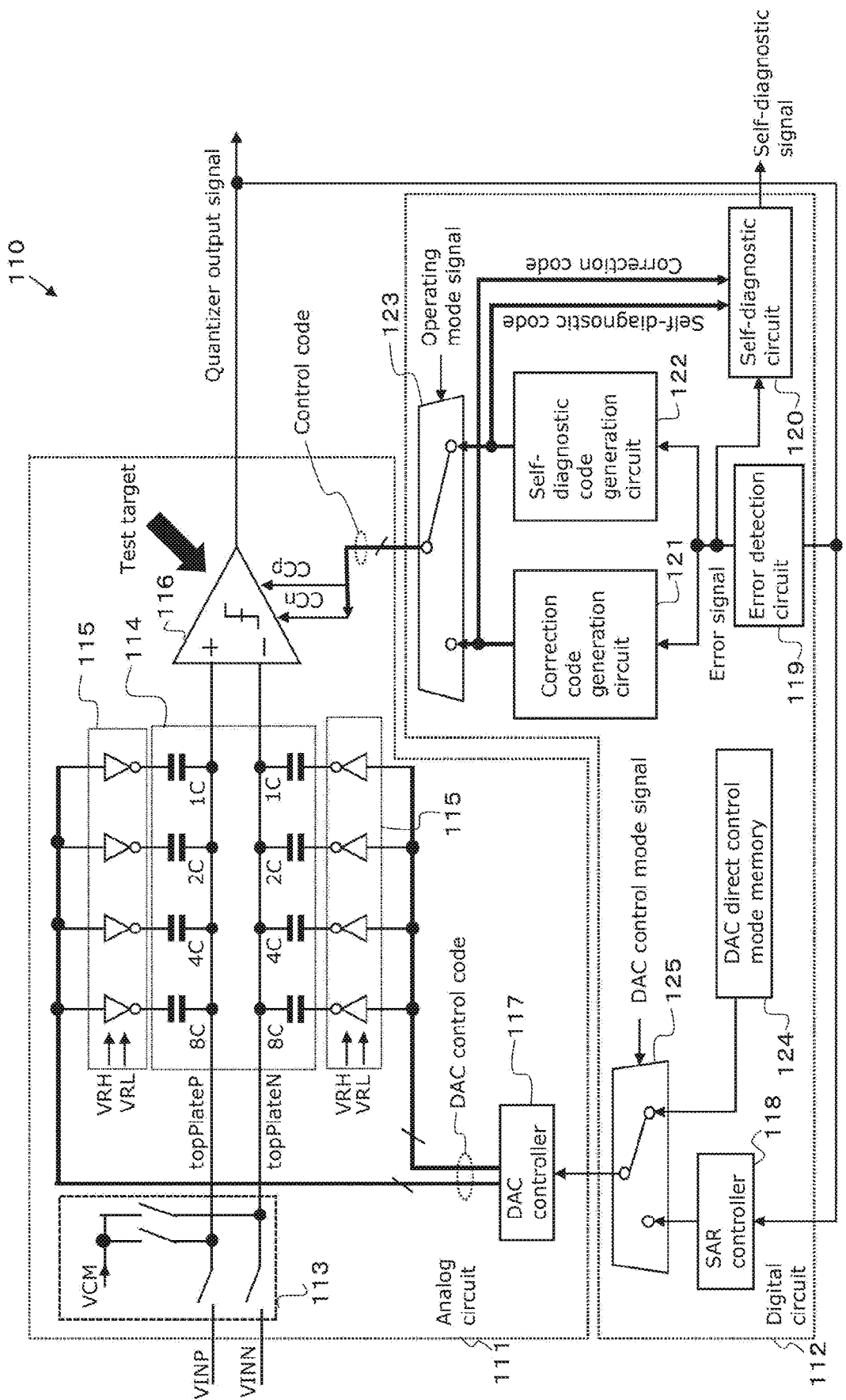
FIG. 3 is a block diagram illustrating a configuration example of a semiconductor circuit including a data converter according to Embodiment 2.

FIG. 3 is a block diagram illustrating a configuration example of a semiconductor circuit including a data converter according to Embodiment 2. FIG. 3 shows successive approximation register ADC 110 as an example of the data converter.

Successive ADC 110 shown by FIG. 3 is a specific example of ADC 100 shown by FIG. 1, and has a differential circuit configuration as an example. ADC 100 according to the present disclosure is not limited to this example, and is applicable to a single-end circuit configuration.

The following describes constituent elements.

Successive ADC 110 includes analog circuit 111 and digital circuit 112. External analog signals (VINP on a positive side, VINM on a negative side) are inputted to successive ADC 110. After performing time discretization and amplitude quantization on an analog signal, successive ADC 110 outputs a quantizer output signal. An encoder not shown performs predetermined digital calculation on the quantizer output signal and outputs a digital signal as an AD conversion result.

Analog circuit 111 includes analog elements to be corrected and an element controller.

Specifically, analog circuit 111 includes, as the analog elements, sample and hold circuit 113, digital-to-analog converter (DAC) 114, comparator 116, and driver circuit 115.

Additionally, analog circuit 111 includes DAC controller 117 as the element controller.

Digital circuit 112 includes elements that control DAC 114, and elements that control a correction target.

Specifically, digital circuit 112 includes, as the elements that control DAC 114, SAR controller 118, DAC direct control mode memory 124, and selector 125.

Additionally, digital circuit 112 includes, as the elements that control the correction target, error detection circuit 119, self-diagnostic circuit 120, correction code generation circuit 121, self-diagnostic code generation circuit 122, and selector 123.

The following describes a connection relationship between the constituent elements.

External analog signals (VINP, VINM) are inputted to sample and hold circuit 113.

Sample and hold circuit 113 performs sampling and time discretization on an input signal at the time of a normal operation, outputs an analog information signal, and hold voltages at top plate voltage nodes (topPlateP, topPlateN) of DAC 114.

In addition, sample and hold circuit 113 also includes a mechanism for setting an output to midpoint reference voltage VCM at the time of correction.

Driver circuit 115 is connected to DAC 114 on a bottom plate side. DAC controller 117 determines whether an output will be set to high potential reference voltage VRH or low potential reference voltage VRL.

DAC 114 includes a capacitive array of weighted main elements. The reference signs 8C, 4C, 2C, and 1C in FIG. 2 indicate weights of 8, 4, 2, and 1, respectively, with reference to 1 LSB of DAC 114.

The top plate voltage nodes (topPlateP, topPlateN) are connected to comparator 116 to be corrected.

Comparator 116 quantizes analog information into digital information and outputs the digital information as a quantizer output signal.

The quantizer output signal is outputted to SAR controller 118 and error detection circuit 119.

SAR controller 118 outputs a control signal for controlling DAC 114 to selector 125, based on the quantizer output signal.

An output signal of SAR controller 118 and an output of DAC direct control mode memory 124 are inputted to selector 125. Selector 125 outputs a control signal that forms the basis of a DAC control code to DAC controller 117, in response to an inputted DAC control mode signal.

Error detection circuit 119 performs comparison and calculation using a predetermined threshold (e.g., an expected value, a standard value, a reference value), based on the quantizer output signal, and outputs an error signal.

The error signal is outputted to correction code generation circuit 121 and self-diagnostic code generation circuit 122.

Correction code generation circuit 121 determines and outputs a correction code, based on the error signal.

Self-diagnostic code generation circuit 122 determines and outputs a self-diagnostic code, based on the error signal.

The correction code and the self-diagnostic code are inputted to selector 123.

Selector 123 outputs, to a correction target, either the correction code or the self-diagnostic code as a control code, based on an inputted operating mode signal.

Upon receiving the error signal, the self-diagnostic code, and the correction code, self-diagnostic circuit 120 outputs a self-diagnostic output signal.

The following describes operations of the constituent elements.

Examples of an operating mode include (1) normal operating mode, (2) correction mode, and (3) test and self-diagnostic mode. (1) In the normal operating mode, sample and hold circuit 113 performs sampling (time discretization) on external analog signals (VINP, VINM) using DAC top plate voltage nodes (topPlateP, topPlateN).

A difference (referred to as a residue voltage) between the sampled voltage and the reference voltage generated by charge redistribution in a capacitor of DAC 114 controlled by DAC controller 117 and driver circuit 115 is inputted to comparator 116.

Comparator 116 compares a positive-side voltage (topPlateP) and a negative-side voltage (topPlateN) of the residue voltage, outputs "1" when the positive-side voltage is higher than the negative-side voltage, and outputs "0" when the negative-side voltage is higher than the positive-side voltage.

In the normal operating mode, an output of SAR controller 118 is selected as an output signal of selector 125, based on a DAC control mode signal.

SAR controller 118 outputs, to DAC controller 117, a control signal that forms the basis of a DAC control code, based on a quantizer output signal, sequentially compares a difference (a residue voltage) between an analog signal and a signal of the voltage generated by DAC 114, and performs quantization so that the residue voltage approaches zero.

It should be noted that the number of comparison cycles indicates an example of 4 bits in the present embodiment, the present disclosure is not limited to this example.

Moreover, single comparator 116 may perform sequential comparison cycles or multiple comparators 116 may perform each of sequential comparison cycles.

A circuit not shown causes a quantizer output signal to have a value for each cycle, and a 4-bit configuration outputs four quantizer output signals in the present embodiment.

The quantizer output signal outputted from comparator 116 is fed back to both SAR controller 118 and error detection circuit 119. However, when background correction is performed, error detection circuit 119 detects an offset state of comparator 116, and correction code generation circuit 121 continuously updates a correction code, reflects the correction code in an offset control code (CCp, CCn), and performs AD conversion in a state in which an offset is corrected.

Next, the following describes (2) correction mode.

(2) In the normal mode, foreground correction and background correction are performed.

At the time of the foreground correction, an AD conversion operation is stopped, and sample and hold circuit 113 performs sampling (time discretization) on an internal midpoint reference voltage (VCM) using the DAC top plate voltage nodes (topPlateP, topPlateN).

An input state of comparator 116 is set to a predetermined state (e.g., a differential voltage zero state) by performing AD conversion on the internal midpoint reference voltage (VCM), and an offset of comparator 116 is corrected so that a probability of occurrence of "1" and "0" in a comparator output (a quantizer output signal) approaches 50%.

When the foreground correction is performed, after an AD conversion operation is stopped, an output of correction code generation circuit 121 is selected as an output of selector 123, and an optimum value of a correction code is determined; and, at the same time, an output code indicating a specific code held in DAC direct control mode memory 124 is selected as an output of selector 125, and DAC 114 is controlled.

When the background correction is performed, after an AD conversion operation is continued, an output of correction code generation circuit 121 is selected as an output of selector 123, and a correction code changes to an optimum value according to an environmental variation; and, at the same time, an output of SAR controller 118 is selected as an output of selector 125, and the same DAC control operation as the normal operating mode is performed. Since the present disclosure is intended to test and diagnose a correction element, the details of (2) correction mode will be omitted.

Next, the following describes (3) test and self-diagnostic mode.

Since a test and self-diagnostic target of the present embodiment is a correction element itself for correcting an offset of a comparator, a comparator having an offset correction mechanism will be described before the other disclosures are made.

Figure 4:
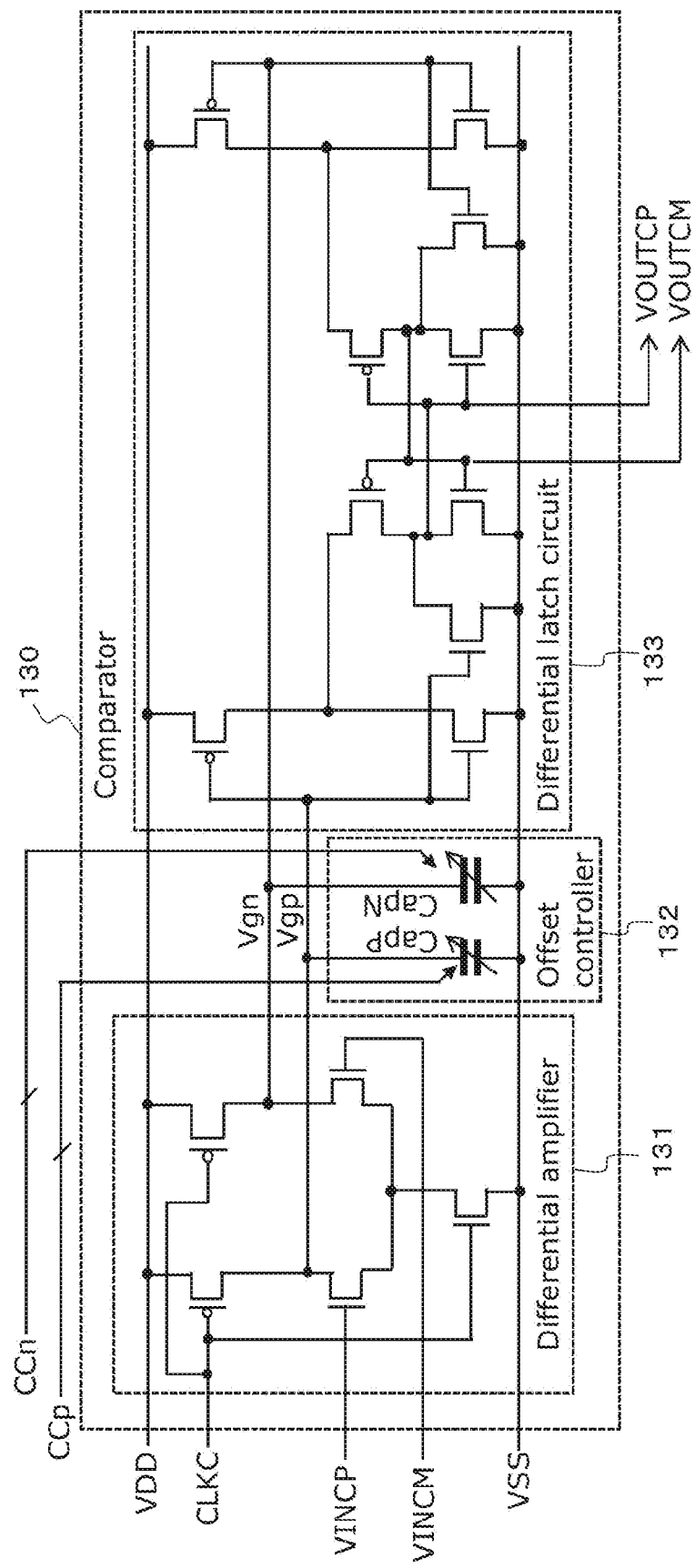
FIG. 4 is a circuit diagram illustrating an example of the comparator in FIG. 3.

FIG. 4 is a circuit diagram illustrating an example of the comparator in FIG. 3. Comparator 130 shown by FIG. 4 is an example of comparator 116 shown by FIG. 3, and includes offset controller 132 as an offset mechanism. Offset controller 132 is an example of correction circuit 109 shown by FIG. 1.

In FIG. 4, comparator 130 includes differential amplifier 131, offset controller 132, and differential latch circuit 133.

Offset controller 132 includes CapP and CapN that are variable capacitors for correction, for a positive differential and a negative differential, respectively. CapP has one end connected to positive output node Vgp of differential amplifier 131, and CapN has one end connected to negative output node Vgn of differential amplifier 131.

Correction elements (CapP, CapN) are capable of making capacitance values variable, based on the amount of offset correction capacitor control code (CCp, CCn) supplied from digital circuit 112.

The following describes an offset correction effect and issues of a comparator.

The figure includes offset controller 132.

Digital circuit 112 supplies a correction control code (CC3$p$, CC2$p$, CC1$p$, CC0$p$, CC3$n$, CC2$n$, CC1$n$, CC0$n$) to correction element driver circuit 136, and correction element driver circuit 136 supplies VDD (a power supply voltage) or VSS (a GND voltage) to a correction element group.

The correction element group includes a MOS transistor and has a capacitance value between a node whose drain and source are short-circuited and a node of the gate driven by correction element driver circuit 136.

In the case where the correction element group includes an NMOS transistor, when a driver circuit supplies VDD, a channel is formed in an MOS, and a capacitance value increases.

In contrast, when the driver circuit supplies VSS, a channel is not formed, and a capacitance value becomes parasitic capacitance relative to GND and decreases.

Comparator 130 to be corrected has random offset Voff mainly due to a manufacturing variation of a differential pair of differential amplifiers 131.

Figure 5:
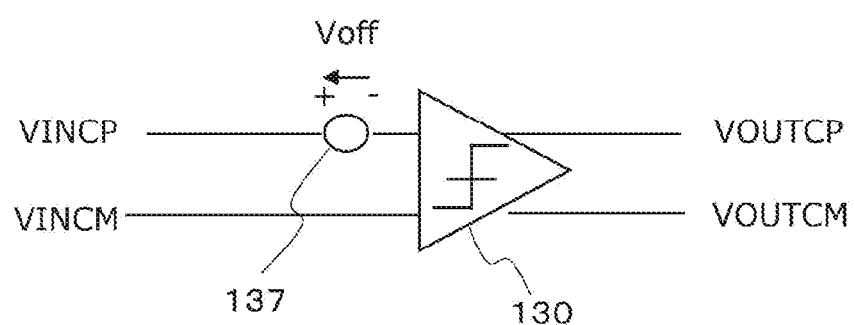
FIG. 5 is a diagram illustrating an expedient definition of a comparator offset code.

Since it is necessary to define an offset code for convenience in the present disclosure, an offset code is defined for convenience in FIG. 5.

Since the same description is applicable to a reverse code, the definition is just for convenience.

When comparator offset 137 is zero, comparator 130 has positive input VINCP, negative input VINCM, positive output VOUTCP, and negative output VOUTCM. When a value of a differential input (VINCP-VINCM) is greater than 0, comparator 130 outputs "1" as VOUTCP; and when the value of the differential input is less than 0, comparator 130 outputs "0" as VOUTCP and an inverted logical value of VOUTCP as VOUTCM.

When offset Voff results from a manufacturing variation, a substantial differential input of comparator 130 is (VINCP-Voff-VINCM). When a value of the substantial differential input is greater than 0, comparator 130 outputs "1" as VOUTCP; when the value of the substantial differential input is less than 0, comparator 130 outputs "0" as VOUTCP.

Figure 6:
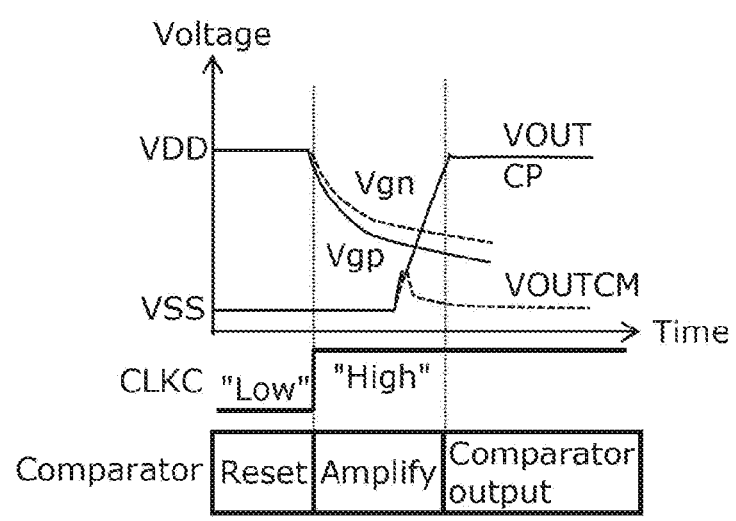
FIG. 6 is a diagram illustrating an example of an output waveform of a comparator.

FIG. 6 shows an example of an output waveform of a comparator.

When input clock CLKC of the comparator is "Low," the comparator is in a reset state, internal nodes (Vgp, Vgn) have a power source potential (VDD), and output nodes (Voutp, Voutn) have a GND potential (VSS).

When input clock CLKC of the comparator changes to "High," the comparator is in an amplified state, differential amplifier 131 amplifies differential input signals (VINCP, VINCM), the potential of the internal nodes (Vgp, Vgn) approaches VSS, and the comparator waits for a difference between signals corresponding to an input to arise.

A differential latch circuit performs a regeneration operation according to a difference between signals of the internal nodes (Vgp, Vgn), the comparator changes to a comparator output state, and a logical value of output voltages (VOUTCP, VOUTCM) is determined.

In the example shown by FIG. 5, a voltage of input signal VINCP is determined to be higher than a voltage of input signal VINCM, and "1" and "0" are outputted as VOUTCP and VOUTCM, respectively.

Figure 7:
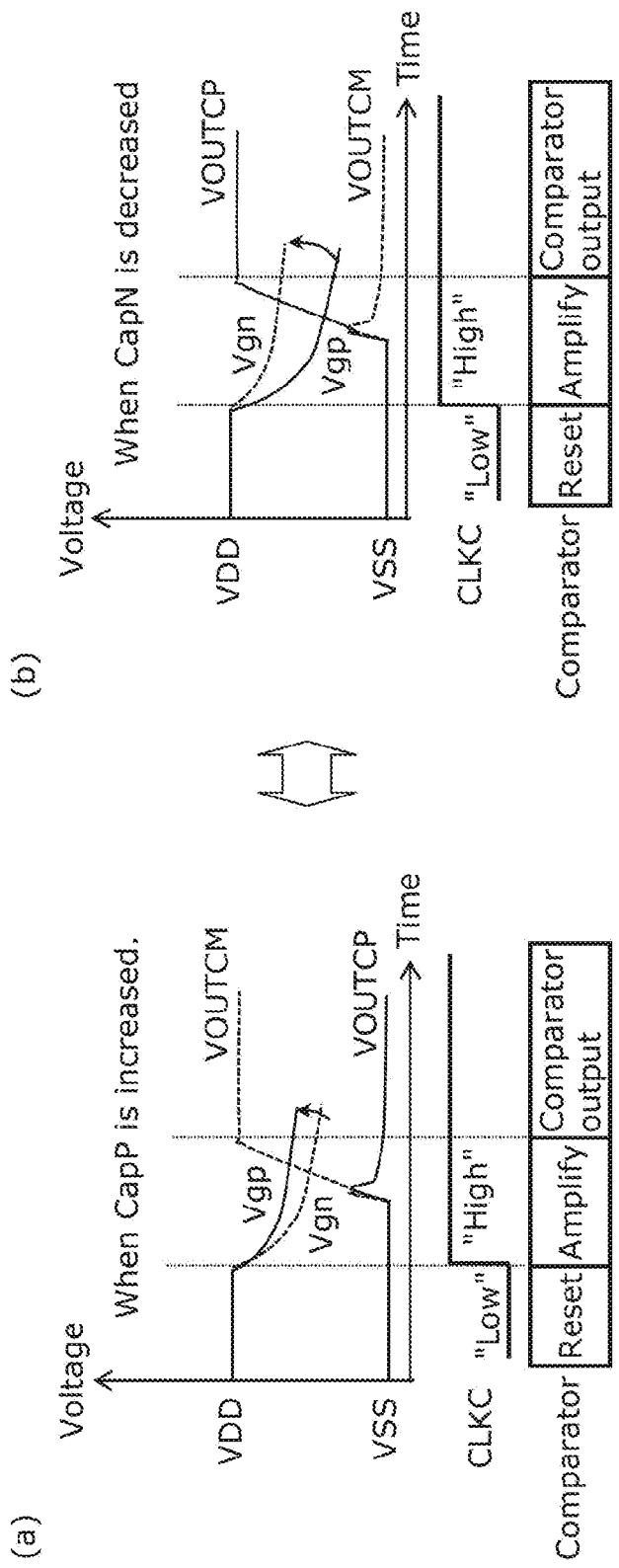
FIG. 7 is a diagram illustrating a waveform example indicating an influence of an offset correction capacitor of a comparator.

FIG. 7 is a diagram illustrating a waveform example indicating an influence of an offset correction capacitor.

When variable correction capacitor CapP is increased using a control signal, variable correction capacitor CapP shifts to a direction of Vgp>Vgn because an operation of pulling a Vgp node to GND at the time of amplification is delayed.

Accordingly, output VOUTCP at this time is "0."

In contrast, when variable correction capacitor CapN is increased using a control signal, variable correction capacitor CapN shifts to a direction of Vgp<Vgn because an operation of pulling a Vgn node to GND at the time of amplification is delayed.

Accordingly, output VOUTCP at this time is "1."

As described above, an offset is adjusted by adjusting a load balance of a differential circuit.

In order to consider codes for the offset correction effect by CapP and the offset correction effect by CapN, the definition provided in FIG. 5 will be redefined.

Figure 8:
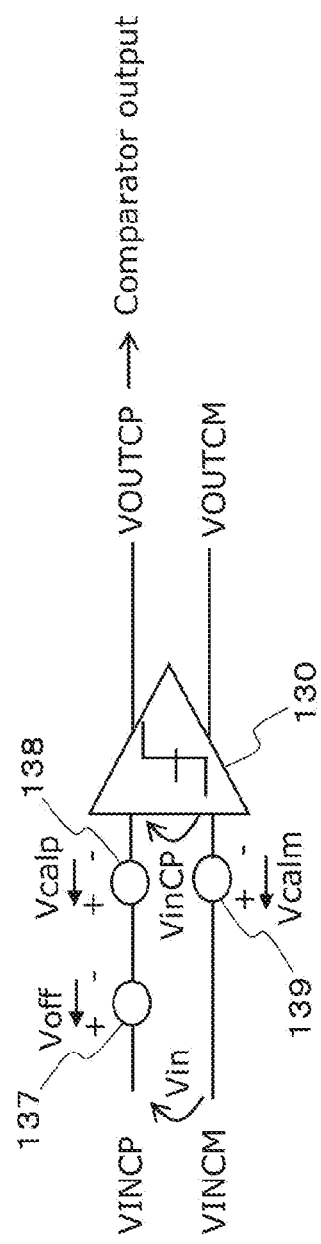
FIG. 8 is a diagram illustrating an expedient redefinition of a comparator offset code including correction.

FIG. 8 shows an expedient redefinition of a comparator offset code including correction.

Amount of offset correction 138 when CapP is increased is denoted by Vcalp, amount of offset correction 139 when CapN is increased is denoted by Vcalm, comparator offset 137 is denoted by offset Voff, a differential input (VINCP−VINCM) is denoted by Vin, and a comparator output is denoted by VOUTCP.

At this time, substantial differential input VinCP of comparator 130 is ((VINCP−Voff−Vcalp)−(VINCM−Vcalm)).

In other words, VinCP is (Vin−Voff−(Vcalp−Vcalm)).

Accordingly, the effects on the offset by CapP and CapN are in a relationship of "reverse code."

Moreover, in order to arrange 4-bit correction capacitors on the positive and negative sides, respectively, comparator 130 has a correction effect equivalent to 5 bits.

FIG. 9 and FIG. 10 each show an example of specifically calculating offset correction control codes and the amounts of offset correction.

In FIG. 9 and FIG. 10, weights for the amounts of correction are set to $1.8^3$, $1.8^2$, 1.8, and 1.

Moreover, the amounts of offset effect of the respective weights are set to 5.832 mV, 3.24 mV, 1.8 mV, and 1 mV.

As shown by FIG. 9 and FIG. 10, since CapP and CapN serve as offset correction capacitors, assignment of control codes is made possible to achieve a single amount of offset correction, and the control codes have no one-to-one relationship with the amounts of offset correction, which makes it possible to perform correction using any control code correspondence table.

The sum of (Vcalp−Vcalm) serves as the amount of offset correction.

Figure 11:
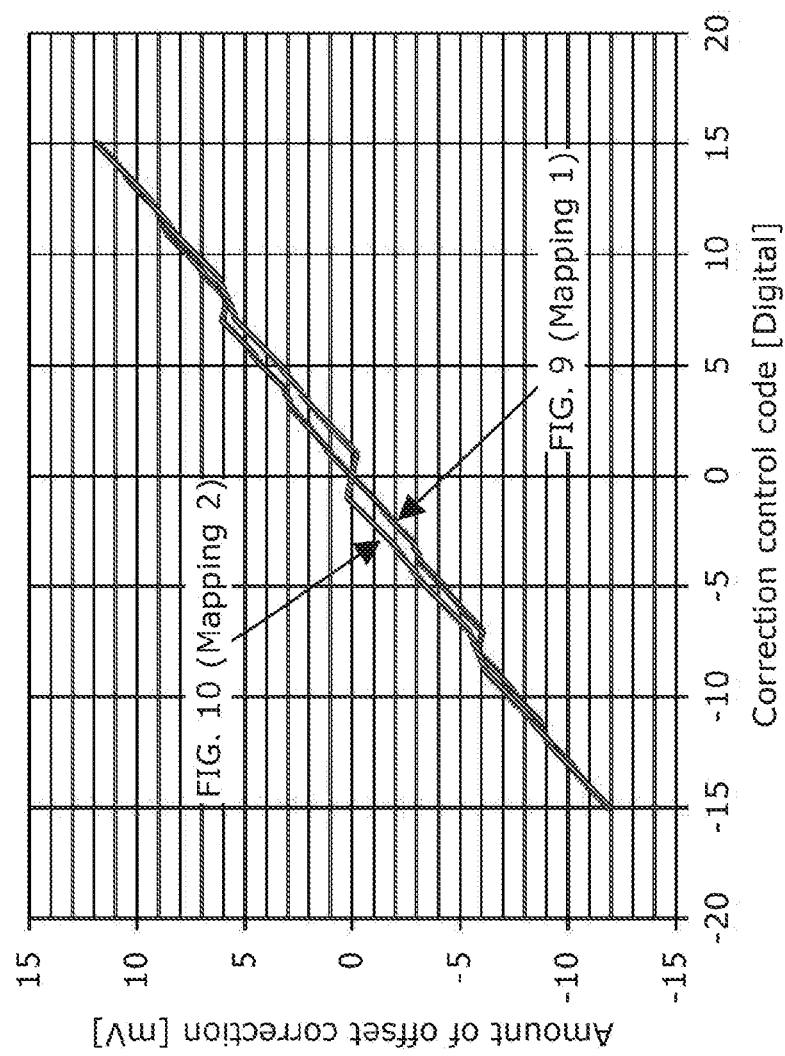
FIG. 11 is a diagram illustrating a relationship between a correction control code and the amount of offset correction.

FIG. 11 shows a relationship between a correction control code and the amount of offset correction.

The amount of correction based on a first correspondence table (Mapping 1) and the amount of correction based on a second correspondence table (Mapping 1) both can achieve the same correction range.

As is clear from the figure, since the weight is less than or equal to 2 (1.8), there is a point at which the amount of correction decreases with the increase in the control code.

To put it another way, this indicates that although a resolution is maintained because of redundancy, correction control codes (solutions) are present in order to achieve a single amount of offset correction, as the case may be.

For this reason, there are some cases in which the amounts of offset correction and the control codes are not in the one-to-one relationship due to the redundancy of the correction capacitors.

As stated above, the redundancy that fails to bring about the one-to-one relationship becomes an issue from a standpoint of testing and diagnosing of a correction element itself.

If part of a correction element became faulty or part of an output of a driver circuit for the correction element became faulty, a signal indicating the amount of offset correction of the comparator would be determined by test and diagnosis using a direct or indirect method.

At this time, when an output indicating the amount of correction is a normal value, the normality is merely achieved due to the redundancy. This does not mean that the whole of the correction element is normal. (In this regard, however, there is an advantage that even if one part of the correction element becomes faulty, the redundancy makes it possible to search for another resolution and make a recovery.)

Moreover, when a diagnostic output is an abnormal value, as described using the example of the control code correspondence table for the differential circuit, the amounts of correction and correction codes are not in a one-to-one relationship. For this reason, it is difficult to identify the location of a faulty element, such as determining whether a fault has occurred on the positive or negative side or what correction element has become faulty. (Hereinafter, this difficulty is referred to as an "issue of concealing internal fault due to redundancy.") Next, the following describes an issue of noise of a comparator.

Since a further reduction of voltage has been made along with miniaturization of an analog circuit such as a data converter, noise of a comparator becomes an issue in AD conversion and correction or test and diagnosis.

FIG. 12 is a diagram illustrating an influence of noise of a comparator.

In FIG. 12, the horizontal axis represents a comparator input voltage, and the vertical axis represents a cumulative distribution function (CDF) that is a probability that a comparator outputs "1" in response to an input.

When an input voltage is zero, a CDF is approximately 0.5, which means that a probability of outputting "1" is 50% and a probability of outputting "0" is 50%.

(a) and (b) in FIG. 12 each show a simulation result when a comparator output result is repeatedly measured to remove the influence of the noise.

(a) in FIG. 12 shows a result of measurement performed 64 times, and (b) in FIG. 12 shows a result of measurement performed 4096 times.

As is clear from (a) in FIG. 12, since the number of comparator outputs is fewer, an erroneous determination may be made due to the noise.

The influence of the noise of the comparator is generally one of factors contributing to accuracy deterioration in an AD conversion result, and becomes an issue as an erroneous determination of a result in correction or test and diagnosis. (Hereinafter, this issue is referred to as an "issue of erroneous determination due to noise.")

Next, the following describes an issue of nonlinearity of a comparator.

Figure 13:
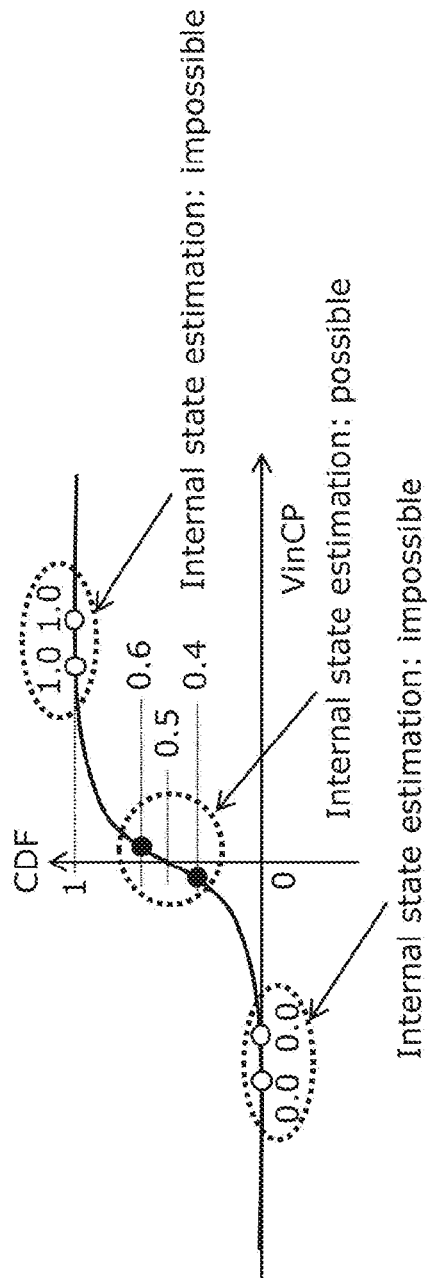
FIG. 13 is a diagram illustrating an influence of nonlinearity of a comparator.

FIG. 13 is a diagram illustrating an influence of nonlinearity of a comparator.

In FIG. 13, the horizontal axis represents substantial differential input VinCP of the comparator, and the vertical axis represents a CDF.

The figure shows an example in which some of correction control codes are selected and a CDF is measured in order to test and diagnose the correction control codes.

When two adjacent control codes represented by black circles and close to a comparator transition point (0.5) are selected, the two adjacent control codes are measured as "0.4" and "0.6," respectively, and it is easy to determine normality or abnormality.

On the other hand, when two control codes represented by white circles are selected in a place where there is no comparator transition point, both of the two control codes are outputted as "0.0."

Accordingly, in a place other than a place where the CDF is "0.5," it is difficult to perform function determination such as determining whether control codes for correction are normally functioning or acting, or to perform accuracy determination such as determining whether a magnitude relationship between individual correction elements has been determined as intended.

As described above, it is possible to accurately test and diagnose only some of the correction control codes due to the nonlinearity. (Hereinafter, this issue is referred to as an "issue of state estimation due to comparator nonlinearity.") Since the present disclosure is intended to test and diagnose a correction element, an analog circuit configuration is not limited. An analog circuit configuration will be described as one example using comparator 116 shown by FIG. 3.

Figure 14:
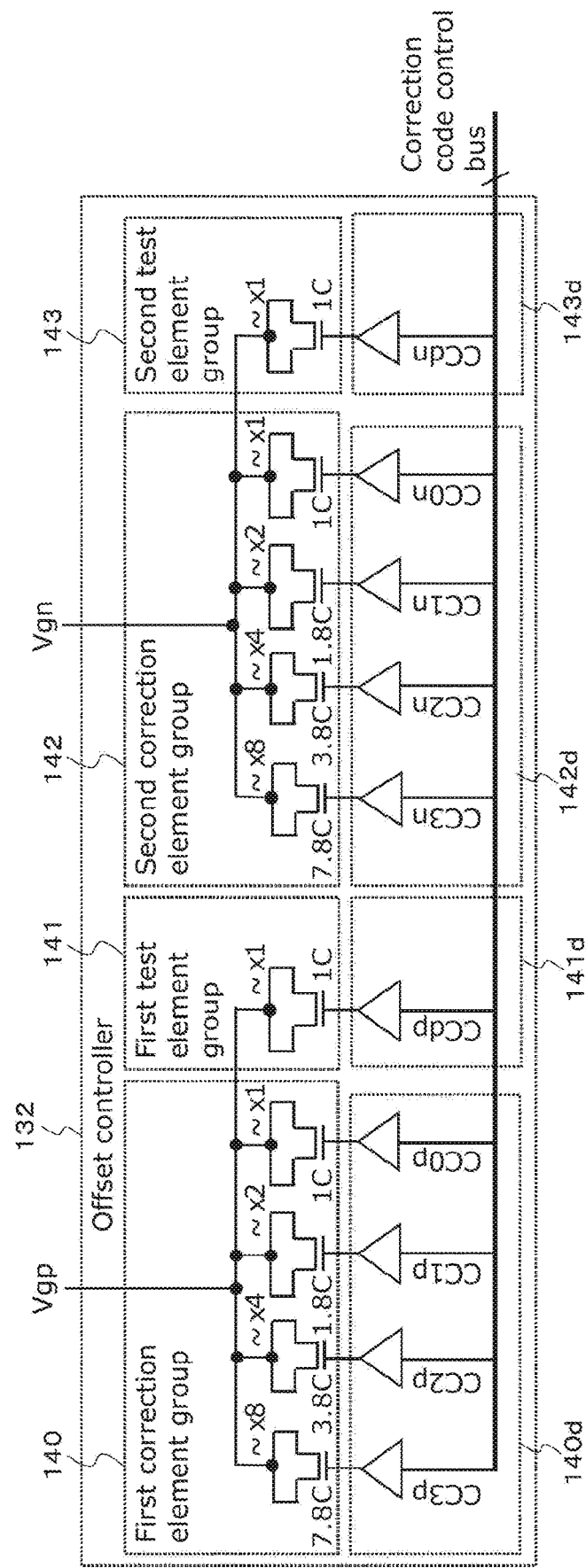
FIG. 14 is a circuit diagram of an offset controller according to Embodiment 2.

In the present disclosure, the circuit diagram shown by FIG. 14 is used as a configuration of offset controller 132 of comparator 116 shown by FIG. 3.

Figure 48:
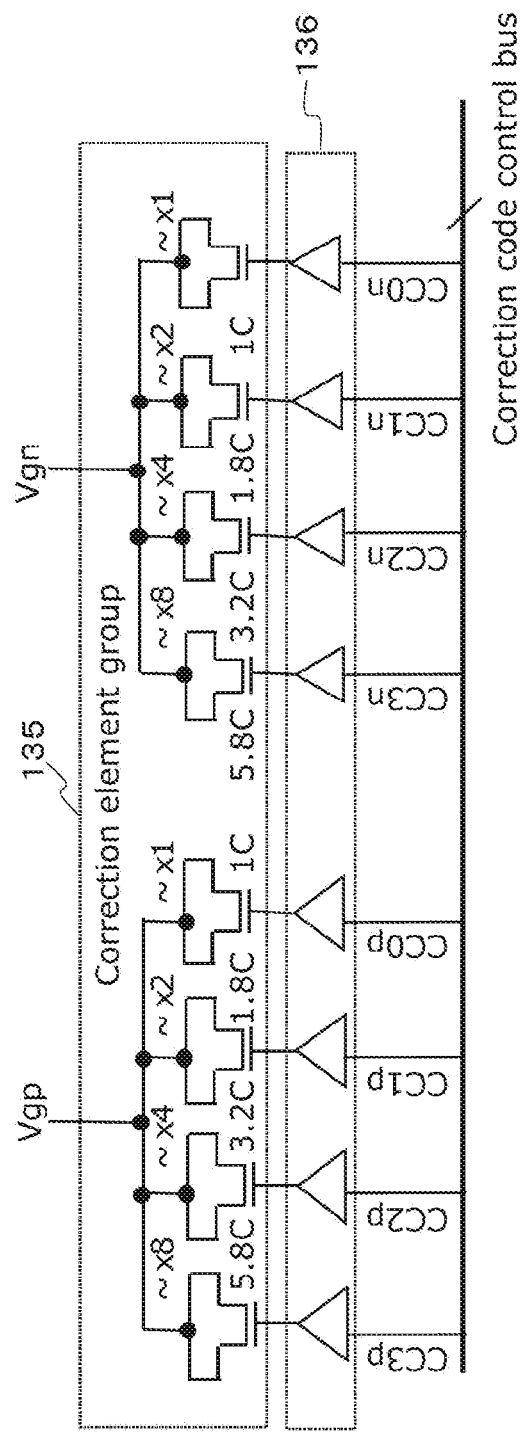
FIG. 48 is a circuit diagram illustrating a conventional offset controller.

FIG. 14 shows offset controller 132 according to the present disclosure, while FIG. 48 shows a conventional offset controller. Offset controller 132 differs from the conventional offset controller in including first test element group 141.

First test element group 141 is used when weights for first correction element group 140 are tested, is controlled according to control signal CCdp, and has the same capacitance value as the LSB (1C) of a correction element group.

However, first test element group 141 is not limited to this size. Even if a value less than or equal to the LSB (1C) of the test element group is set as the size of first test element group 141, it is possible to produce the same advantageous effect.

Figure 15A:
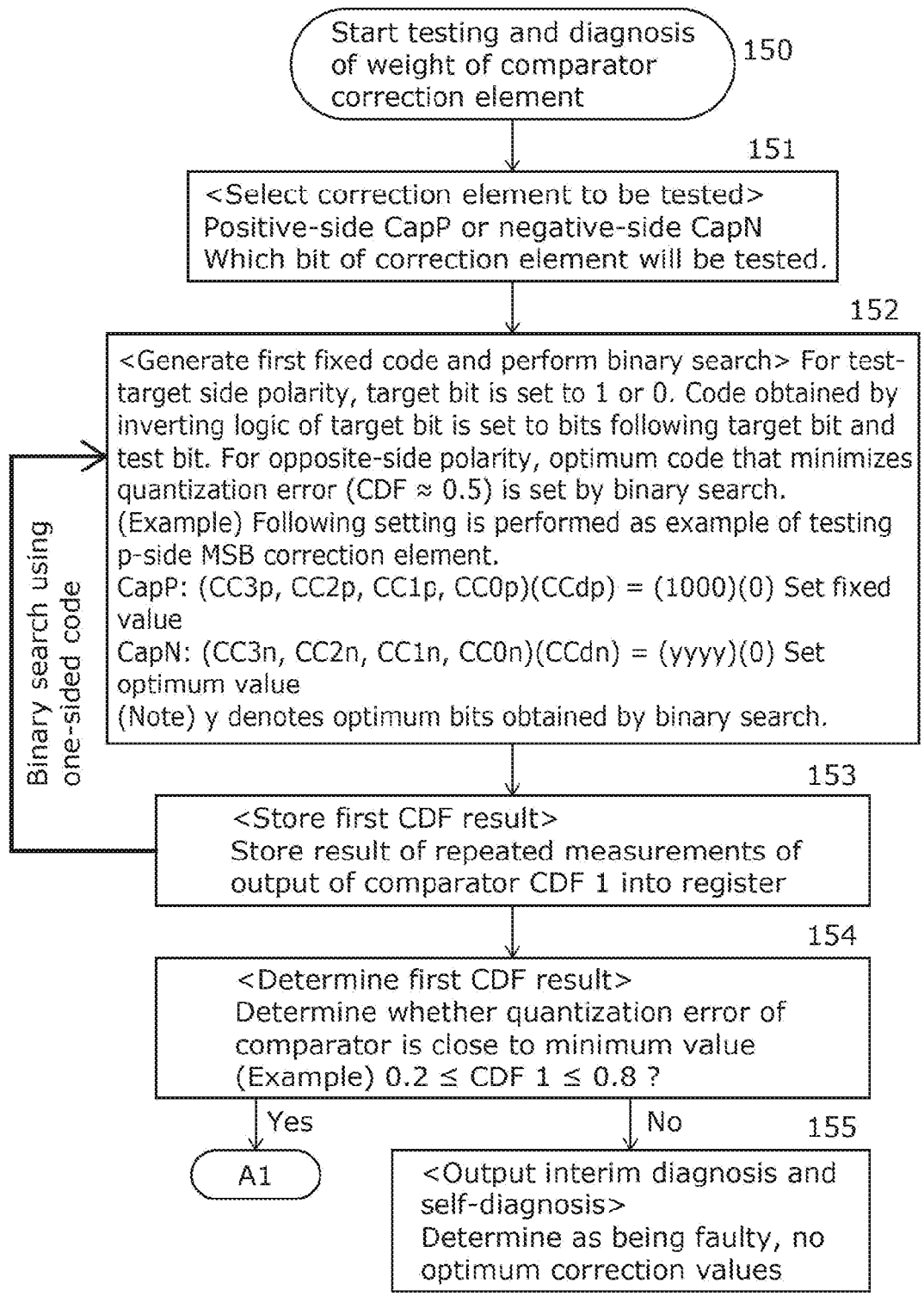
FIG. 15A is a diagram illustrating a procedure for testing and diagnosing a weight of each offset correction element of a comparator according to Embodiment 2.
Figure 15B:
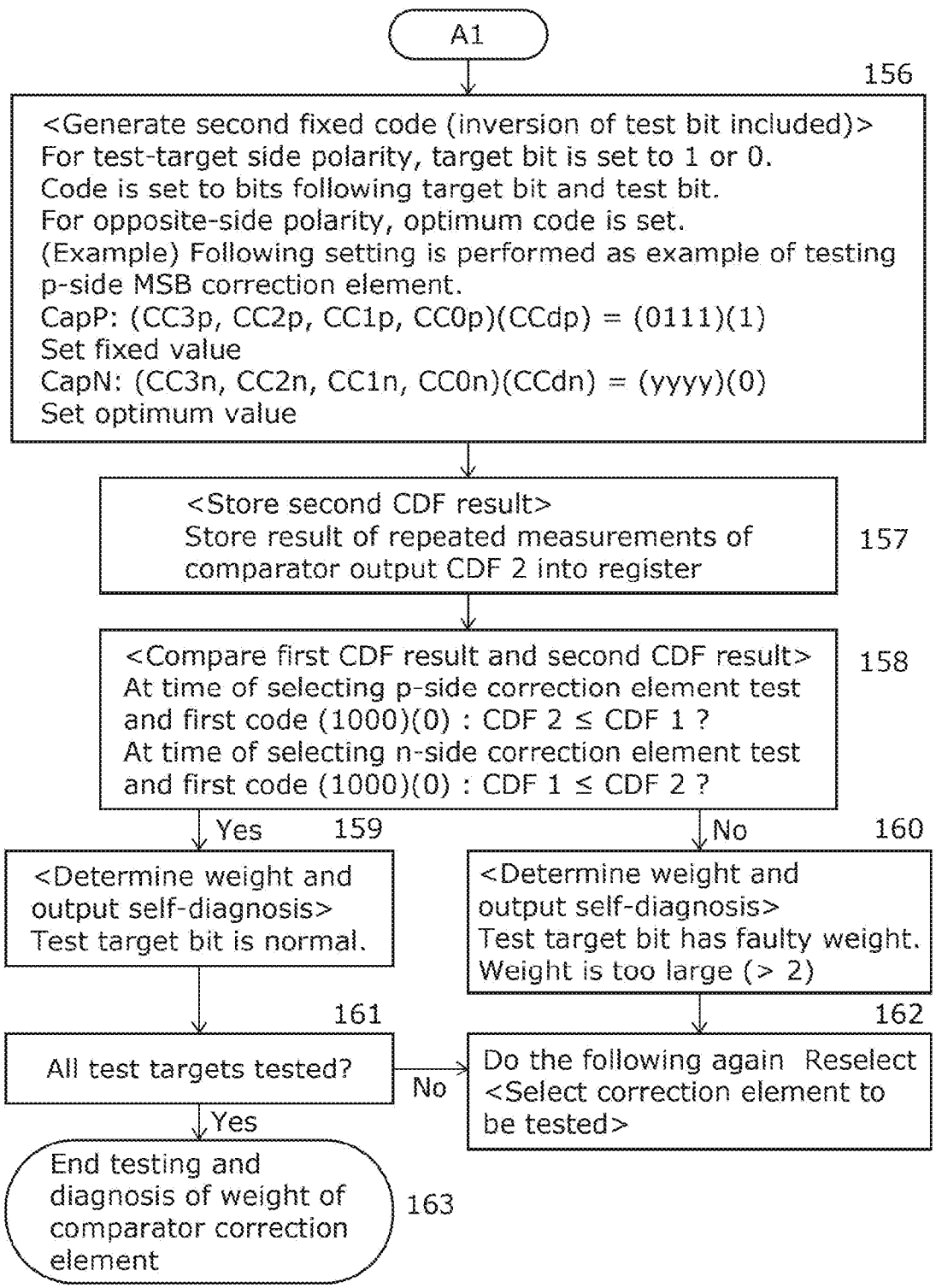
FIG. 15B is a continuation of FIG. 15A and is a diagram illustrating a procedure for testing and diagnosing each weight of the offset correction element of the comparator.
Figure 16:
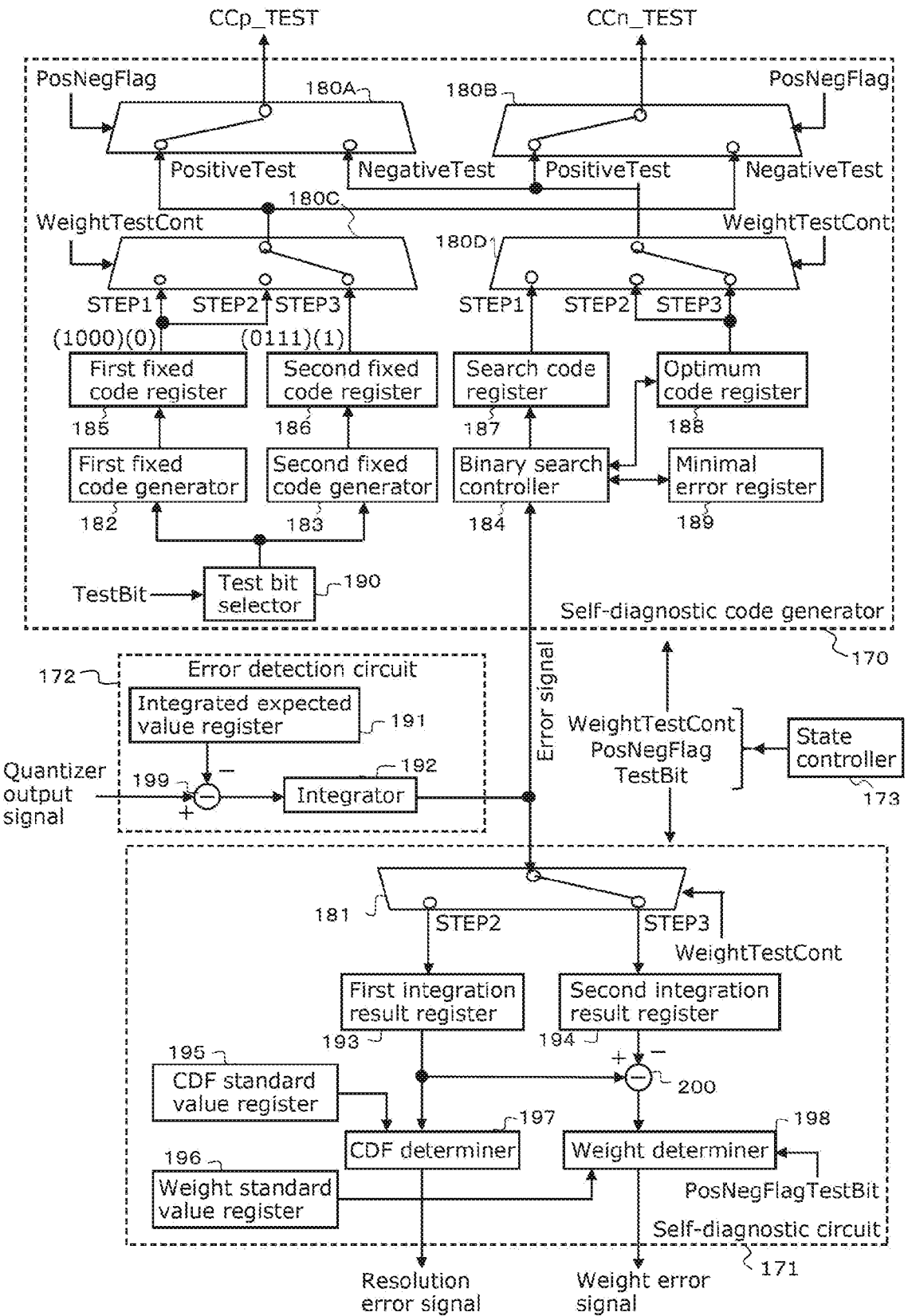
FIG. 16 is a diagram illustrating an example of testing and diagnostic digital circuitry for an offset correction element of a comparator according to Embodiment 2.

The following describes a weight test procedure according to the present disclosure, based on the flowcharts shown by FIG. 15A and FIG. 15B, with reference to the circuit configurations shown by FIG. 2 and FIG. 16, and using the tables and the schematic diagrams shown by FIG. 17 to FIG. 22.

FIG. 15A and FIG. 15B each show a procedure (a flowchart) for testing and diagnosing a weight of each of offset correction elements of a comparator.

FIG. 16 shows a configuration example of digital circuitry.

FIG. 17 and FIG. 18 show the amounts of correction offset at the time of testing and diagnosis.

Figure 19:
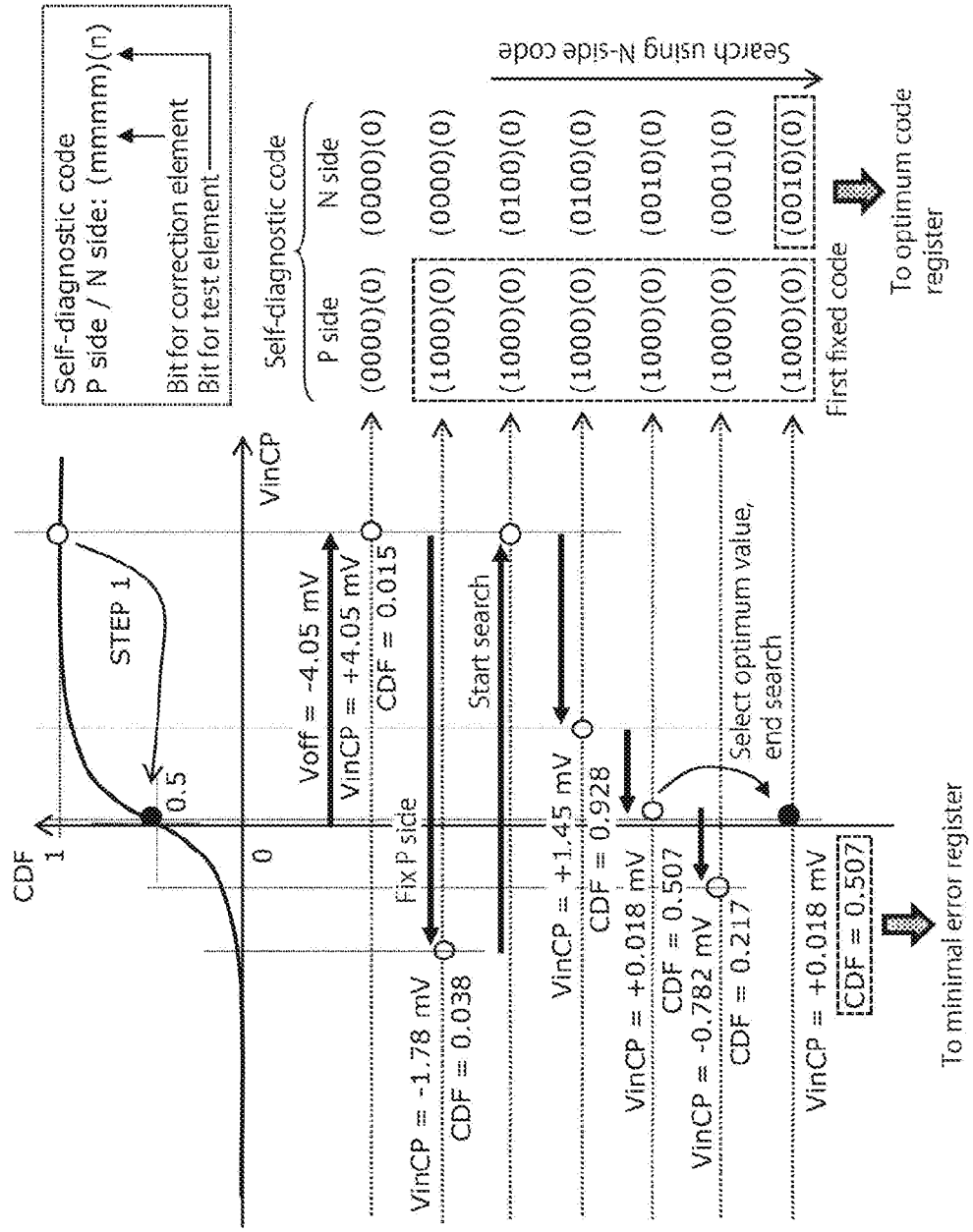
FIG. 19 is a schematic diagram illustrating generation of a first fixed code and execution of binary search according to Embodiment 2.
Figure 20:
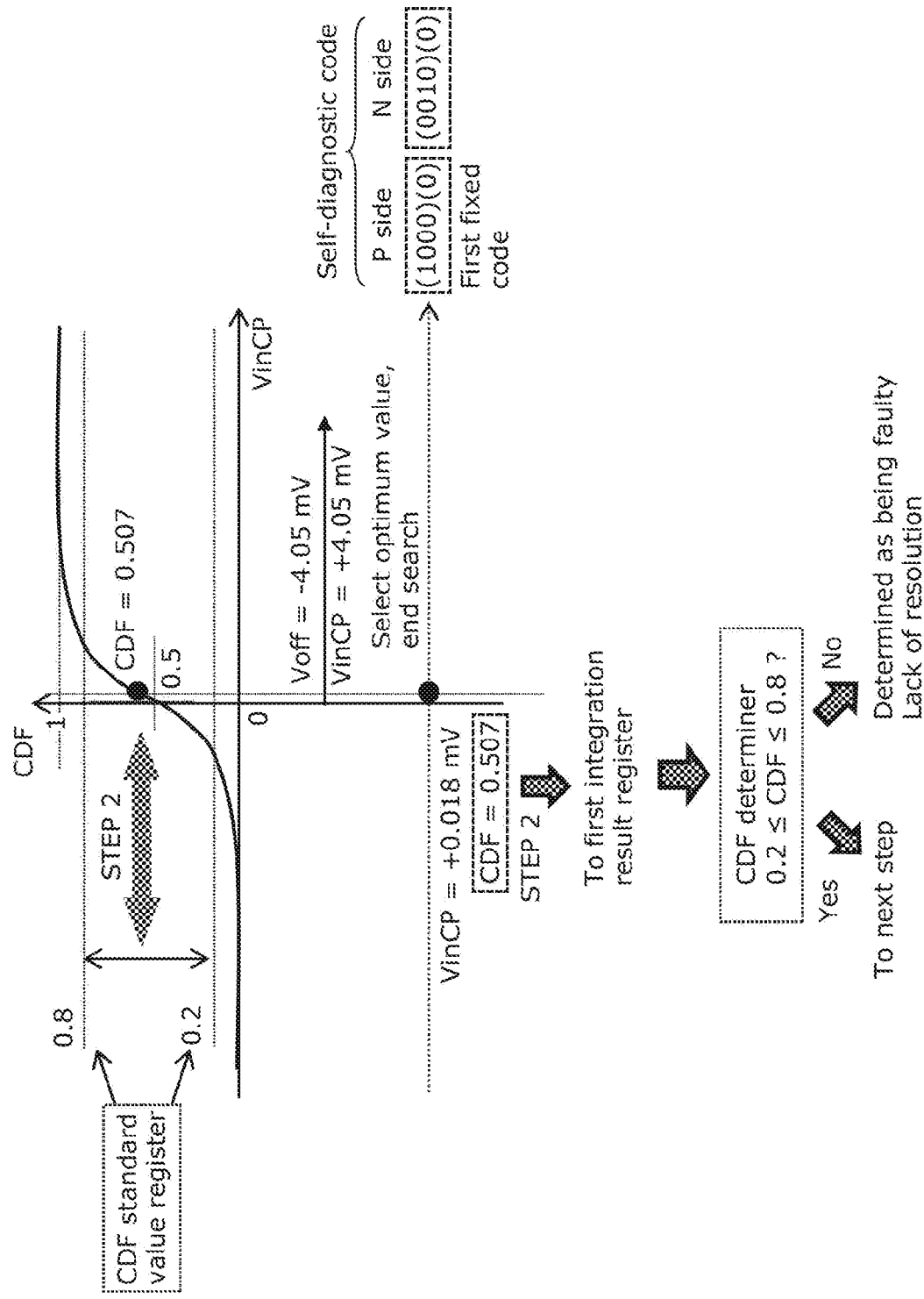
FIG. 20 is a schematic diagram illustrating CDF determination according to Embodiment 2.
Figure 21:
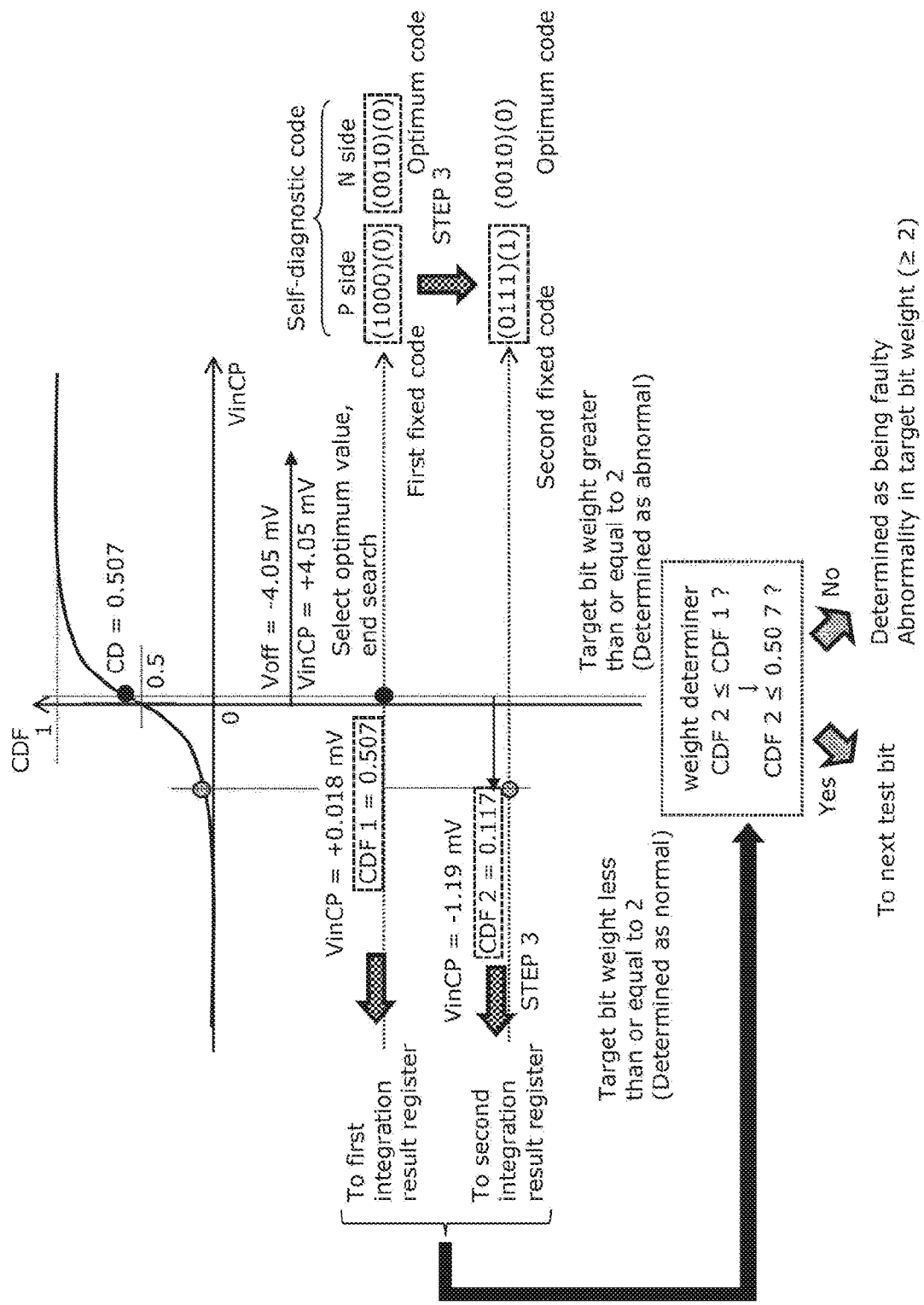
FIG. 21 is a schematic diagram illustrating generation of a second fixed code and weight determination by CDF comparison according to Embodiment 2.

FIG. 19, FIG. 20, and FIG. 21 each show an example of calculating the amount of correction offset and a CDF at the time of testing and diagnosis.

Figure 22:
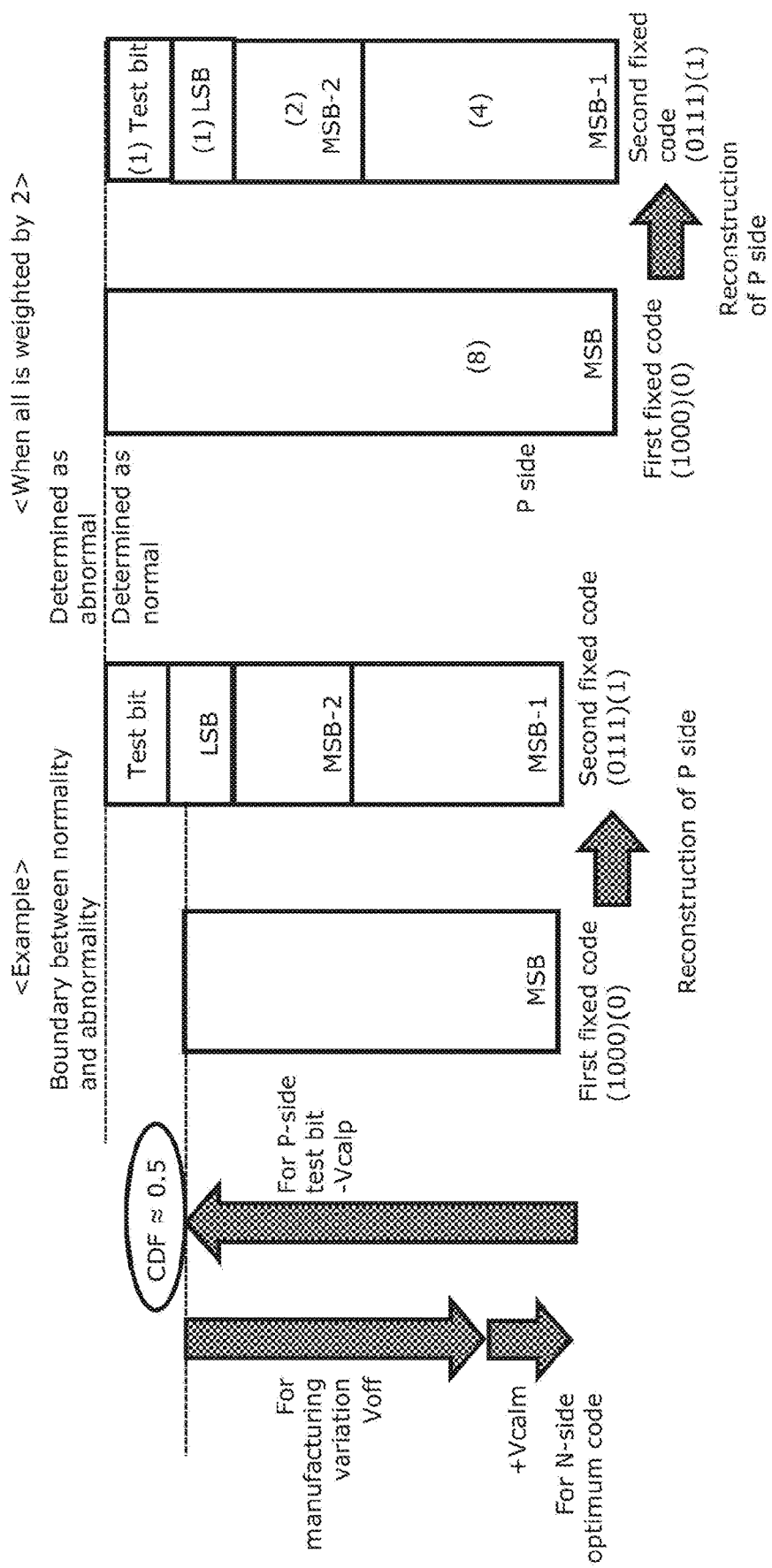
FIG. 22 is a schematic diagram illustrating weight determination using a test bit according to Embodiment 2.

FIG. 22 is a schematic diagram illustrating weight determination using a test bit.

Testing and diagnosis of a weight of a comparator correction element is started in step 150.

In the circuit configuration shown by FIG. 2, correction code generation circuit 121 is disabled by being supplied with a predetermined operating mode signal, and self-diagnostic code generation circuit 122 is enabled by being supplied with the predetermined operating mode signal, and starts operating.

A correction element to be tested is selected in step 151.

Since correction elements are arranged on both the positive side (P side) and the negative side (N side), the correction elements are selected, tested, and diagnosed individually.

Moreover, which bit of a correction element (which correction element) is to be tested is determined.

A correction element may be sequentially selected in a programmed sequence or in a sequence selected based on the information held in a register.

In the present embodiment, test bit selector 190 receives test target bit specifying signal TestBit outputted from state controller 173, and outputs information that forms the basis of a control code for testing to first fixed code generator 182 and second fixed code generator 183.

Since the correction elements are arranged in an array to which a value less than or equal to a weight of 2 is set, it is possible to resolve the above-described "issue of concealing internal fault due to redundancy" by testing and diagnosing the correction elements individually.

A first fixed code is generated, and binary search is performed in steps 152 and 153.

Although it is assumed in the present disclosure that all correction bits are tested by performing the same operation on all the correction bits, the following describes, as an example, a case in which the MSB of a P-side correction element is tested.

Although a self-diagnostic code outputted from first fixed code generator 182 is outputted as (Cc3$p$, CC2$p$, CC1$p$, CC0$p$)(CCdp) of a P-side control code, the self-diagnostic code as a value is set to a fixed value of (1, 0, 0, 0)(0).

This fixed value is stored into and held in first fixed code register 185.

On the other hand, regarding an N-side control code, binary search controller 184 searches for an optimum code that minimizes a quantization error (a CDF is approximately 0.5).

A code being searched for is stored into search code register 187. A code when a CDF becomes closer to 0.5 is stored into optimum code register 188 each time. An error from 0.5 that is the center of a CDF is stored into minimal error register 189 and updated.

It should be noted that when binary search is controlled, control signal (CCdn) of an N-side test element is set to (0).

FIG. 19 shows a state of binary search, and FIG. 17 shows the amounts of correction offset when a first fixed code is set.

In the present embodiment, offset Voff is, for example, 4.05 my, and amount of N-side correction Vcalm and the N-side control code are determined so that a quantization error becomes minimal (CDF≈0.5) relative to the sum of amounts of correction Vcalp for offset Voff and P-side first fixed code (1000)(0).

A quantizer output signal is inputted to integrated expected value register 191 and subtractor 199, and a subtraction result is accumulated in integrator 192 (an accumulator).

It is possible to resolve the above-described "issue of erroneous determination due to noise" by integrator 192 performing repeated measurements.

An output of integrator 192 is supplied as an error signal to binary search controller 184 and demultiplexer 181.

When the binary search is completed, and the optimum code is determined, the first fixed code passes through selector 180C and selector 180A and is supplied as a control signal to the P-side correction element.

Additionally, the determined optimum code is outputted by optimum code register 188, passes through selector 180D and selector 180B, and is supplied as a control signal to an N-side correction element.

As a result, demultiplexer 181 is switched to STEP 2, and the error signal is stored into first integration result register 193.

A first integration result is inputted to CDF determiner 197 and compared to the upper value and the lower value stored in CDF standard value register 195.

FIG. 20 is a schematic diagram illustrating standard value determination based on CDF.

Although the figure shows an example, when the first integration result satisfies 0.2≤CDF≤0.8 (step 154), the first integration result is determined to be normal, and the procedure proceeds to the next step (156).

When the first integration result fails to satisfy 0.2≤CDF≤0.8 (step 155), the first integration result is determined to be abnormal as resolution insufficiency.

Moreover, when offset resolution abnormality is determined based on this CDF determination, it is difficult to identify a fault location such as determining whether a P-side correction element group or an N-side correction element group has become faulty. However, whether the P-side correction element group or the N-side correction element group has become faulty does not matter at this stage.

In other words, the primary purpose is to test a specific bit in the next step by bringing a CDF closer to 0.5.

In the next step, the P side is reconstructed, the N side is maintained at an optimum value, and whether the sign of a CDF becomes positive or negative with reference to 0.5 is determined. Whether a CDF can be brought closer to 0.5 for testing is important in carrying out the present disclosure.

By shifting, through this series of steps, an offset to the position of internal state estimation: possible shown by FIG. 13, it is possible to resolve the above-described "issue of state estimation due to comparator nonlinearity."

Selectors 180C and 180D and demultiplexer 181 are switched to STEP 2 in step 156.

A self-diagnostic code outputted from second fixed code generator 183 is (CC3n, CC2n, CC1n, CC0n)(CCdn) and set to a fixed value of (0, 1, 1, 1)(1).

This fixed value is stored into and held in second fixed code register 186.

In contrast, an N-side control code is maintained to the optimum code ((0, 0, 1, 0)(0) in the present embodiment) outputted from optimum code register 188.

A second fixed code is supplied to a P-side correction element via selectors 180C and 180A.

The optimum code is supplied to an N-side correction element via selectors 180D and 180B.

In this example, it is important that the N-side control code remains unchanged through this series of operations. Since the P-side control code is reconstructed, and the amount of change of the CDF result from the neighborhood of 0.5 is determined, when a fault is detected, a fault location can be identified to be on the P side. Additionally, since testing is performed for each bit, it is possible to test and diagnose which bit has become faulty.

The following describes steps 157 to 160.

The error signal outputted from integrator 192 is supplied to second integration result register 194 (step 157).

A difference between the first integration result and a second integration result is calculated by subtractor 200 and supplied to weight determiner 198, and which of CDFs of the first integration result and the second integration result is greater is determined (step 158). Subsequently, self-diagnostic output is performed (steps 159 and 160).

In the example of the present embodiment, when CDF 2≤CDF 1 is satisfied, the MSB of the P-side correction element is determined as being normal; and when CDF 2≤CDF 1 is not satisfied, the MSB of the P-side correction element is determined as being abnormal because the MSB is weighted by at least 2.

FIG. 21 is a supplementary schematic diagram illustrating the series of operations.

FIG. 22 is also a supplementary schematic diagram illustrating weight determination using a test bit.

Amount of N-side correction Vcalm is controllable, and offset Voff for a manufacturing variation is uncontrollable (varies randomly within a certain range).

Moreover, it is necessary to set a test target bit to "1" or "0" so as to test a specific bit on the P side.

In the present embodiment, an issue is resolved by performing control to bring the CDF closer to 0.5 by setting the P side (to 1000 or 0111), using offset Voff as the amount of offset generated due to the manufacturing variation, and performing N-side binary search control on the N side not to be tested, under these limiting conditions.

Adjusting amount of N-side correction Vcalm by binary search with reference to the sum of P-side fixed value Vcalp (fixed for testing) and manufacturing variation offset Voff, and bringing the CDF closer to 0.5, can be considered as preparatory operations for testing and diagnosis.

By (i) individually performing, on both the P side and the N side, the procedure based on the flowchart shown by each of FIG. 15A and FIG. 15B and (ii) individually testing and diagnosing all the bits, it is possible to ensure that the weights for all the correction elements are less than or equal to 2 with reference to the test element.

As stated above, it is possible to resolve the "issue of erroneous determination due to noise" by the integrator in the error detection circuit integrating a quantizer output result.

Moreover, since it is possible to determine a magnitude relationship between two opposite integration results by bringing a CDF closer to 0.5 using a correction element on a polar side not to be tested, it is possible to resolve the "issue of state estimation due to comparator nonlinearity."

Furthermore, since it is possible to individually test and diagnose the weights on the P side and the N side with reference to the test element and to identify a fault by individually testing the correction elements, it is possible to resolve the "issue of concealing internal fault due to redundancy."

As stated above, in the semiconductor circuit according to Embodiment 2, the self-diagnostic code includes a first fixed code and an optimum code. The one or more correction elements are three or more correction elements. The first fixed code is for (i) enabling a single correction element selected as a test target from the correction element group and (ii) disabling other correction elements included in the correction element group and the one or more test elements. The optimum code is for minimizing the error signal relative to the first fixed code and is generated by binary search. Self-diagnostic circuit 105: calculates an integrated value of the error signal corresponding to a combination of the first fixed code and the optimum code; and determines whether the integrated value falls within a predetermined range, and determines the correction element group as being faulty when the integrated value falls outside the predetermined range.

Here, the self-diagnostic code includes a first fixed code, a second fixed code, and an optimum code. The one or more correction elements are three or more correction elements. The first fixed code is for (i) enabling a single correction element selected as a test target from the correction element group and (ii) disabling other correction elements included in the correction element group and the one or more test elements. The optimum code is for minimizing the error signal relative to the first fixed code and is generated by binary search. The measured signal is a differential signal including a first polarity signal and a second polarity signal. The correction element group includes a first element group connected to a transmission path for the first polarity signal, and a second element group connected to a transmission path for the second polarity signal. The first fixed code corresponds to the first element group and is for disabling the second element group. The second fixed code is for (i) disabling a single correction element selected as a test target from the first element group, (ii) enabling, among other correction elements included in the first element group, a correction element having a weight smaller than a weight of the single correction element selected, and (iii) enabling the one or more test elements. The optimum code corresponds to the second element group and is for disabling the first element group. Self-diagnostic circuit 105: calculates a first integrated value by integrating the error signal corresponding to a combination of the first fixed code and the optimum code; calculates a second integrated value by integrating the error signal corresponding to a combination of the second fixed code and the optimum code; and determines a magnitude relationship between the first integrated value and the second integrated value, and determines the single correction element selected as the test target as being faulty when the magnitude relationship fails to satisfy a predetermined condition.

Here, self-diagnostic circuit 105 may sequentially select a single correction element as a test target from the correction element group.

Here, the one or more correction elements may double as the one or more test elements.

Here, the quantizer may include one or more comparators, and the error detection circuit may generate the error signal by integrating, as the quantizer output signal, an output result of a single comparator among the one or more comparators or results of digitally calculating output results of two or more comparators among the one or more comparators using a predetermined weight.

Here, the correction element group may include a plurality of correction elements weighted, and the one or more test elements may each have a weight smaller than or equal to a smallest weight of a correction element included in the correction element group.

Here, the self-diagnostic code generation circuit may have: an optimum correction code output mode for outputting an optimum correction code in response to the error signal so that a quantization error of the quantizer becomes minimum; and a logic inversion code output mode for outputting a logic inversion code obtained by logically inverting a first bit signal for controlling a single correction element selected as a test target from the correction element group, the first bit signal being included in the optimum correction code, and at time of testing, the digital circuit may: enter the optimum correction code output mode, supply the optimum correction code to the analog circuit, and generate a first error signal, based on the error signal from the error detection circuit; enter the logic inversion code output mode, supply the logic inversion code to the analog circuit, and generate a second error signal, based on the error signal from the error detection circuit; and compare magnitudes of the first error signal and the second error signal, and perform a fault diagnosis on the single correction element selected as the test target.

Here, the analog circuit may include: a differential circuit; a first element group including one or more correction elements and one or more test elements connected to a positive-side input path of the differential circuit; and a second element group including one or more correction elements and one or more test elements connected to a negative-side input path of the differential circuit, the correction element group and the test element group may include the first element group and the second element group, the self-diagnostic code generation circuit may have a first set test mode for testing the first element group, and a second set test mode for testing the second element group, and the digital circuit may test the first element group and the second element group individually.

Here, the analog circuit may have a redundant configuration that includes: a first element group belonging to a single node and including the correction element group and the test element group; and a second element group having a same weight and a same configuration as the first element group, the self-diagnostic code generation circuit may have a first set test mode for testing the first element group, and a second set test mode for testing the second element group, and the digital circuit may test the first element group and the second element group individually.

Here, in the first set test mode, the self-diagnostic code generation circuit may: set, for the first element group, a first bit signal to 1 or 0, the first bit signal being for controlling the single correction element selected as the test target; cause a second correction bit signal group to have an inverted logical value of the first bit signal, the second correction bit signal being for controlling a correction element included in the correction element group and having an adjustment weight smaller than an adjustment weight of a first correction element included in the correction element group; cause a test bit signal to have the inverted logical value of the first bit signal, the test bit signal being for controlling the one or more test elements; output other bit signals as predetermined fixed signals; and output, to the second element group, the optimum correction code so that the quantization error of the quantizer becomes minimum, in the first set test mode, the digital circuit may: generate a first error signal, based on the error signal from the error detection circuit; cause, for a control code for the first element group, the first bit signal to have an inverted logical value of a bit signal at a first step; cause the second correction bit signal group to have the inverted logical value of the bit signal at the first step; cause the test bit signal to have the inverted logical value of the bit signal at the first step; output other bit signals as predetermined fixed signals; output the optimum correction code continuously to the second element group; generate a second error signal as an output of the error detection circuit; and determine magnitudes of the first error signal and the second error signal at a transition point of the quantizer at which the quantization error is minimum, to test whether a weight is smaller than or equal to a predetermined value, and in the second set test mode, the digital circuit may perform a process which is similar to a process in the first set test mode and in which the first element group and the second element group are interchanged in the first set test mode.

Here, the data converter may be an analog-to-digital converter.

Here, the analog-to-digital converter may include: one or more comparators each of which includes a differential circuit; and a correction element group and a test element group on each of a positive-side transmission path and a negative-side transmission path in the differential circuit so that one or more offsets of the one or more comparators are corrected, and the analog-to-digital converter may test, individually, (i) one or more correction elements included in the correction element group on the positive-side transmission path and (ii) one or more correction elements included in the correction element group on the negative-side transmission path, based on the test element group.

Embodiment 3

Hereinafter, a circuit configuration and an operation according to Embodiment 3 will be described with reference to the drawings. Testing and diagnosis of offset correction elements of a comparator will be described.

The following describes a configuration.

As with Embodiment 2, Embodiment 3 describes a configuration example in which a correction range of a correction element group that performs offset correction on a comparator is tested and diagnosed, focusing on the successive ADC (FIG. 2) as an example.

The configuration is the same as that of Embodiment 2, but differs from the configuration of Embodiment 2 only in digital circuitry.

An issue of Embodiment 3 is that although it is possible to confirm relative accuracy between adjacent correction elements by comparing weights between the adjacent correction elements (e.g., control codes (1000) and (0111)) with reference to a test element, when the test element itself is faulty, a range shrinks or is too broad.

In Embodiment 3, for example, when the test element determines that a correction element has passed testing and diagnosis beyond 1 LSB (determines the correction element as being normal), a range expands and a resolution is coarser than design assumption.

Moreover, when the test element determines that a correction element has passed testing and diagnosis within 1 LSB, a resolution is sufficiently fine, but a range is smaller than design assumption and is too narrow to correct the offset caused by a manufacturing variation.

Since the present disclosure is intended to test and diagnose a correction element, an analog circuit configuration is not limited. An analog circuit configuration will be described as one example using comparator 116 shown by FIG. 3.

In the present disclosure, the circuit diagram shown by FIG. 14 is used as a configuration of offset controller 132 of comparator 116 shown by FIG. 3.

Figure 23A:
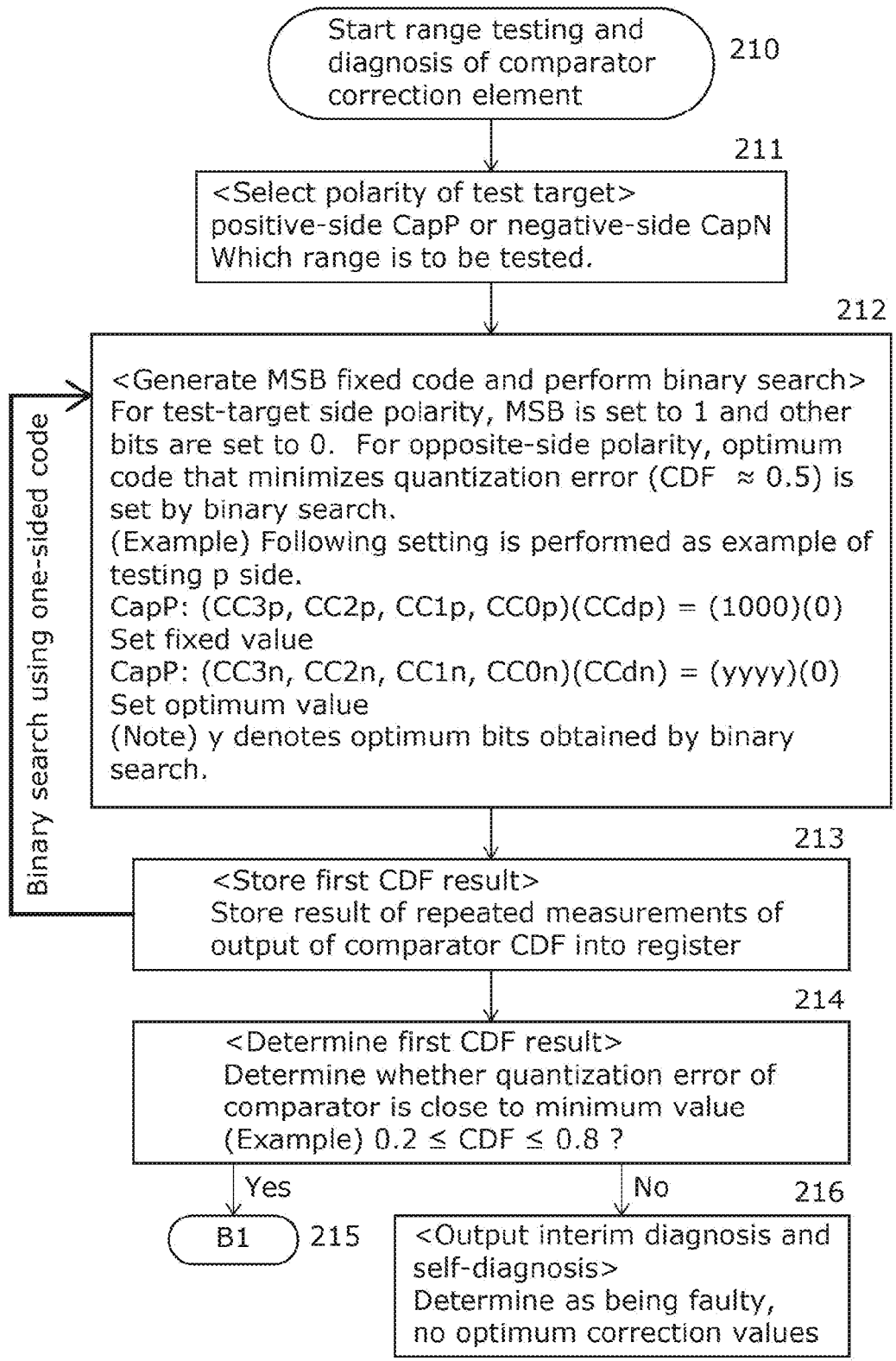
FIG. 23A is a diagram illustrating a procedure for testing and diagnosing a correction range of an offset correction element of a comparator according to Embodiment 3.
Figure 23B:
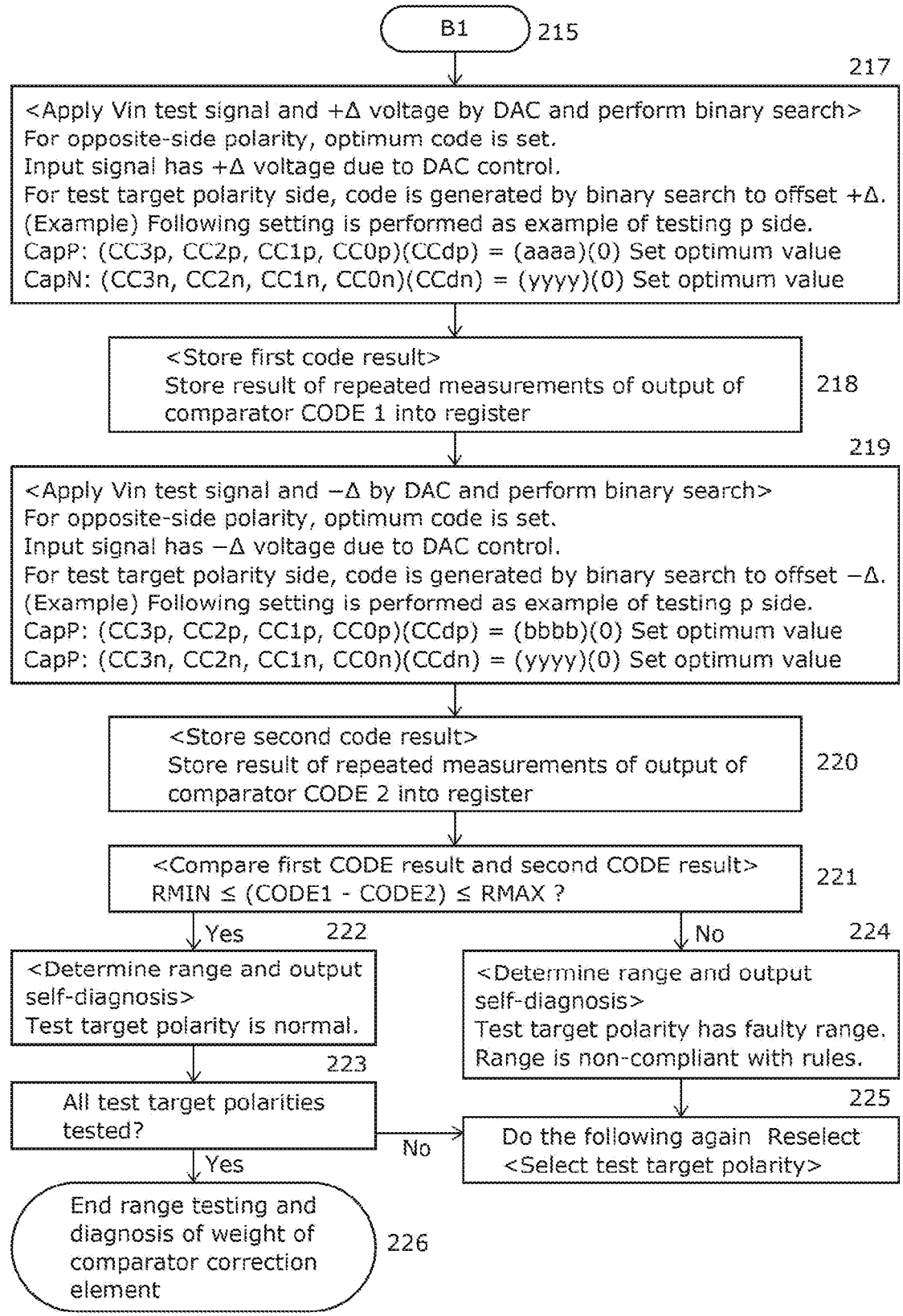
FIG. 23B is a continuation of FIG. 23A and is a diagram illustrating a procedure for testing and diagnosing the correction range of the offset correction element of the comparator.
Figure 24:
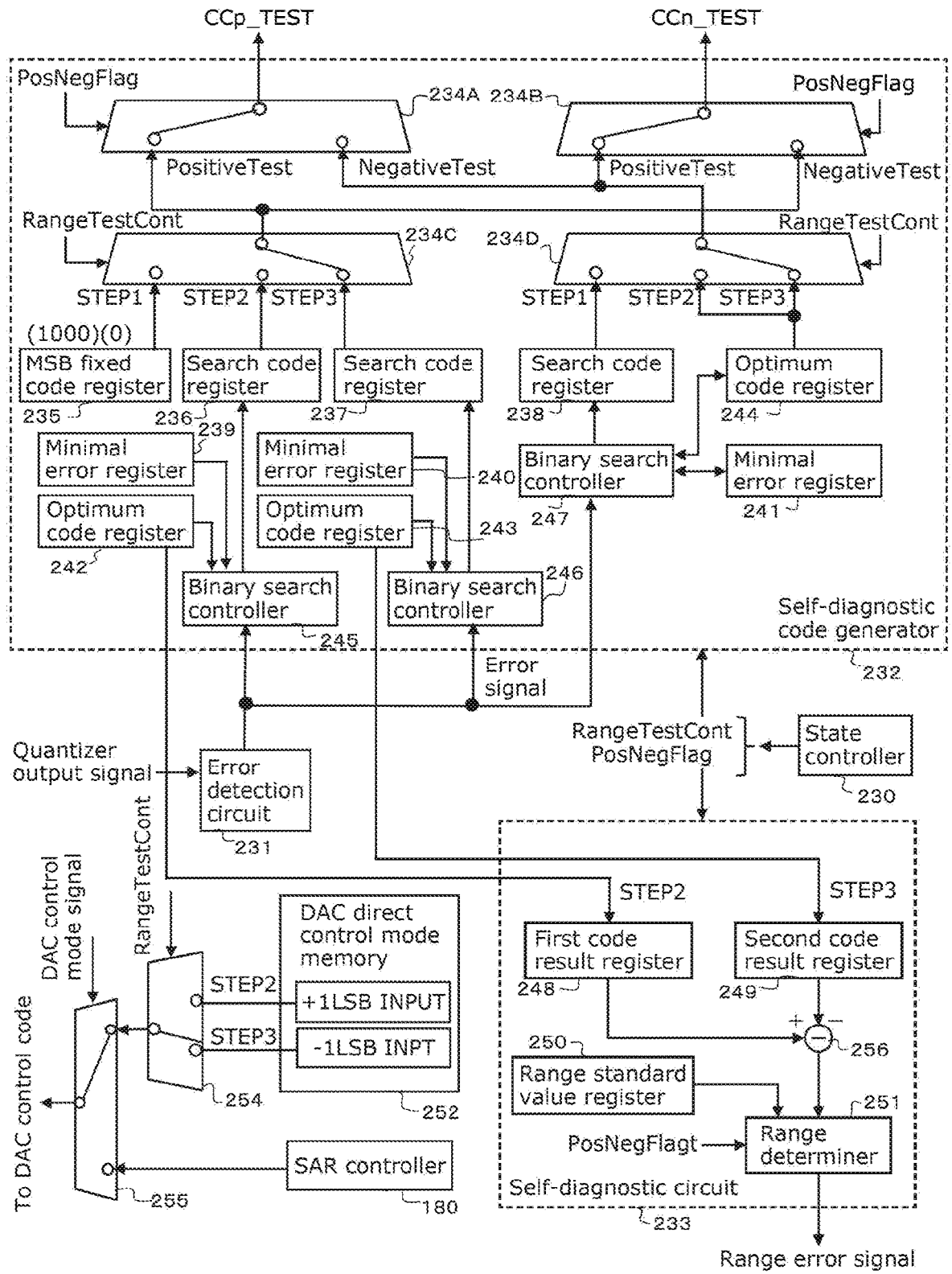
FIG. 24 is a diagram illustrating an example of testing and diagnostic digital circuitry for an offset correction element of a comparator according to Embodiment 3.
Figure 25:
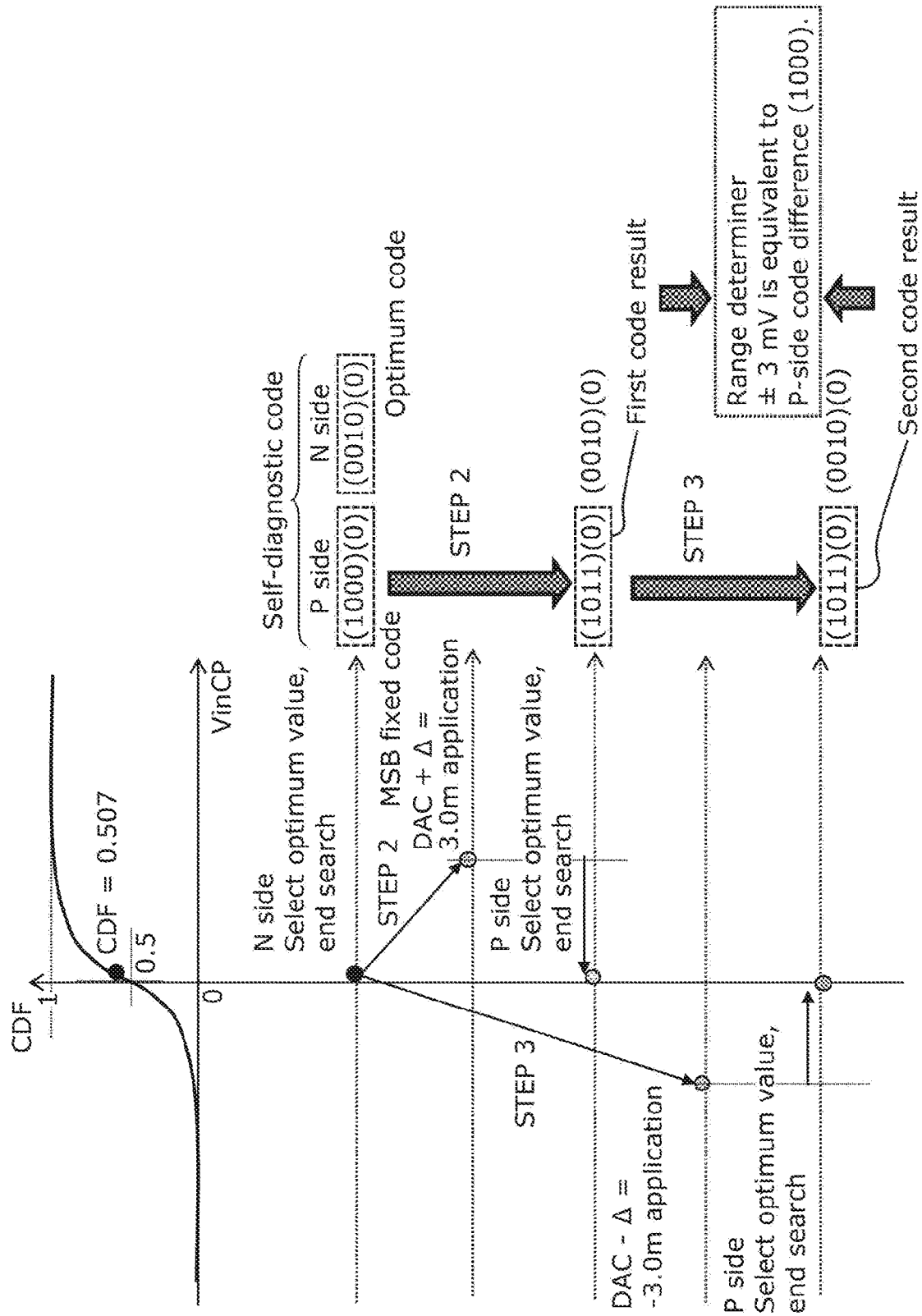
FIG. 25 is a schematic diagram illustrating range determination according to Embodiment 3.

The following describes a range test procedure according to the present disclosure, based on the flowcharts shown by FIG. 23A and FIG. 23B, with reference to the circuit configurations shown by FIG. 2 and FIG. 24, and using the schematic diagram shown by FIG. 25.

First, an outline is as follows: By (i) generating two types of voltages (±Δ) using an DAC in a successive approximation register ADC, (ii) causing a correction element in a comparator to correct the voltages, and (iii) storing two types of control codes into a register and comparing the two types of the control codes, it is possible to test and diagnose the absolute amount of correction, that is, to determine how many codes the two types of the control codes corresponding to the generated voltages are equivalent to.

Whether to test a P-side correction element or an N-side correction element is determined in step 211.

The present embodiment describes testing and diagnosis of a P-side range as one example.

The fixed code ((1000)(0), (mmmm)(n), m representing a bit signal of each correction element, n representing a bit signal for a test element) outputted from MSB fixed code register 235 is outputted as P-side correction element control code CCp_TEST via selectors 234C and 234A in steps 212 and 213.

In contrast, for N-side correction element control code CCn_TEST, binary search controller 247 that has received an error signal updates an output of search code register 238 so that a quantization error is minimized (a CDF is brought closer to 0.5), stores an optimum code into optimum code register 244, and stores the minimum value of the error signal into minimal error register 241.

As with Embodiment 2, steps 214, 215, and 216 are steps for determining whether a CDF is close to 0.5 and determining whether a resolution is normal or abnormal, and can be omitted. In FIG. 24, the corresponding part is omitted for simplicity.

For example, a control code for applying a voltage (+Δ) equivalent to +3.0 mV to comparator inputs (topPlateP, topPlateN) is selected from DAC direct control mode memory 252 and outputted via selectors 254 and 255 in steps 217 and 218.

A P-side control code is controlled using binary search controller 245 and search code register 236 so that this voltage is offset.

The P-side control code that minimizes the quantization error (brings a CDF close to 0.5) is held in optimum code register 242 and stored into first code result register 248.

At this time, for an N-side control code, an output of optimum code register 244 is outputted via selectors 234D and 235B.

For example, a control code for applying a voltage (−Δ) equivalent to −3.0 mV to comparator inputs (topPlateP, topPlateN) is selected from DAC direct control mode memory 252 and outputted via selectors 254 and 255 in steps 219 and 220.

The P-side control code is controlled using binary search controller 246 and search code register 237 so that this voltage is offset.

The P-side control code that minimizes the quantization error (brings a CDF close to 0.5) is held in optimum code register 243 and stored into second code result register 249.

At this time, for the N-side control code, an output of optimum code register 244 is outputted via selectors 234D and 235B.

In step 221, range determiner 251 calculates a control code difference between a first code result and a second code result, and determines whether the difference value is between minimum acceptable value RMIN and maximum acceptable value RMAX that are held in range standard value register 250.

When the range is determined as being normal, the procedure proceeds to steps 222 and 223.

When the range is determined as being abnormal, the procedure proceeds to step 224, and a range error signal is outputted as a self-diagnostic output signal.

FIG. 25 is a schematic diagram of the present embodiment.

When test voltage +Δ is applied, a P-side control code is ((1011)(0)).

On the other hand, when test voltage −Δ is applied, a P-side control code is ((0011)(0)).

At this time, a code difference is equivalent to (1000), and a range is determined as being normal.

In this example, by generating a voltage equivalent to half the MSB of a correction range using a DAC, calculating each of control codes equivalent to MSB±(MSB/2) by binary search, and determining a code difference between the control codes, it is possible to determine a correspondence between an applied voltage and the control codes. For this reason, it is possible to test and diagnose the absolute amount of the control codes.

Accordingly, a combination of the testing and diagnosis of the relative accuracy described in Embodiment 2 and the testing and diagnosis of the absolute value described in Embodiment 3 produces an advantageous effect of testing and diagnosing both the resolution and range of the correction element.

As stated above, in the semiconductor circuit according to Embodiment 3, the data converter includes an input switch that switches a signal to be inputted to the data converter between the measured signal and the reference signal, the self-diagnostic code generation circuit has an optimum correction code output mode for outputting an optimum correction code so that a quantization error of the quantizer becomes minimum, at time of testing, the digital circuit:

enters the optimum correction code output mode, selects a first reference signal using the input switch, and calculates the optimum correction code as a first optimum correction code; enters the optimum correction code output mode, selects a second reference signal using the input switch, and calculates the optimum correction code as a second optimum correction code; and calculates a difference between the first optimum correction code and the second optimum correction code, and performs a correction range diagnosis on the correction element group.

Embodiment 4

Hereinafter, a circuit configuration and an operation according to Embodiment 4 will be described with reference to the drawings.

Testing and diagnosis of an offset correction element of a comparator will be described.

The following describes a configuration.

As with Embodiments 2 and 3, Embodiment 4 describes a configuration example in which a function of a correction element group that performs offset correction on a comparator is tested and diagnosed, focusing on the successive ADC (FIG. 2) as an example. However, Embodiment 4 differs from Embodiments 2 and 3 only in digital circuitry.

The method of testing a weight of a correction element described in Embodiment 2 has an issue of time, that is, a need to increase the number of repeated measurements for noise removal in order to confirm the accuracy of the correction element.

In response, Embodiment 4 provides a method of removing a clear initial fault in a much simpler manner.

Since the present disclosure is intended to test and diagnose a correction element, an analog circuit configuration is not limited. An analog circuit configuration will be described as one example using comparator 116 shown by FIG. 3.

In the present disclosure, the circuit diagram shown by FIG. 14 is used as a configuration of offset controller 132 of comparator 116 shown by FIG. 3.

Figure 26:
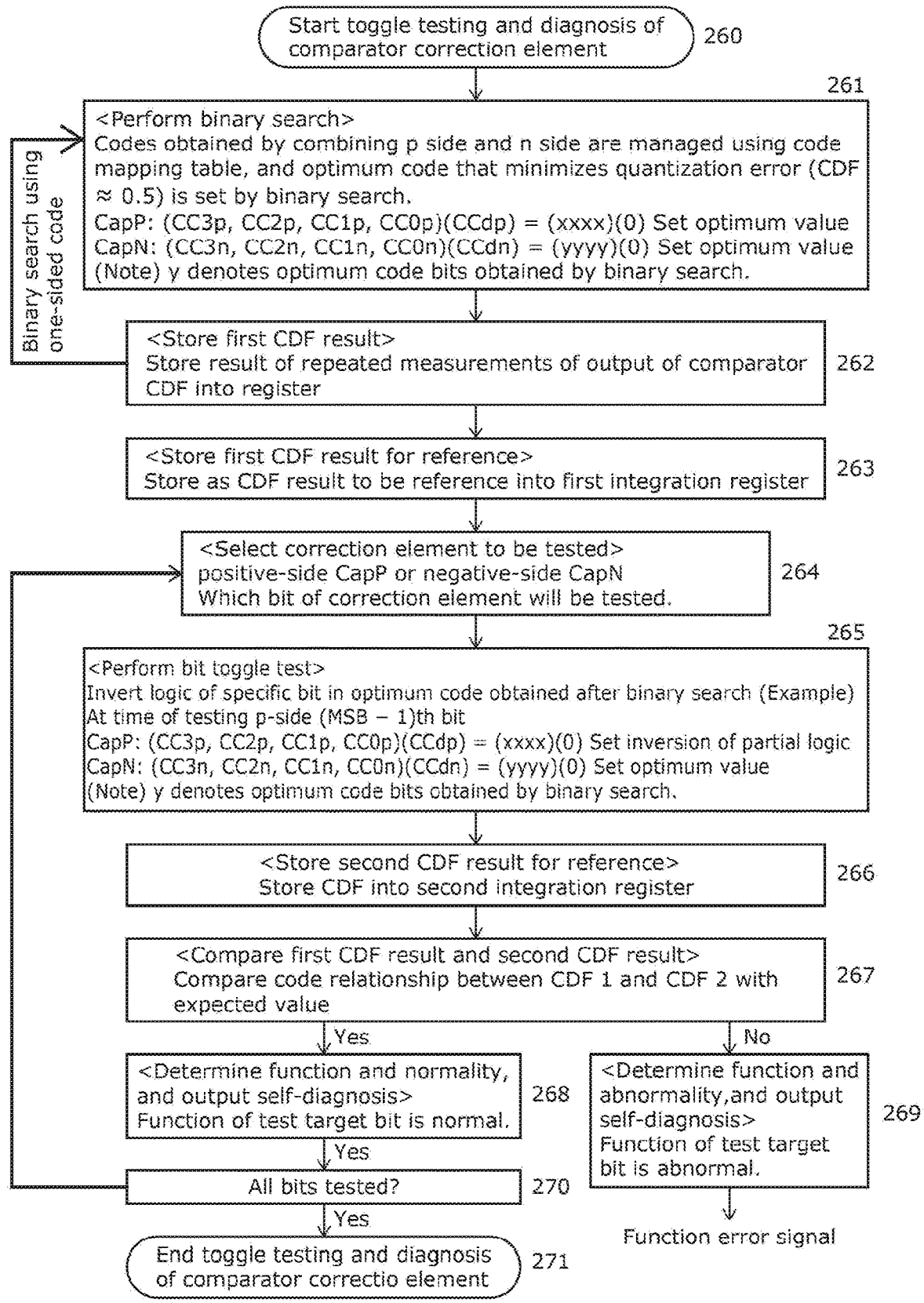
FIG. 26 is a diagram illustrating a procedure for testing and diagnosing a correction function of an offset correction element of a comparator according to Embodiment 4.
Figure 27:
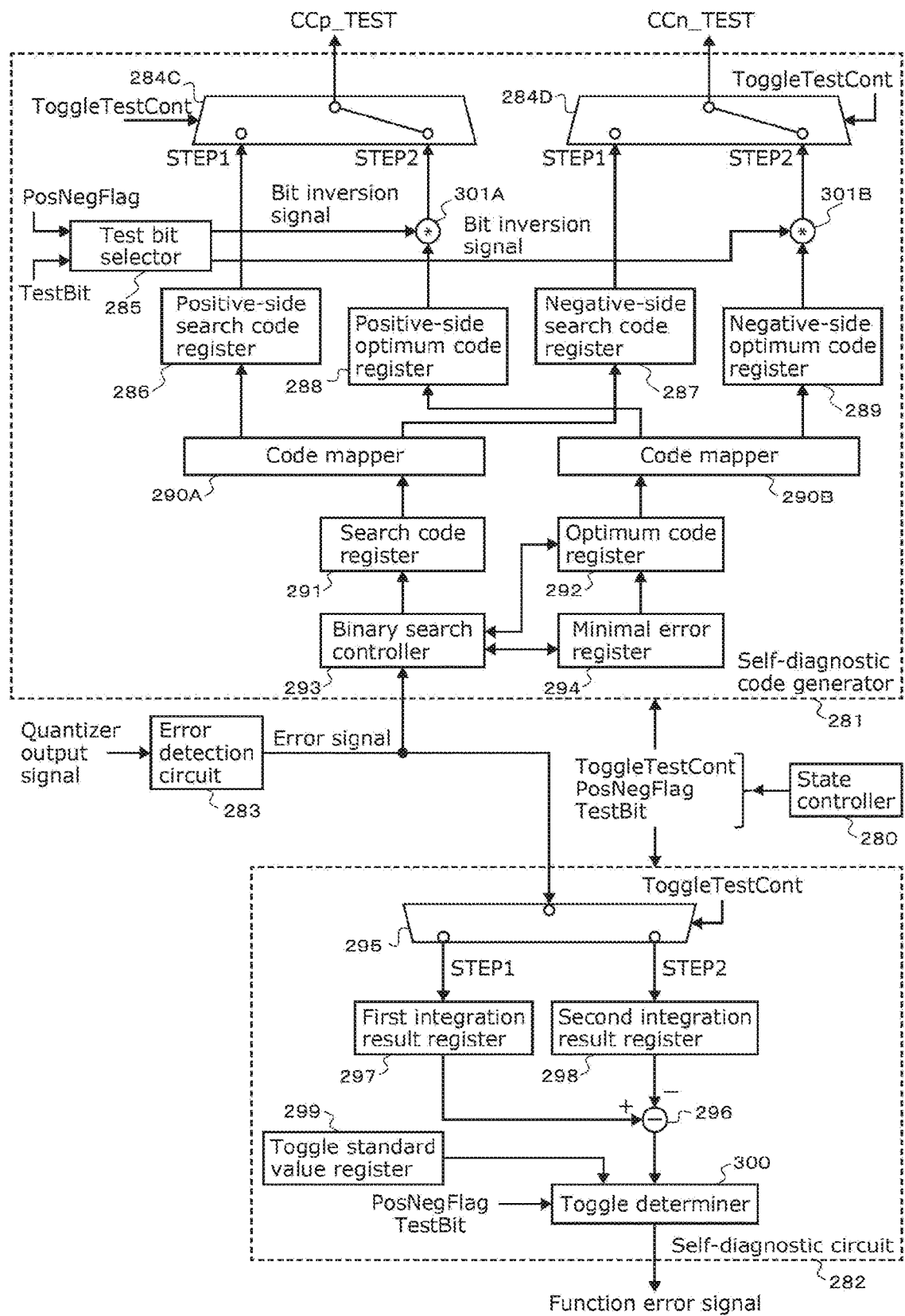
FIG. 27 is a diagram illustrating an example of testing and diagnostic digital circuitry for an offset correction element of a comparator according to Embodiment 4.
Figure 28:
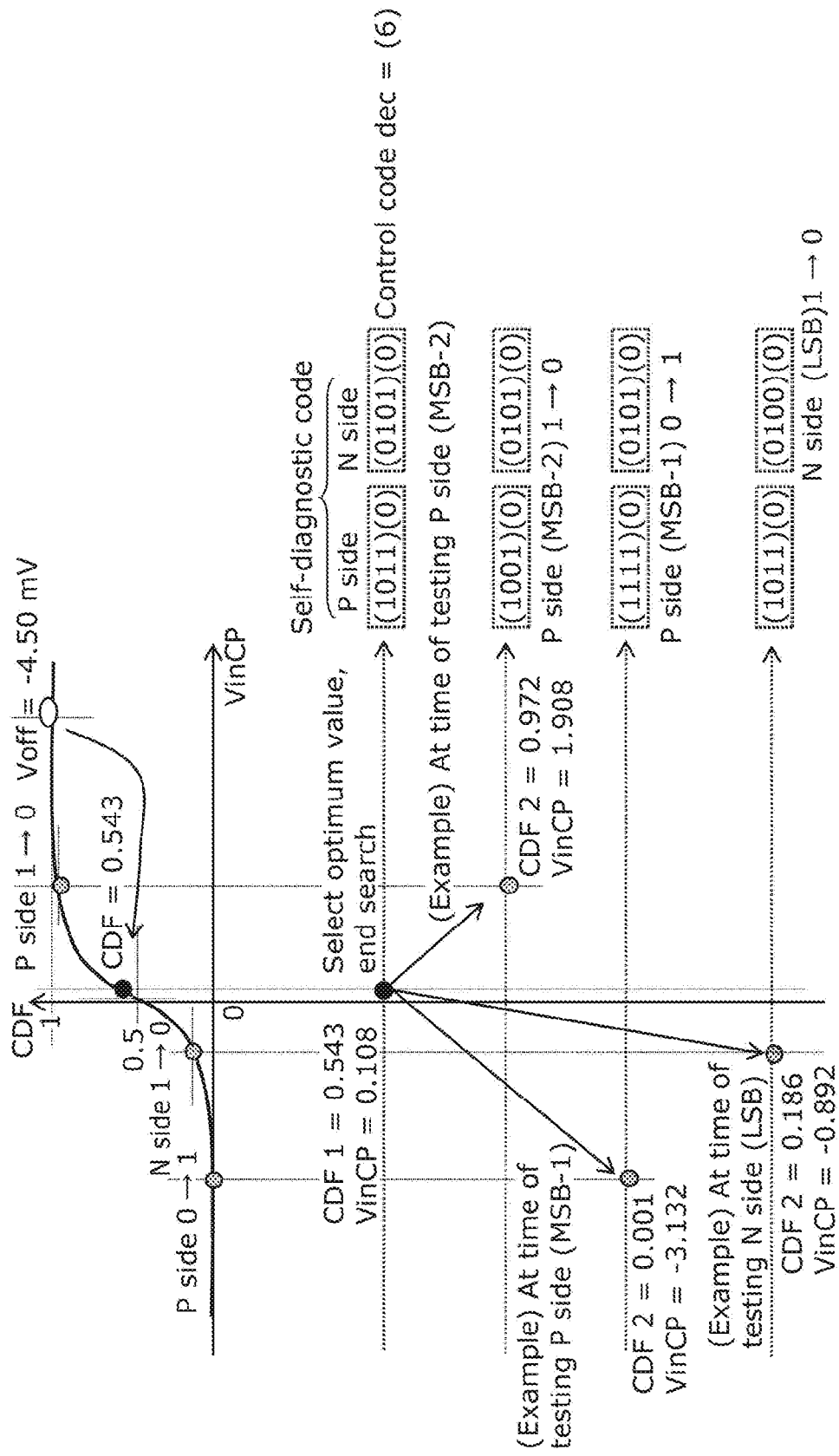
FIG. 28 is a schematic diagram illustrating a toggle test according to Embodiment 4.

The following describes a function test procedure according to the present disclosure, based on the flowchart shown by FIG. 26, with reference to the circuit configurations shown by FIG. 2 and FIG. 27, and using the schematic diagram shown by FIG. 28.

First, an outline is as follows: It is possible to detect a fault of a driver circuit in an analog circuit or a fault of a device (e.g., no reaction, failure of offset correction on an intended code) because, when a comparator determination point is brought close to the vicinity of the minimum quantization error with which an internal state can be estimated (a CDF is close to 0.5), by binary search, and each bit of a control code (a correction code) at the time is inverted, the CDF is displaced from 0.5 by a certain amount but a sign direction in which the displacement occurs is already known. (FIG. 28 shows a schematic diagram.)

In steps 261, 262, and 263, selectors 284C and 284D and demultiplexer 295 are switched to STEP 1.

In the present embodiment, a code mapping table obtained by combining a P side and an N side is used.

The mapping table shown by FIG. 10 is used as an example.

Since the P side has 4 bits and the N side has 4 bits, management is possible using a control signal equivalent to 5 bits.

Code mappers (290A, 290B) that convert the signal equivalent to 5 bits into positive and negative signals equivalent to 4 bits are included.

Binary search controller 293 that has received an error signal, search code register 291, code mappers 290A and 290B, and positive-side search code register 286 and negative-side search code register 287 that hold positive and negative search codes, respectively, perform binary search and hold a binary search result, and determine a control code in order to correct manufacturing variation Voff. (Since this step is the same as a correction execution block in a correction code generator, it is possible to share a functional block.)

Moreover, the error signal is stored as a first CDF result (CDF 1) into first integration result register 297.

Which bit (ranging from the MSB to the LSB and a test element) of which polarity (P side, N side) is to be tested and diagnosed is selected in step 264.

Test bit selector 285 outputs the selected bit to be tested as a bit inversion signal to bit inverters 301A and 301B.

In steps 265 and 266, selectors 284C and 285B and demultiplexer 295 are switched to STEP 2, and a CDF is measured in a state in which the bit to be tested is inverted.

At this time, an output from optimum code register 292 that holds the optimum code obtained by binary search is supplied to positive-side optimum code register 288 and negative-side optimum code register 289 via code mapper 290B, and is supplied to a control code of comparator 116 via selectors 284C and 284D.

The CDF result is stored as a second CDF result (CDF 2) into second integration result register 298 via demultiplexer 295.

A self-diagnosis is performed in steps 267, 268, and 269.

An output of first integration result register 297 and an output of second integration result register 298 are outputted to subtractor 296, and a subtraction result is supplied to toggle determiner 300.

Upon receiving an output of toggle standard value register 299, toggle determiner 300 determines whether a sign relationship between CDF 1 and CEF 2 is in an ideal direction.

The following describes a sign relationship between CDF 1 and CDF 2 in a supplementary manner.

In the present embodiment, since Vin is 0, Vcalp and Vcalm each represent the amount of correction, and Voff represents a manufacturing offset, substantial comparator input VinCP becomes (−Voff−Vcalp+Vcalm).

Here, Valp and Vcalm have an "inverse sign relationship" as an effect.

To put it another way, since changing one bit among P-side correction bits from 0 to 1 decreases VinCP, CDF 2 should be decreased by a certain amount (should go below 0.5); and since changing the one bit from 1 to 0 increases VinCP, CDF 2 should be increased by a certain amount (should go above 0.5).

In contrast, since changing one bit among N-side correction bits from 0 to 1 increases VinCP, CDF 2 should be increased by a certain amount (should go above 0.5); and since changing the one bit from 1 to 0 decreases VinCP, CDF 2 should be decreased by a certain amount (should go below 0.5).

As is clear from the above, abnormality can be determined by inputting, to toggle determiner 300, information (Pos-NegFlag) indicating which of the polarities of comparator 116 has been tested.

By (i) setting a toggle standard value by providing an offset having a predetermined amount (a threshold value) to 0.5 in an expected sign direction and (ii) observing a change in CDF 2, it is possible to determine whether a driver circuit that drives a correction capacitor or a correction capacitor element is normally functioning.

In the present embodiment, since two values spaced apart by a predetermined amount are compared and determined, it is possible to decrease the number of repeated measurements, not the accuracy determination as described in Embodiment 2, and performing the test in the first place leads to a reduction of testing time.

Figure 29:
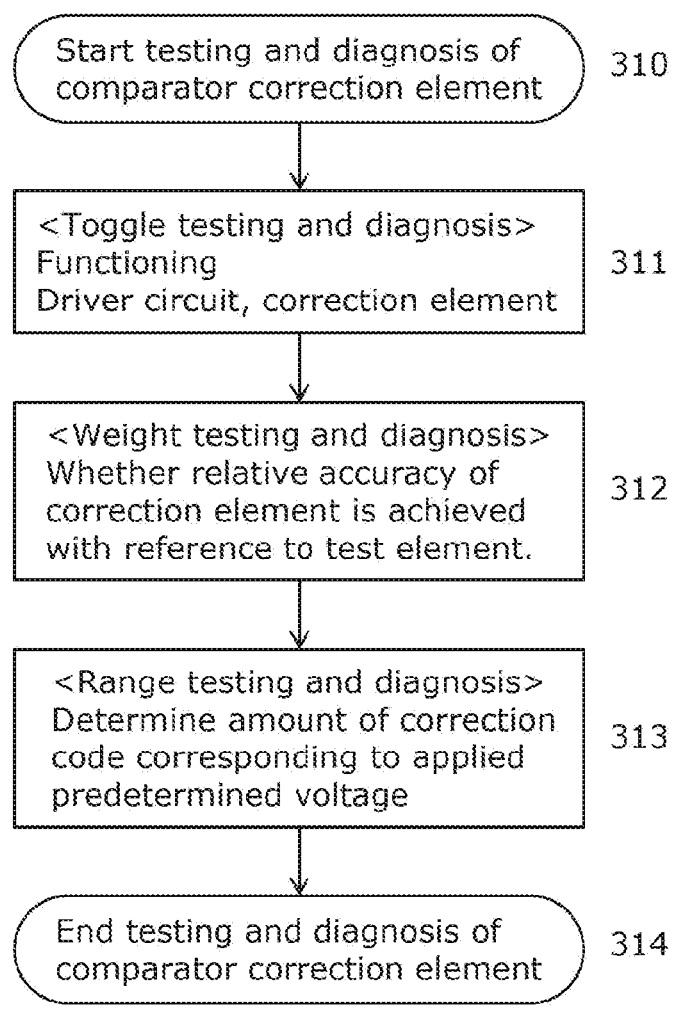
FIG. 29 is a diagram illustrating an example of a testing and diagnostic sequence according to Embodiment 4.

FIG. 29 shows an example of a testing and diagnostic sequence.

The toggle testing and diagnosis (FIG. 26, FIG. 27) described in Embodiment 4 is performed in step 311.

It is possible to reduce measurement time compared to weight testing, and an element determined as being faulty in step 311 can be removed as a faulty part.

Step 312 (FIG. 15A and FIG. 15B, FIG. 16) is the testing of a weight of each correction element described in Embodiment 2, and step 313 (FIG. 23A and FIG. 23B, FIG. 24) is the testing of a correction range described in Embodiment 4.

These series of testing make it possible to ensure both the function and accuracy of each correction element.

As stated above, in the semiconductor circuit according to Embodiment 4, the self-diagnostic code generation circuit has: an optimum correction code output mode for outputting an optimum correction code in response to the error signal so that a quantization error of the quantizer becomes minimum; and a logic inversion code output mode for outputting a logic inversion code obtained by logically inverting a first bit signal for controlling a single correction element selected as a test target from the correction element group, the first bit signal being included in the optimum correction code, and at time of testing, the digital circuit: enters the optimum correction code output mode, supplies the optimum correction code to the analog circuit, and generates a first error signal, based on the error signal from the error detection circuit; enters the logic inversion code output mode, supplies the logic inversion code to the analog circuit, and generates a second error signal, based on the error signal from the error detection circuit; and compares magnitudes of the first error signal and the second error signal, and performs a fault diagnosis on the single correction element selected as the test target.

Embodiment 5

Hereinafter, a circuit configuration and an operation according to Embodiment 5 will be described with reference to the drawings.

Testing and diagnosis of a gain correction element of a residue amplifier will be described.

Embodiment 5 describes a configuration example in which a gain correction element of a residue amplifier is tested and diagnosed, focusing on pipelined ADC 320 as an example.

The following describes a configuration.

Figure 30:
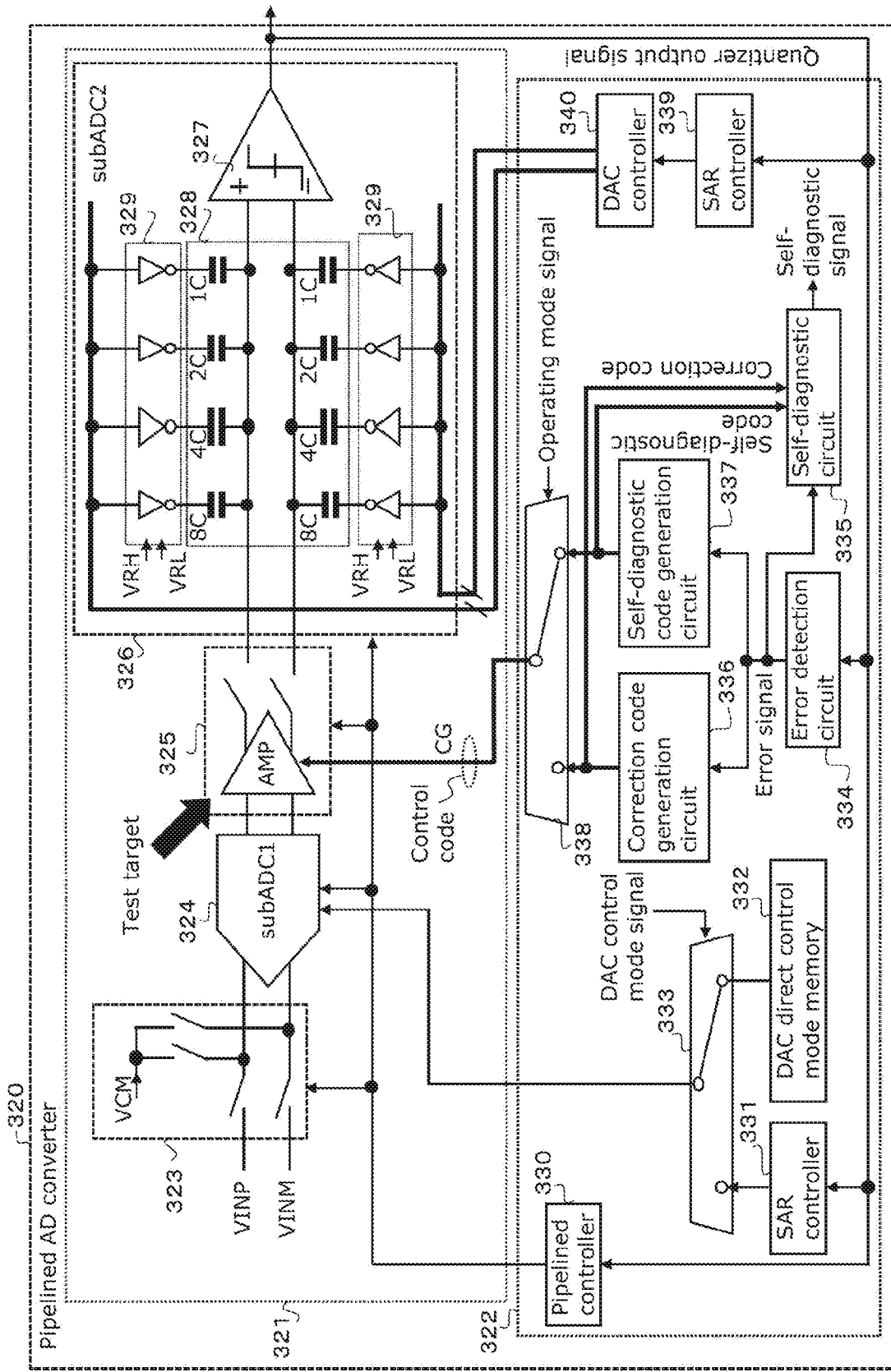
FIG. 30 is a block diagram illustrating a correction mechanism of a residue amplifier according to Embodiment 5.

In FIG. 30, analog circuitry includes sample and hold circuit 323, first sub ADC 324, residue amplifier 325, and second sub ADC 326.

Sample and hold circuit 323 samples differential signals (VINP, VINM) at the time of a normal operation, and samples midpoint reference voltage VCM (equivalent to a zero differential signal) at the time of performing correction or testing and diagnosis.

First sub ADC 324 includes, as an example, a successive approximation register ADC as shown by FIG. 2. First sub ADC 324 quantizes the sampled voltages (VINP, VINM) and holds a residual voltage at the time of a normal operation, and controls an internal DAC voltage relative to the zero differential signal according to the code held in DAC direct control mode memory 332, causes a predetermined voltage to be generated, and holds the predetermined voltage as a residue, at the time of performing correction or testing and diagnosis.

Residue amplifier 325 amplifies the residual voltage held by first sub ADC 324 at a predetermined magnification after completion of AD conversion by first sub ADC 324.

Second sub ADC 326 includes, as an example, a successive approximation register ADC, and quantizes the voltage obtained based on a residue amplifier output.

Although a pipelined ADC requires an amplifier having high power consumption in order to ensure scale factor (gain) accuracy of a residue amplifier, the pipelined ADC includes an open-loop integrating amplifier as described in NPL 3 due to the advancement of a reduction of voltage and a correction technique, leading to a further reduction of power consumption.

It should be noted that the open-loop integrating amplifier has a large gain variation due to a manufacturing variation but has low power consumption.

For this reason, the correction technique using a digital circuit is applied to the gain variation of the residue amplifier, and both the reduction of power consumption and the accuracy improvement are achieved.

Representative examples of the correction technique include the method of estimating a gain by dither described in NPL 1.

A predetermined random voltage is added to the residual voltage by directly controlling the DAC in first sub ADC 324, and a voltage equivalent to the predetermined random voltage is subtracted from the voltage amplified by the residue amplifier using the DAC in second sub ADC 326.

Through this operation, a gain error remains in the residual voltage held in second sub ADC 326, information about the gain error mixed in a conversion result of second sub ADC 326 is processed, and the gain error of the residue amplifier is estimated and corrected.

Figure 31:
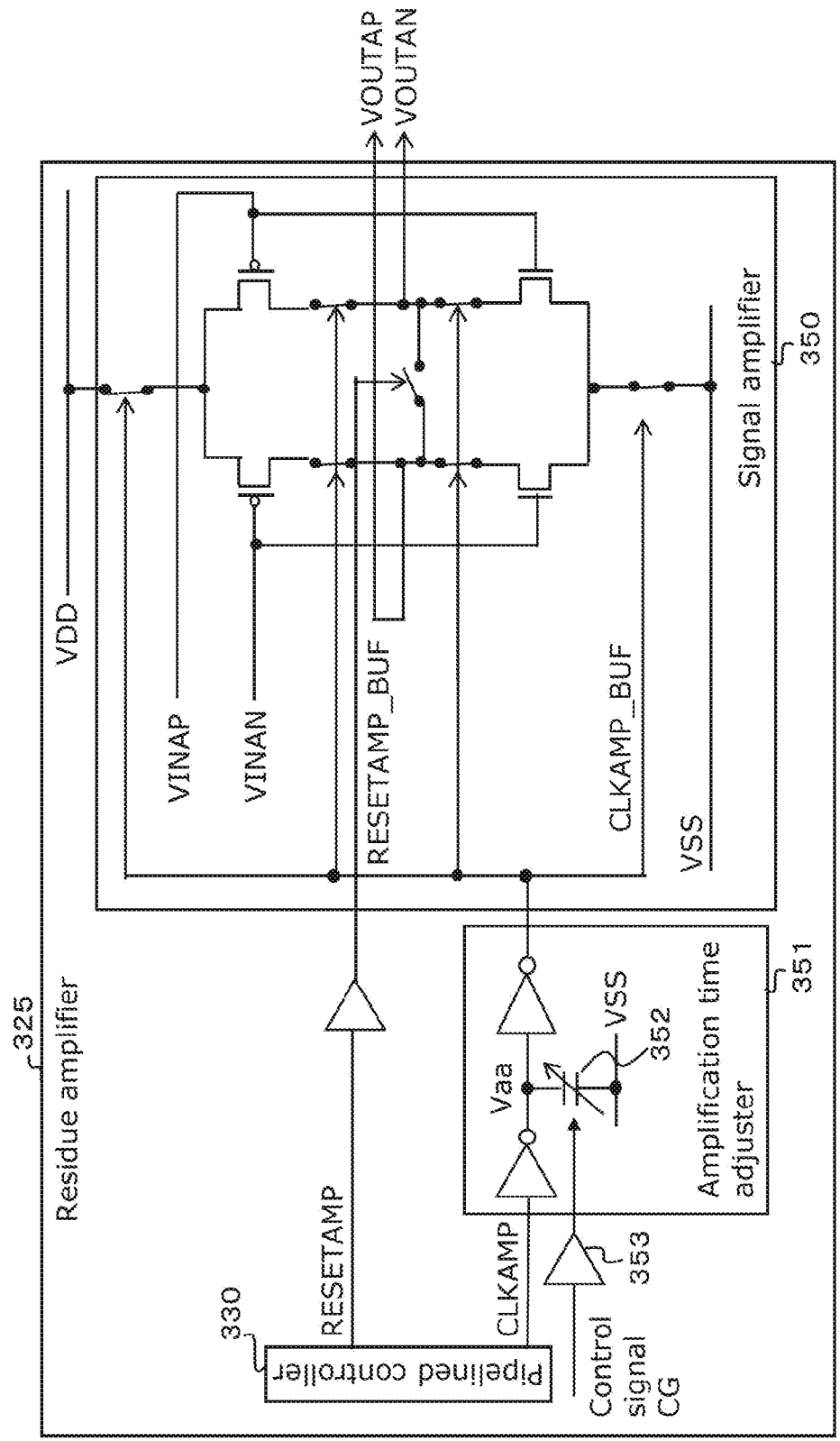
FIG. 31 is a circuit diagram illustrating an example of a residue amplifier having a gain correction function according to Embodiment 5.

FIG. 31 is a circuit diagram illustrating an example of residue amplifier 325 having a gain correction function.

Residue amplifier 325 includes signal amplifier 350 and amplification time adjuster 351.

When residue amplifier 325 is an open-loop integrating amplifier, residue amplifier 325 is capable of increasing a gain with an increase in amplification time. For this reason, residue amplifier 325 adjusts a gain by adjusting amplification time.

Figure 32:
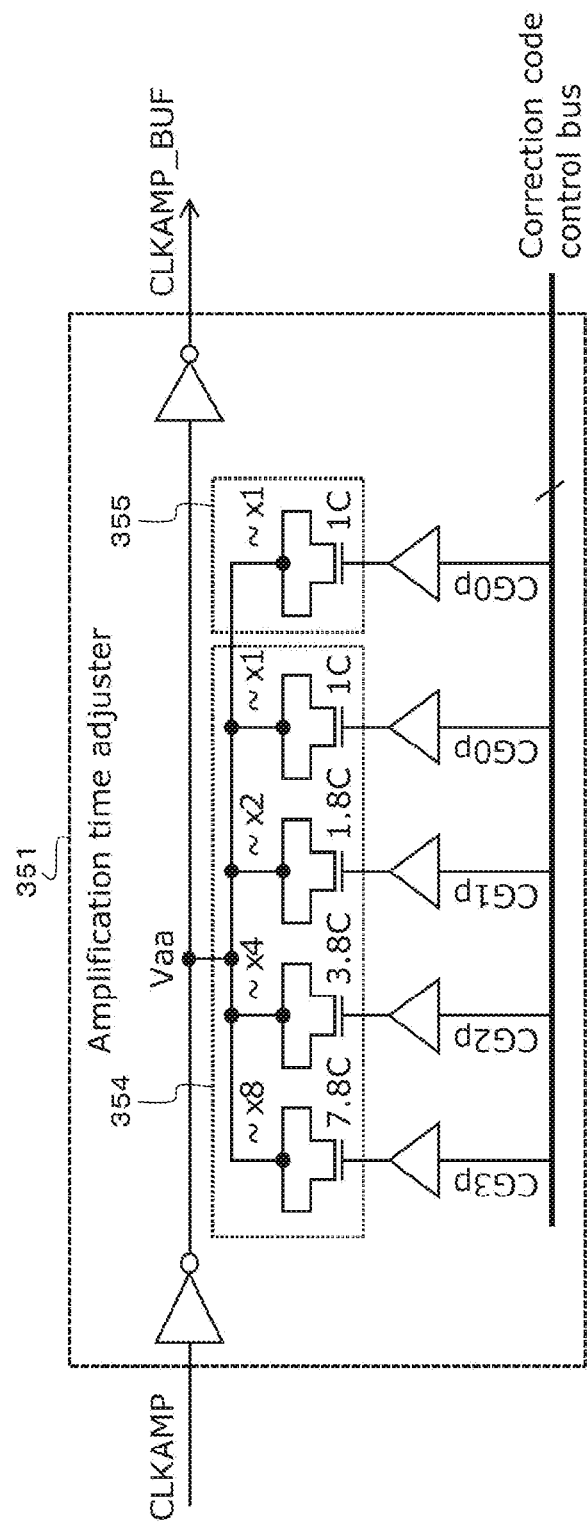
FIG. 32 is a circuit diagram illustrating an example of an amplification time adjuster according to Embodiment 5.

FIG. 32 shows an example of amplification time adjuster 351 used in the present disclosure.

Amplification time adjuster 351 includes correction element group 354 and test element group 355.

Correction element group 354 includes an MOS capacitive element having a weight of at most 2 ($\leq 2$), and test element group 355 includes, as an example, an MOS capacitive element having the same weight as the LSB of correction element group 354.

In the present disclosure, a size of test element group 355 is not limited to the above-described size, and the same advantageous effect can be produced if the size is less than or equal to 1 LSB of correction element group 354.

Correction element group 354 is controlled by a control code (CG3$p$, CG2$p$, CG1$p$, CG0$p$), and test element group 355 is controlled by a control code (CGd$p$).

Hereinafter, when a bit signal of a control code is "1," a capacitive element is enabled and a gain increases; and when a bit signal of a control code is "0," a capacitive element is disabled and a gain decreases.

(CG3$p$, CG2$p$, CG1$p$, CG0$p$)(CGd$p$) is described as (xxxx)(y) according to a method of describing a control code.

The following describes an operation.

A weight of each correction element of correction element group 354 is tested and diagnosed using the same procedure as the testing of a weight of a correction element of a comparator shown by FIG. 15A and FIG. 15B.

To put it another way, a sampling voltage is set to VCM, and as an example of MSB correction element testing, in the first step, self-diagnostic code generation circuit 336 sets (CG3$p$, CG2$p$, CG1$p$, CG0$p$)(CGd$p$) as (1, 0, 0, 0)(0), obtains AD conversion results (quantizer output results of bits) of second sub ADC 326 using the same gain error measuring method as the above-described dither method, and integrates the AD conversion results to obtain a first integration result.

Moreover, in the second step, self-diagnostic code generation circuit 336 sets (CG3$p$, CG2$p$, CG1$p$, CG0$p$)(CGd$p$) as (0, 1, 1, 1)(1), obtains AD conversion results of second sub ADC 326 using the same gain error measuring method as the above-described dither method, and integrates the AD conversion results to obtain a second integration result.

The first integration result and the second integration result are compared, a weight error of a gain correction element is measured, and self-diagnostic circuit 105 performs determination.

For a bit less significant than or as significant as the MSB, a weight can be tested and diagnosed using the same method.

Here, it should be noted that since testing and diagnosis is not close to optimum gain setting (gain setting by which first sub ADC 324 and second sub ADC 326 are connected with linearity maintained), a CDF of the comparator at the subsequent stage is not limited to be close to 0.5, and AD conversion is required for testing and diagnostic error measuring.

In other words, the residual voltage in which the gain error is mixed may be greater than 1 LSB of second sub ADC 326, and AD conversion (quantization) using comparators is required to measure a weight.

Testing and diagnosis is performed in the testing of a weight of a gain correction element of an amplifier according to the present embodiment, based on an integration result of quantizer output results of second sub ADC 326, whereas only one quantizer output result (the circuit of the comparator itself to be corrected) is used for the testing of a weight of an offset correction element of a comparator.

It is possible to test and diagnose a gain correction element of a residue amplifier using the same procedure as FIG. 15A and FIG. 15B, by replacing, when a gain error of the residue amplifier is measured, the steps for measuring the weight of the comparator (step 153 in FIG. 15A and step 157 in FIG. 15B) with storing an integration value of AD conversion results (quantizer output results) of second sub ADC 326 into a register.

As stated above, the advantageous effect of testing and diagnosing a weight of each gain correction element is produced by including the test element in addition to the gain correction element of the residue amplifier, causing self-diagnostic code generation circuit 336 to generate a testing and diagnostic input code, and using an integration value of AD conversion results of the sub ADC at the subsequent stage of the pipeline.

As stated above, in the semiconductor circuit according to Embodiment 5, the self-diagnostic code generation circuit has a first weight test code output mode and a second weight test code output mode, in the first weight test code output mode, the self-diagnostic code generation circuit: sets a first bit signal to 1 or 0, the first bit signal being for controlling a first correction element selected as a test target from the correction element group; causes a second correction bit signal group to have an inverted logical value of the first bit signal, the second correction bit signal group being for controlling a correction element having an adjustment weight smaller than an adjustment weight of the first correction element; causes a test bit signal to have the inverted logical value of the first bit signal, the test bit signal being for controlling the one or more test elements; and outputs one or more other bit signals as one or more predetermined fixed signals, in the second weight test code output mode, the self-diagnostic code generation circuit: causes the first bit signal to have an inverted logical value when the first weight test code output mode is set; causes the second correction bit signal group to have the inverted logical value of the first bit signal; causes the test bit signal to have the inverted logical value of the first bit signal; and outputs one or more other bit signals as one or more predetermined fixed signals, and at time of testing, the digital circuit: enters the first weight test code output mode and generates a first error signal, based on the error signal from the error detection circuit; enters the second weight test code output mode and generates a second error signal, based on the error signal from the error detection circuit; and calculates a difference between the first error signal and the second error signal, and performs a weighted diagnosis on the correction element group.

Embodiment 6

Hereinafter, a circuit configuration and an operation according to Embodiment 6 will be described with reference to the drawings.

Testing and diagnosis of a gain correction element of a residue amplifier will be described.

The following describes a configuration.

Figure 33:
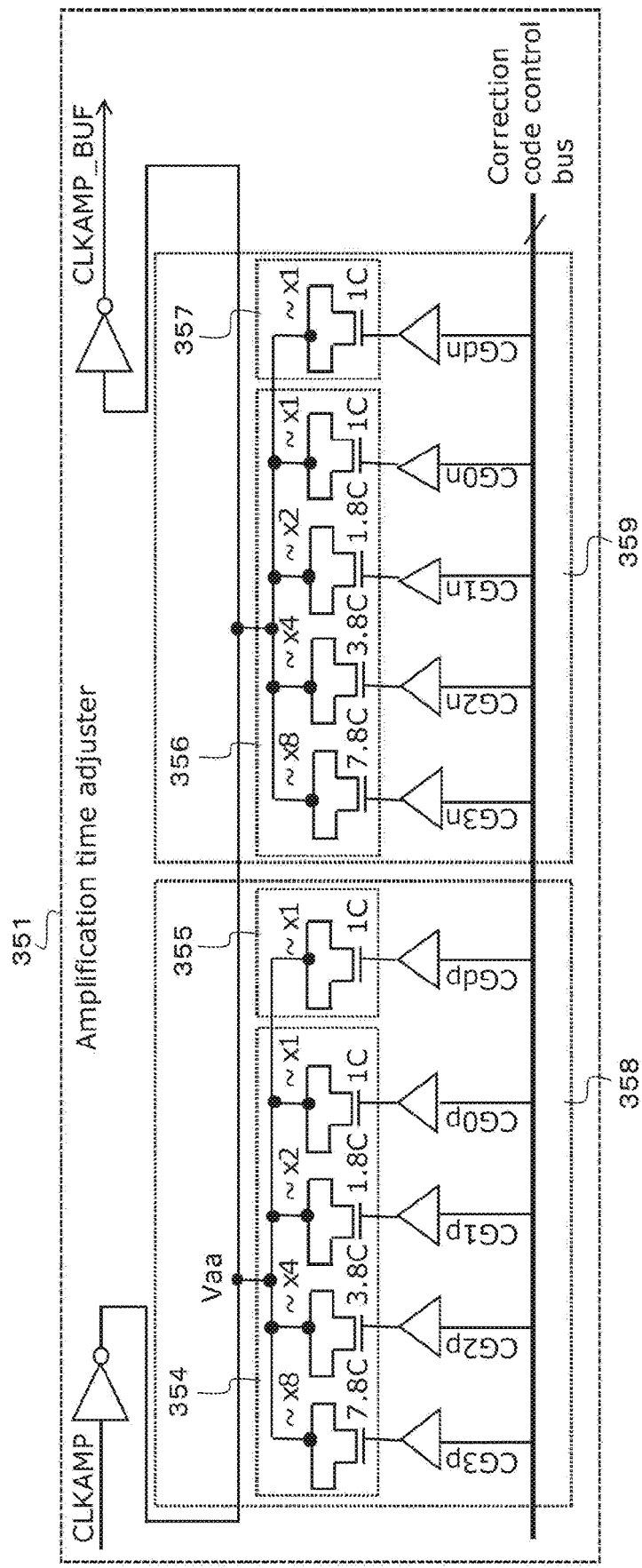
FIG. 33 is a circuit diagram illustrating an example of an amplification time adjuster according to Embodiment 6.

The block diagram (FIG. 30) of Embodiment 5 and the configuration of the residue amplifier (FIG. 31) are used as a circuit configuration, and the amplification time adjuster shown by FIG. 33 is used as an amplification time adjuster.

Amplification time adjuster 351 includes first set element group 358 and second set element group 359. First set element group 358 and second set element group 359 include correction element groups (354, 356) and test element groups (355, 357), respectively.

First set element group 358 is controlled by a control code (CG3$p$, CG2$p$, CG1$p$, CG0$p$)(CGd$p$), and second set element group 359 is controlled by a control code (CG3$n$, CG2$n$, CG1$n$, CG0$n$)(CGd$n$).

The following describes an operation.

A weight of each correction element of a correction element group is tested and diagnosed using the same procedure as the testing of a weight of a correction element of a comparator shown by FIG. 15A and FIG. 15B.

Since there are first set element group 358 and second set element group 359 in the present embodiment, testing and diagnosis can be performed based on optimum gain setting.

For example, when the MSB of first set element group 358 is tested, in the first step, the control code (CG3$p$, CG2$p$, CG1$p$, CG0$p$)(CGd$p$) is set as (1, 0, 0, 0)(0), and the control code (CG3$n$, CG2$n$, CG1$n$, CG0$n$)(CGd$n$) is set as code (y, y, y, y)(0) obtained by searching for an optimum value (optimum gain setting) by binary search.

In the second step, the control code (CG3p, CG2p, CG1p, CG0p)(CGdp) is set as (1, 0, 0, 0)(0), the control code (CG3n, CG2n, CG1n, CG0n)(CGdn) is set as code (y, y, y, y)(0), and initial quantizer output results of second sub ADC 326 are integrated to obtain a first integration result.

In the third step, the control code (CG3p, CG2p, CG1p, CG0p)(CGdp) is set as (0, 1, 1, 1)(1), the control code (CG3n, CG2n, CG1n, CG0n)(CGdn) is set as code (y, y, y, y)(0), and initial quantizer output results of second sub ADC 326 are integrated to obtain a second integration result.

It is possible to test a weight of a correction element of an amplifier gain element by comparing the first integration result and the second integration result.

Since Embodiment 6 makes it possible to perform a weighted measurement close to optimum gain setting, compared to Embodiment 5, one quantizer output to be used (a process for one bit) is sufficient, making it possible to downsize a test and diagnosis circuit.

As stated above, in the semiconductor circuit according to Embodiment 6, the self-diagnostic code generation circuit has a first weight test code output mode and a second weight test code output mode, in the first weight test code output mode, the self-diagnostic code generation circuit: sets a first bit signal to 1 or 0, the first bit signal being for controlling a first correction element selected as a test target from the correction element group; causes a second correction bit signal group to have an inverted logical value of the first bit signal, the second correction bit signal group being for controlling a correction element having an adjustment weight smaller than an adjustment weight of the first correction element; causes a test bit signal to have the inverted logical value of the first bit signal, the test bit signal being for controlling the one or more test elements; and outputs one or more other bit signals as one or more predetermined fixed signals, in the second weight test code output mode, the self-diagnostic code generation circuit: causes the first bit signal to have an inverted logical value when the first weight test code output mode is set; causes the second correction bit signal group to have the inverted logical value of the first bit signal; causes the test bit signal to have the inverted logical value of the first bit signal; and outputs one or more other bit signals as one or more predetermined fixed signals, and at time of testing, the digital circuit: enters the first weight test code output mode and generates a first error signal, based on the error signal from the error detection circuit; enters the second weight test code output mode and generates a second error signal, based on the error signal from the error detection circuit; and calculates a difference between the first error signal and the second error signal, and performs a weighted diagnosis on the correction element group.

Here, the analog circuit may include: a differential circuit; a first element group including one or more correction elements and one or more test elements connected to a positive-side input path of the differential circuit; and a second element group including one or more correction elements and one or more test elements connected to a negative-side input path of the differential circuit, the correction element group and the test element group may include the first element group and the second element group, the self-diagnostic code generation circuit may have a first set test mode for testing the first element group, and a second set test mode for testing the second element group, and the digital circuit may test the first element group and the second element group individually.

Embodiment 7

Hereinafter, a circuit configuration and an operation according to Embodiment 7 will be described with reference to the drawings.

Testing and diagnosis of an offset correction element of a residue amplifier will be described.

Figure 34:
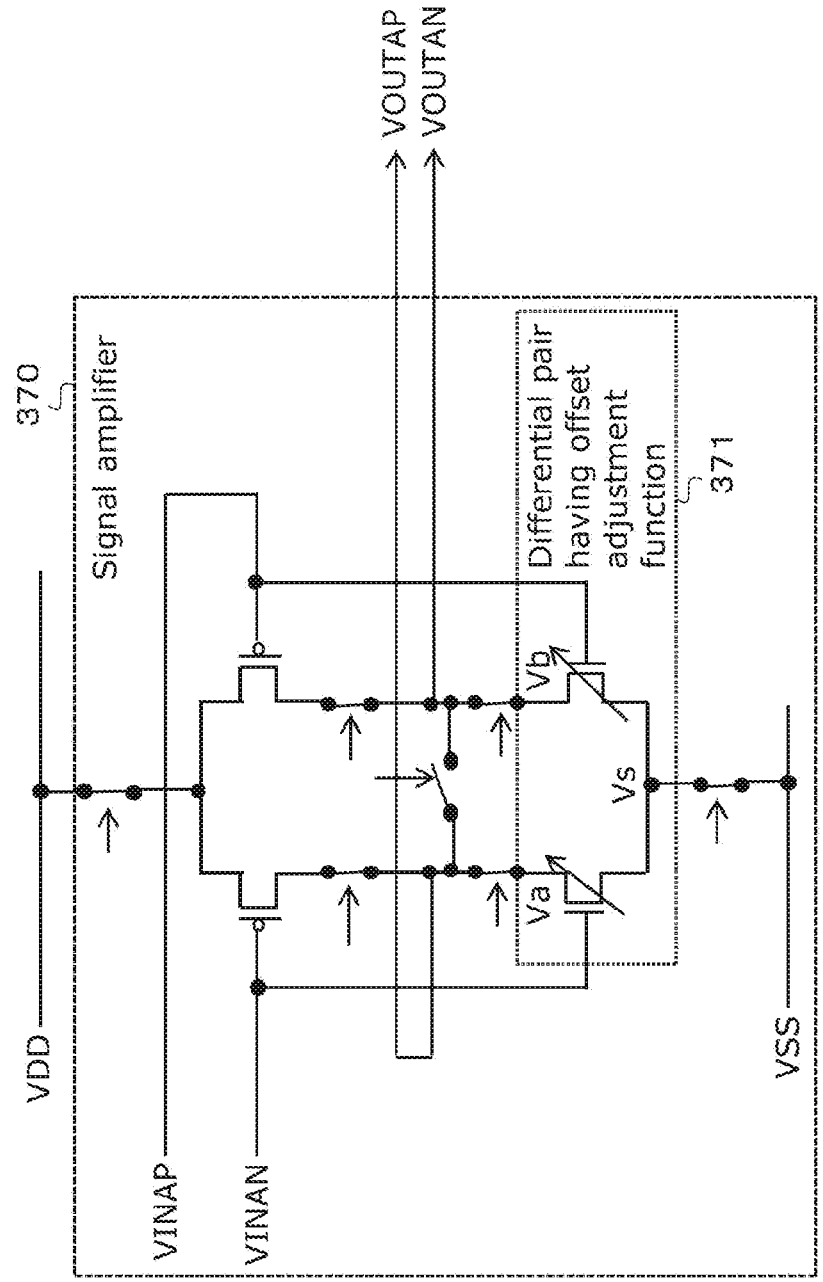
FIG. 34 is a circuit diagram illustrating a signal amplifier of a residue amplifier according to Embodiment 7.
Figure 35:
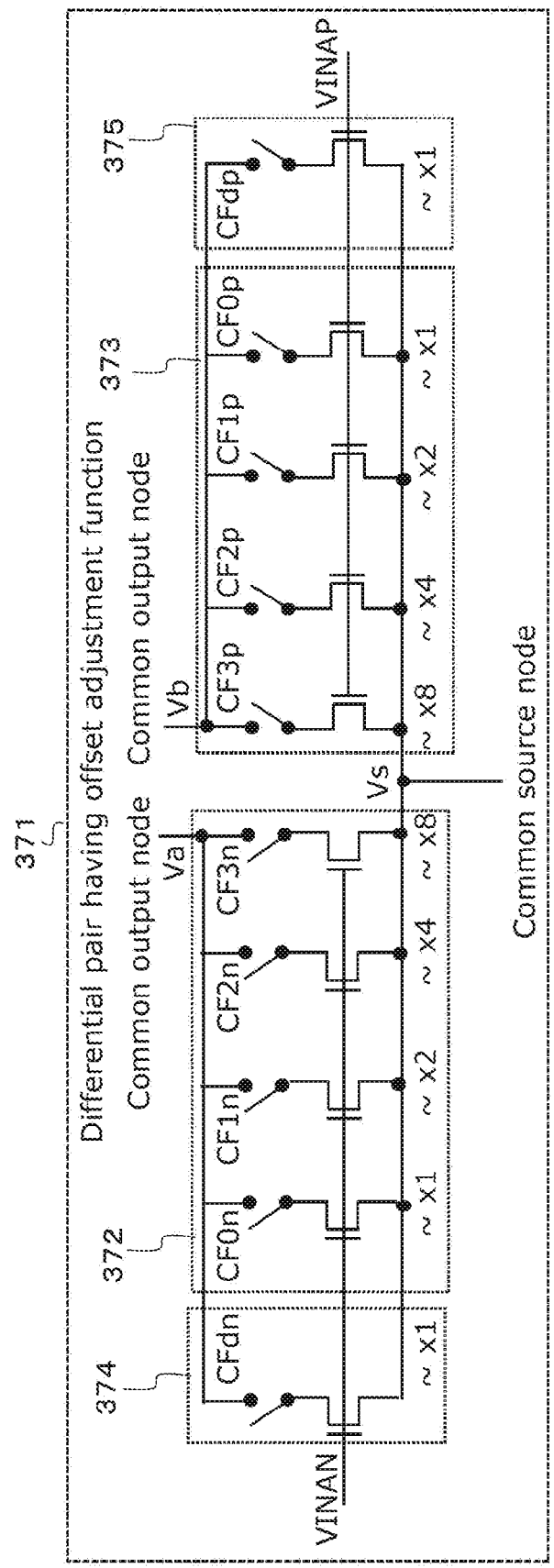
FIG. 35 is a circuit diagram illustrating an offset controller of the residue amplifier according to Embodiment 7.

The block diagram (FIG. 30), the signal amplifier shown by FIG. 34 obtained by modifying the signal amplifier in the configuration of the residue amplifier (FIG. 31), and the offset controller of the residue amplifier shown by FIG. 35, are used as a circuit configuration.

In the signal amplifier shown by FIG. 34, variable control is performed on an NMOS transistor in order for offset correction to be performed.

In other words, the signal amplifier includes differential pair 371 having an offset adjustment function.

The offset controller shown by FIG. 35 selects switches for test element groups 374 and 375 and correction element groups 372 and 373 according to a driver signal not shown.

Correction control is performed on an offset by balance adjustment of positive and negative sizes of differential pair 371. Since this circuit includes test element groups 374 and 375, it is possible to test and diagnose a weight of each correction element using the same procedure as Embodiment 2 and an integration value of conversion results of second sub ADC 326.

Aside from a method of changing an MOS balance of differential pair 371 shown by FIG. 34 and FIG. 35 to adjust an offset, an offset may be adjusted by adding a variable capacitance to an output of differential pair 371 shown by FIG. 34, or an MOS back gate may be adjusted. Even when any of the offset adjusting methods is employed, the test and diagnosis circuit according to the present embodiment is capable of testing a weight of a correction element.

As stated above, in the semiconductor circuit according to Embodiment 7, the analog-to-digital converter is a pipelined analog-to-digital converter and includes a residue amplifier and one or more comparators, the residue amplifier is an open-loop integrating amplifier, and the analog-to-digital converter includes, as a circuit configuration for adjusting an offset of the residue amplifier by a balance between positive and negative, a correction element group on each of a positive side and a negative side of an output in the differential circuit, and tests the correction element group using an integration result of each of the one or more comparators.

Embodiment 8

Hereinafter, a circuit configuration and an operation according to Embodiment 8 will be described with reference to the drawings.

Testing and diagnosis of a correction element of a DAC capacitor for correcting linearity of a DAC will be described.

Figure 36:
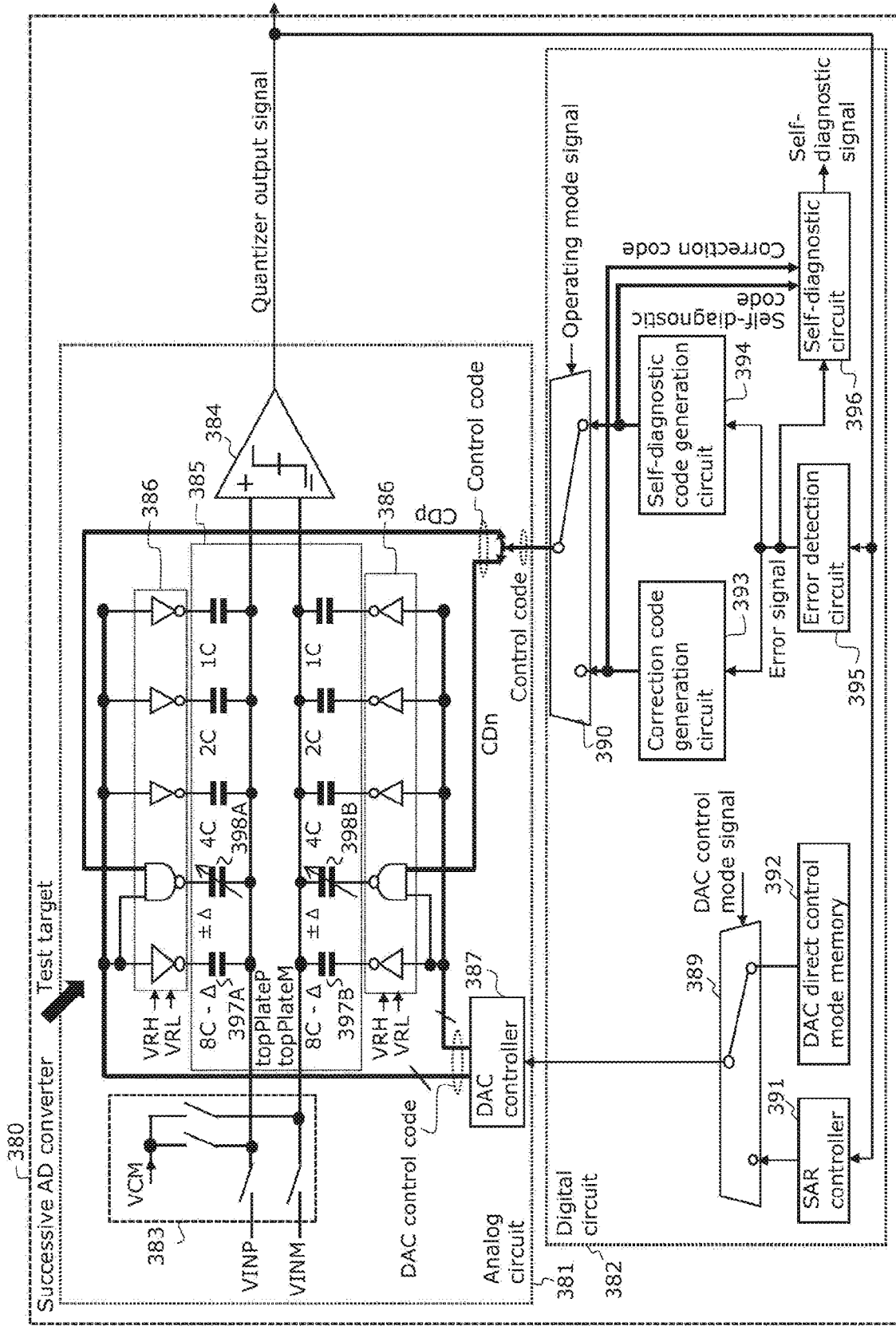
FIG. 36 is a block diagram illustrating a correction mechanism of an MSB capacitor of a DAC according to Embodiment 8.
Figure 37:
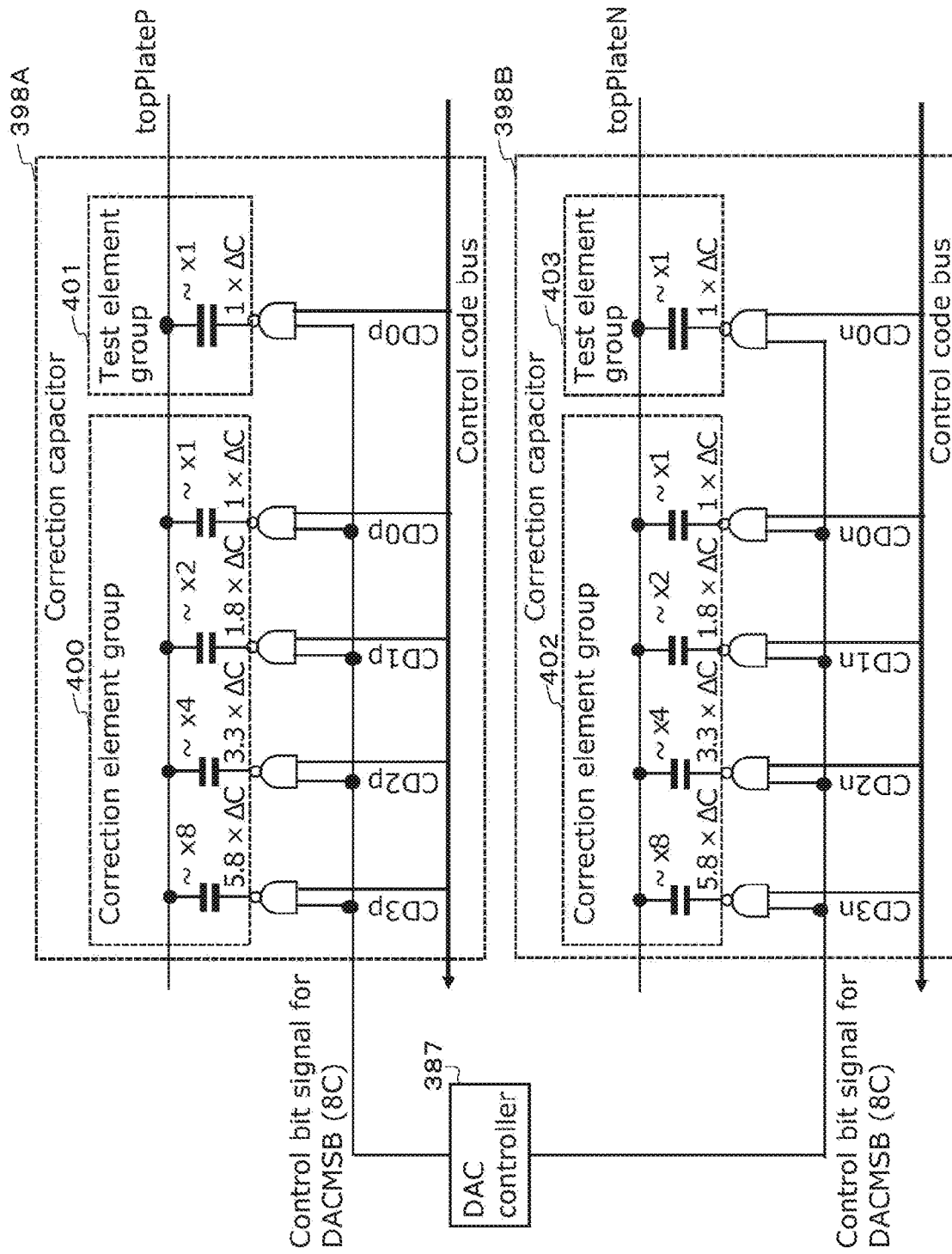
FIG. 37 is a circuit diagram illustrating an example of a capacitor corrector according to Embodiment 8.

The block diagram shown by FIG. 36 is used as a circuit configuration, and the circuitry shown by FIG. 37 is used as a corrector.

The analog circuit block configuration is the same as that of Embodiment 2, except for a DAC portion.

The DAC includes MSB capacitors (397A, 397B) to which a value (8C-A) obtained by subtracting A from a capacitance value as an expected value is set, and correction capacitors (398A, 398B) that perform switching in conjunction with the MSB capacitors.

The correction capacitors (398A, 398B) have the configurations shown by FIG. 37 and are simultaneously switched in a normal DAC operation by taking NAND logic between a signal supplied from DAC controller 387 and control codes (CD3p, CD2p, CD1p, CD0p)(CDdp) and (CD3n, CD2n, CD1n, CD0n)(CDdn).

When more correction capacitors (398A, 398B) are selected, the number of seeming MSB capacitors increases, a step voltage of the MSB rises, and it is possible to adjust the linearity.

This correction method is also applicable to a bit of the DAC less significant or as significant as the MSB.

The testing and diagnosis of a weight can be performed in the same manner as the testing and diagnosis of a weight of a comparator according to Embodiment 2 and the method of testing and diagnosing a weight of an amplifier gain according to Embodiment 5.

Specifically, when the MSB of a P-side correction element is tested, it is possible to test and diagnose a relative weight between correction elements with reference to a test element by setting (CD3p, CD2p, CD1p, CD0p)(CDdp) as (1, 0, 0, 0)(0); obtaining a first integration result in which (CD3n, CD2n, CD1n, CD0n)(CDdn) is an optimum value (a transition point at which a quantization error of a comparator is minimum) determined by binary search; setting (CD3p, CD2p, CD1p, CD0p)(CDdp) as (0, 1, 1, 1)(1); obtaining a second integration result in which (CD3n, CD2n, CD1n, CD0n)(CDdn) is an optimum value; and comparing the first integration result and the second integration result.

As stated above, in the semiconductor circuit according to Embodiment 8, the analog-to-digital converter is a successive approximation register analog-to-digital converter and includes: an internal digital-to-analog converter having a differential circuit configuration in which capacitors (M capacitors) are provided on each of a positive-side transmission path and a negative-side transmission path; and one or more comparators, and the analog-to-digital converter includes: a correction element group that corrects linearity for each of N (N<M) capacitors among M capacitors; and a test element group, and tests, for each of the correction element group on the positive side and the correction element group on the negative side, one or more correction elements for the internal digital-to-analog converter using an integration result of each of the one or more comparators.

Embodiment 9

Hereinafter, a circuit configuration and an operation according to Embodiment 9 will be described with reference to the drawings.

Testing and diagnosis of a DAC gain correction element for correcting an ADC gain will be described.

Figure 38:
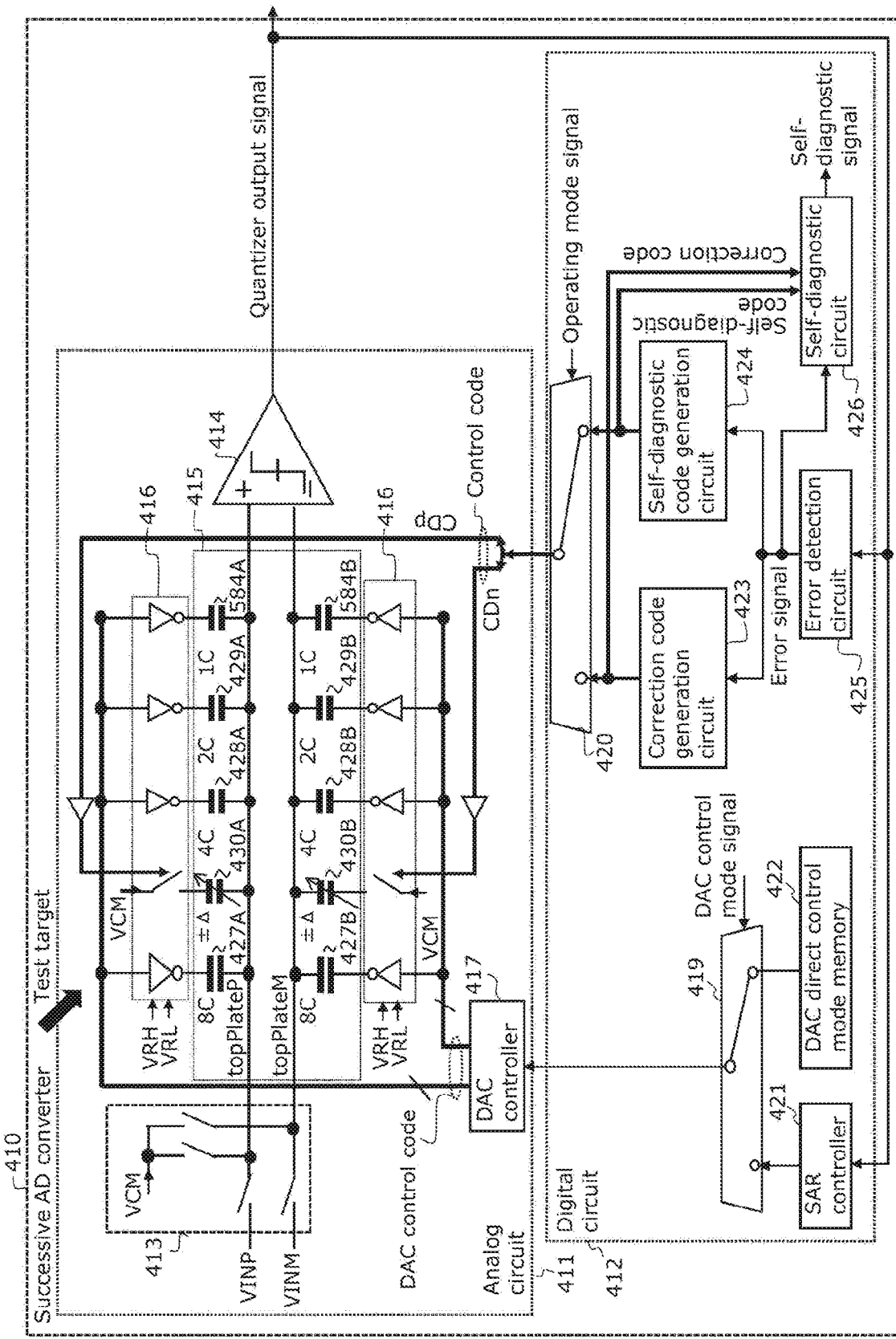
FIG. 38 is a block diagram illustrating an ADC gain correction mechanism according to Embodiment 9.

The block diagram shown by FIG. 38 is used as a circuit configuration, and the circuitry shown by FIG. 39 is used as a corrector.

The analog circuit block configuration is the same as that of Embodiment 2, except for a DAC portion.

A DAC includes correction capacitors (430A, 430B) for adjusting a DAC gain, relative to a binary capacitor array (427A, 428A, 429A, 4278, 4288, 4298).

The correction capacitors (430A, 430B) have the configurations shown by FIG. 39 and are controlled by a signal supplied from DAC controller 417 and control codes (CE3p, CE2p, CE1p, CE0p)(CEdp) and (CE3n, CE2n, CE1n, CE0n) (CEdn).

In a normal DAC operation, since the correction capacitors are constantly connected to a VCM potential, an output voltage of the DAC decreases with an increase in the number of correction capacitors connected, and eventually an ADC gain increases.

The testing and diagnosis of a weight can be performed in the same manner as the testing and diagnosis of a weight of a comparator according to Embodiment 2 and the method of testing and diagnosing a weight of an amplifier gain according to Embodiment 5.

As stated above, in the semiconductor circuit according to Embodiment 9, the analog-to-digital converter is a successive approximation register analog-to-digital converter and includes: an internal digital-to-analog converter having a differential circuit configuration in which capacitors (M capacitors) are provided on each of a positive-side transmission path and a negative-side transmission path; and one or more comparators, the correction element group is used for performing, for each of N (N<M) capacitors among M capacitors, gain correction, and the analog-to-digital converter tests, for each of the positive-side transmission path and the negative-side transmission path, one or more correction elements for the internal digital-to-analog converter using an integration result of each of the one or more comparators.

Embodiment 10

Hereinafter, a circuit configuration and an operation according to Embodiment 10 will be described with reference to the drawings.

Testing and diagnosis of a correction element for delay control in a time-to-digital converter (TDC) will be described.

The present disclosure describes not only testing and diagnosis of a correction element of an ADC that compares an analog signal and a predetermined voltage and performs quantization on the analog signal but also testing and diagnosis of a correction element of a TDC that compares an input clock and a reference clock and performs time quantization on the input clock.

An example in which the TDC described in PTL 6 is modified is shown as a circuit configuration.

Basic operations and functions are the same as those described in PTL 6, except for a functional block that performs test and diagnosis.

Figure 40:
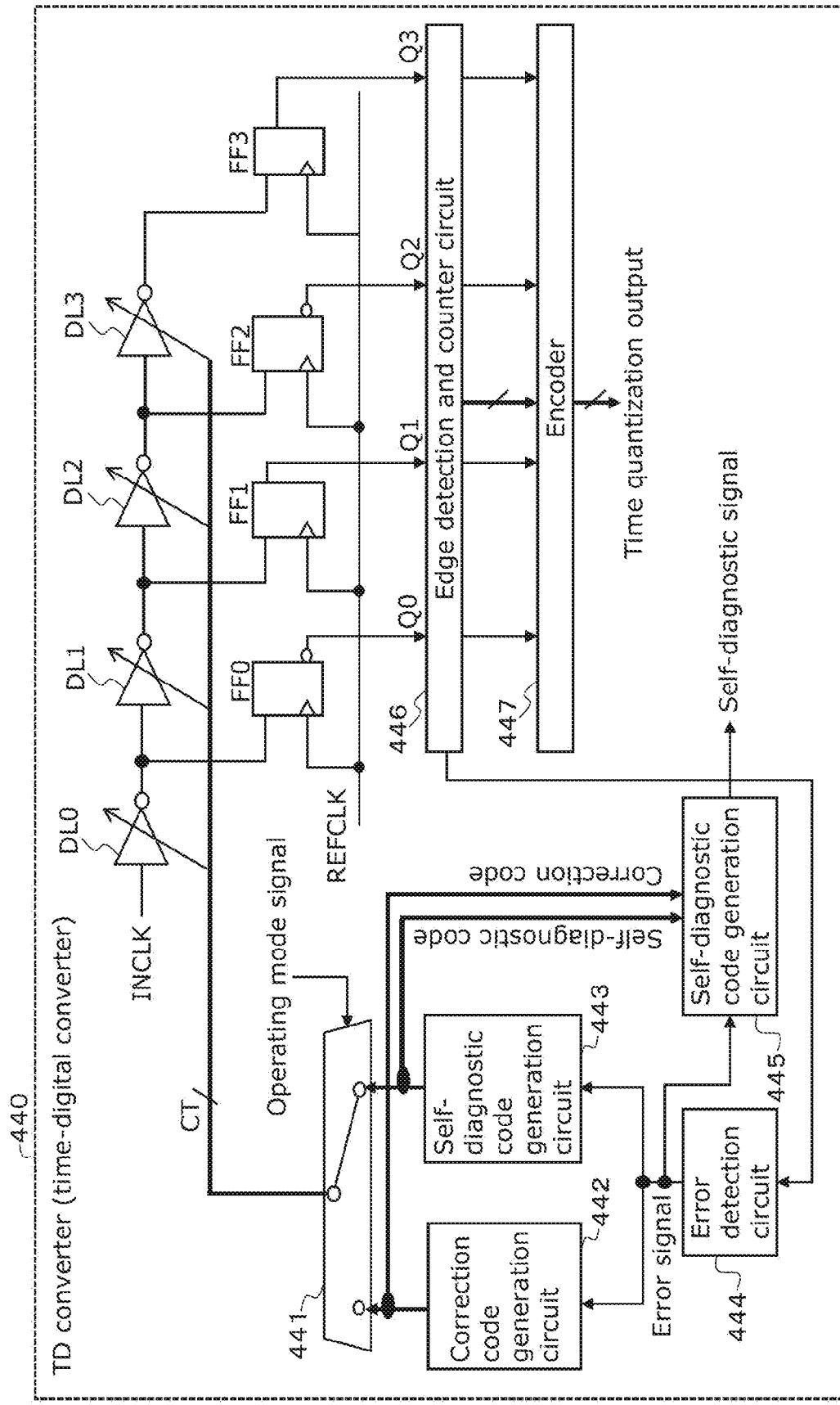
FIG. 40 is a block diagram illustrating a correction mechanism of a time-to-digital converter (TDC) according to Embodiment 10.
Figure 41:
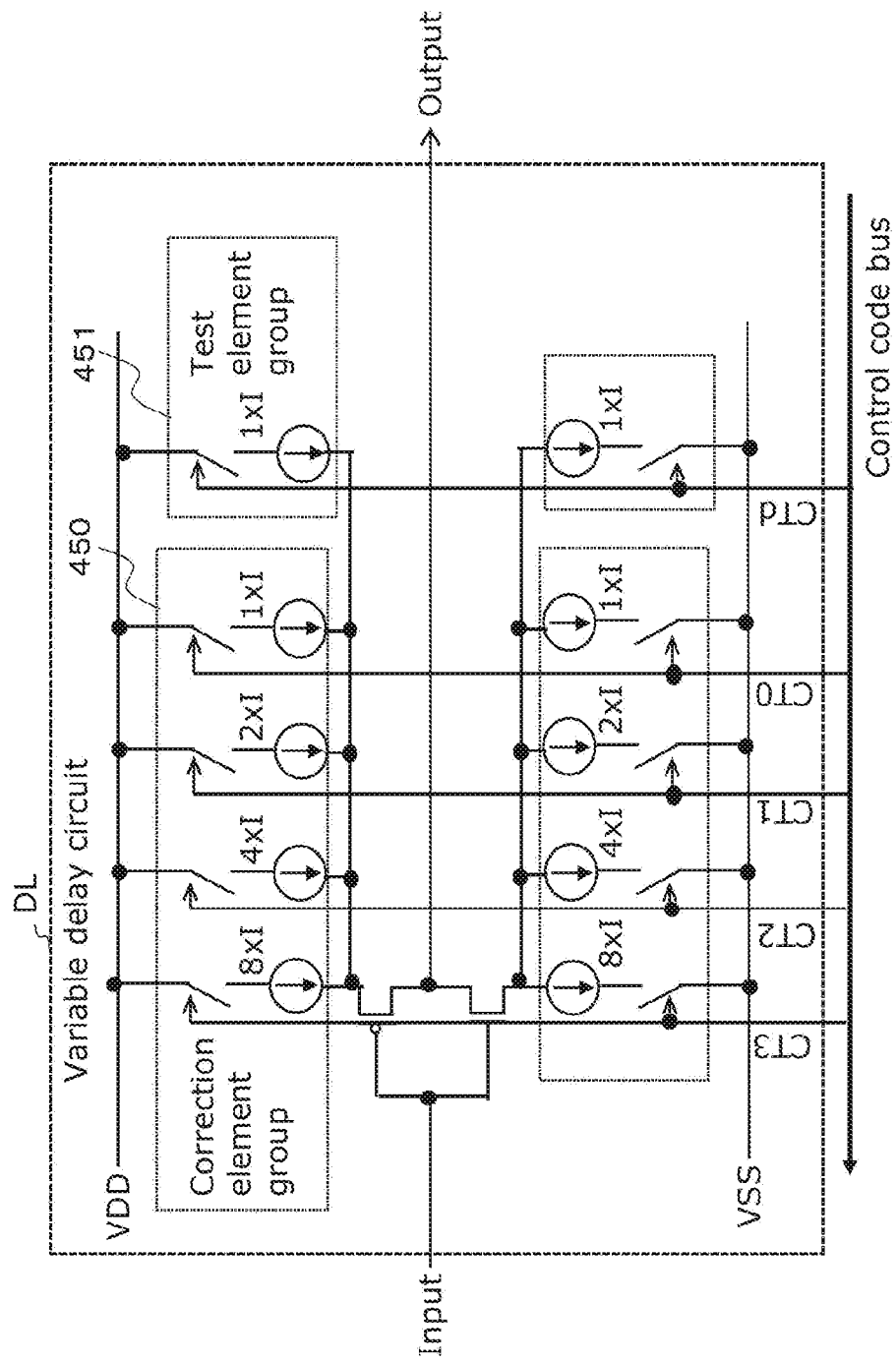
FIG. 41 is a circuit diagram illustrating an example of a delay circuit according to Embodiment 10.

FIG. 40 shows a circuit block according to the present disclosure, and FIG. 41 shows a variable delay circuit.

In the present disclosure, test element group 451 is added to variable delay controllers (DL0, DL1, DL2, DL3), and a block for correction, testing, and diagnosis including selector 441, correction code generation circuit 442, self-diagnostic code generation circuit 443, error detection circuit 444, and self-diagnostic circuit 445 is added.

As shown by FIG. 41, the variable delay circuit includes correction element group 450 and test element group 451, adjusts the amount of a bias current using a control code (CT3, CT2, CT1, CT0)(CTd), and controls the amount of delay.

An MOS transistor includes a bias current source.

The testing and diagnosis of a weight can be performed in the same manner as the testing and diagnosis of a weight of a comparator according to Embodiment 2 and the method of testing and diagnosing a weight of an amplifier gain according to Embodiment 5.

Specifically, when the MSB of a correction element is tested, it is possible to test and diagnose a relative weight between correction elements with reference to a test element by setting (CT3, CT2, CT1, CT0)(CTd) as (1, 0, 0, 0)(0); integrating items of quantization information obtained from flip-flops (FF0, FF1, FF2, FF3) to obtain a first integration result; setting (CT3, CT2, CT1, CT0)(CTd) as (0, 1, 1, 1)(1);

integrating items of quantization information obtained from the flip-flops (FF0, FF1, FF2, FF3) to obtain a second integration result; and comparing the first integration result and the second integration result.

As stated above, in a semiconductor circuit according to Embodiment 10, a measured signal is a pulse signal having 1 or 0, a data converter is a time-to-digital converter that compares a phase difference between the pulse signal and a reference clock signal and converts the pulse signal into a digital signal, and a correction element group corrects a timing of the pulse signal for transition between 1 and 0.

Here, the time-to-digital converter may include: delay circuits at stages capable of controlling the amounts of delay; a correction element group that corrects the amounts of delay of the delay circuits; a test element group that tests the correction element group; a flip-flop group that compares the pulse signal and a delay stage output by taking logic of an output of each of the delay circuits according to an edge timing of the pulse signal; a counter that obtains an integration result obtained by integrating digital output signals of the flip-flop group; and an encoder that takes and encodes the digital output signals of the flip-flop group. The time-to-digital converter may perform self-diagnosis of the correction element group, based on the integration result.

Embodiment 11

In Embodiment 2, a varactor capacitor of an MOS is a correction element (FIG. 14); in Embodiment 7, a differential pair array of an MOS is a correction element (FIG. 35); in Embodiment 8, a capacitor array is a correction element (FIG. 37); and in Embodiment 10, a current source array (actually an MOS transistor array) is a correction element (FIG. 41).

As above, various devices are applied to correction elements. The following describes, as Embodiment 11, an example of a correction element including resistors.

Figure 42:
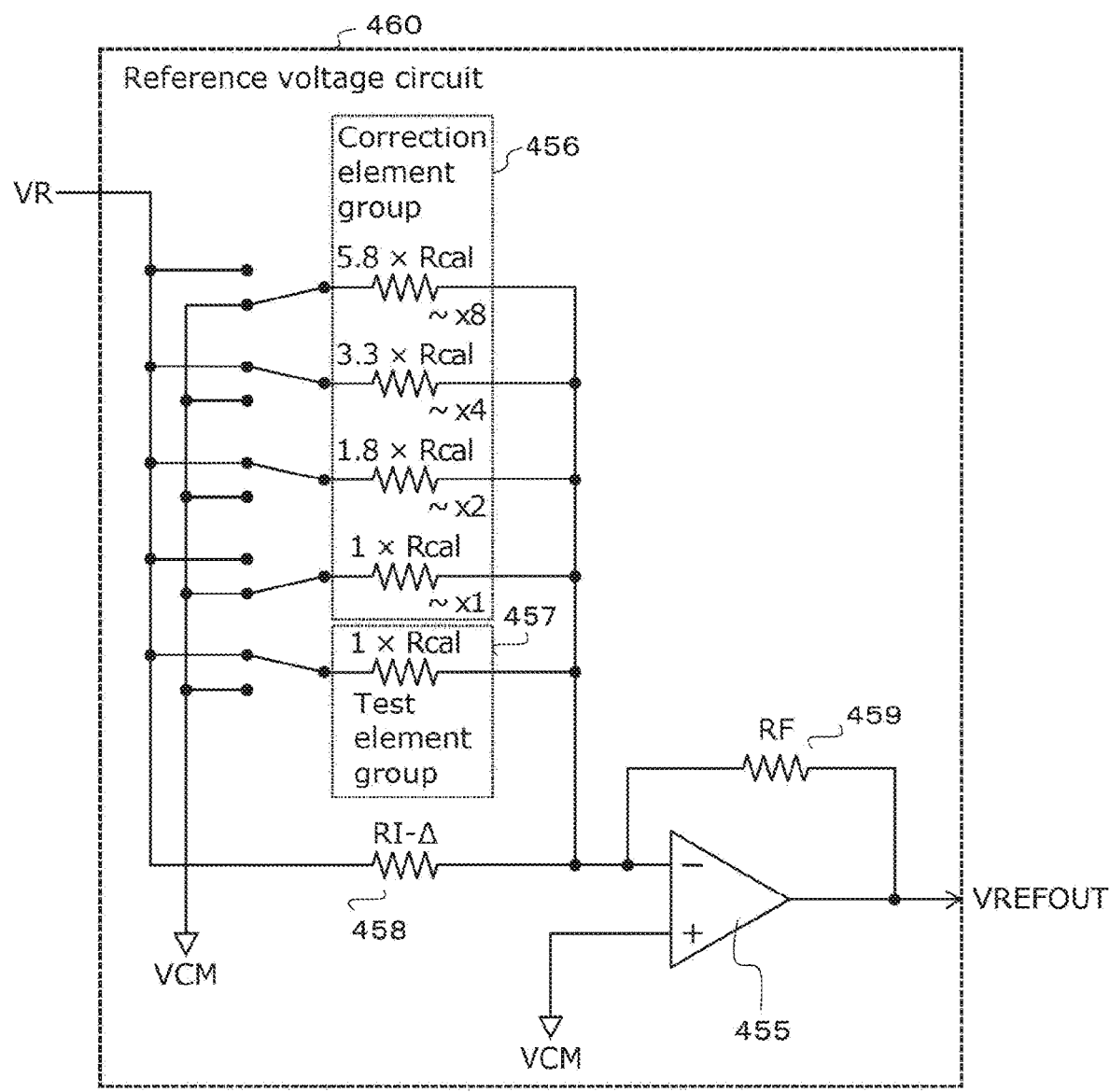
FIG. 42 is a circuit diagram illustrating an example of a reference voltage circuit according to Embodiment 11.

FIG. 42 is a circuit diagram illustrating an example of a reference voltage circuit according to Embodiment 11 of the present disclosure.

The following describes a configuration.

Input resistor 458 (RI–Δ) and feedback resistor 459 (RF) are connected in series. A common connecting point of input resistor 458 and feedback resistor 459 is connected to an inverting input terminal of amplifier 455. Reference voltage VCM is connected to a non-inverting input terminal of amplifier 455. One end of feedback resistor 459 is connected to an output of amplifier 455.

Reference voltage VR is inputted to an input of input resistor 458.

As above, the configuration is an inverting amplifier configuration and amplifies a voltage level.

Correction element group 456 for fine adjustment and test element group 457 for testing correction element group 456 are connected in parallel to input resistor 458 (RI–Δ). Whether inputs of correction element group 456 and test element group 457 are VR or VCM is controlled according to a control signal not shown, and a voltage level is corrected.

By allowing the input of test element group 457 to switch between VR and VCM only at the time of testing, and setting the input of test element group 457 to VCM at a time other than the time of testing, weights of the resistors of correction element group 456 are tested.

Output voltage VREFOUT can be used to correct characteristics of each analog block when, for example, a DAC gain is adjusted using output voltage VREFOUT as a reference voltage of an ADC or output voltage VREFOUT is used as a voltage for adjusting a bias current.

The testing and diagnosis of a weight can be performed in the same manner as the testing and diagnosis of a weight of a comparator according to Embodiment 2 and the method of testing and diagnosing a weight of an amplifier gain according to Embodiment 5.

A correction element group is tested and diagnosed using a comparator in the ADC that receives VREFOUT as a reference voltage, or a sub ADC conversion result.

As above, regarding the resistors used as the correction element, it is possible to test and diagnose a weight using the method according to the present disclosure.

As described above, in a semiconductor circuit according to Embodiment 11, a correction element and a test element each include at least one of a capacitive element, a resistive element, or an MOS transistor, and are used in correcting an analog voltage or time.

Embodiment 12

It is possible to perform the same testing and diagnosis with reference to a test element on a reverse polarity side such as using an N-side test element when a P-side correction element is tested (FIG. 14) in Embodiment 2 intended for an offset of a comparator.

Figure 43A:
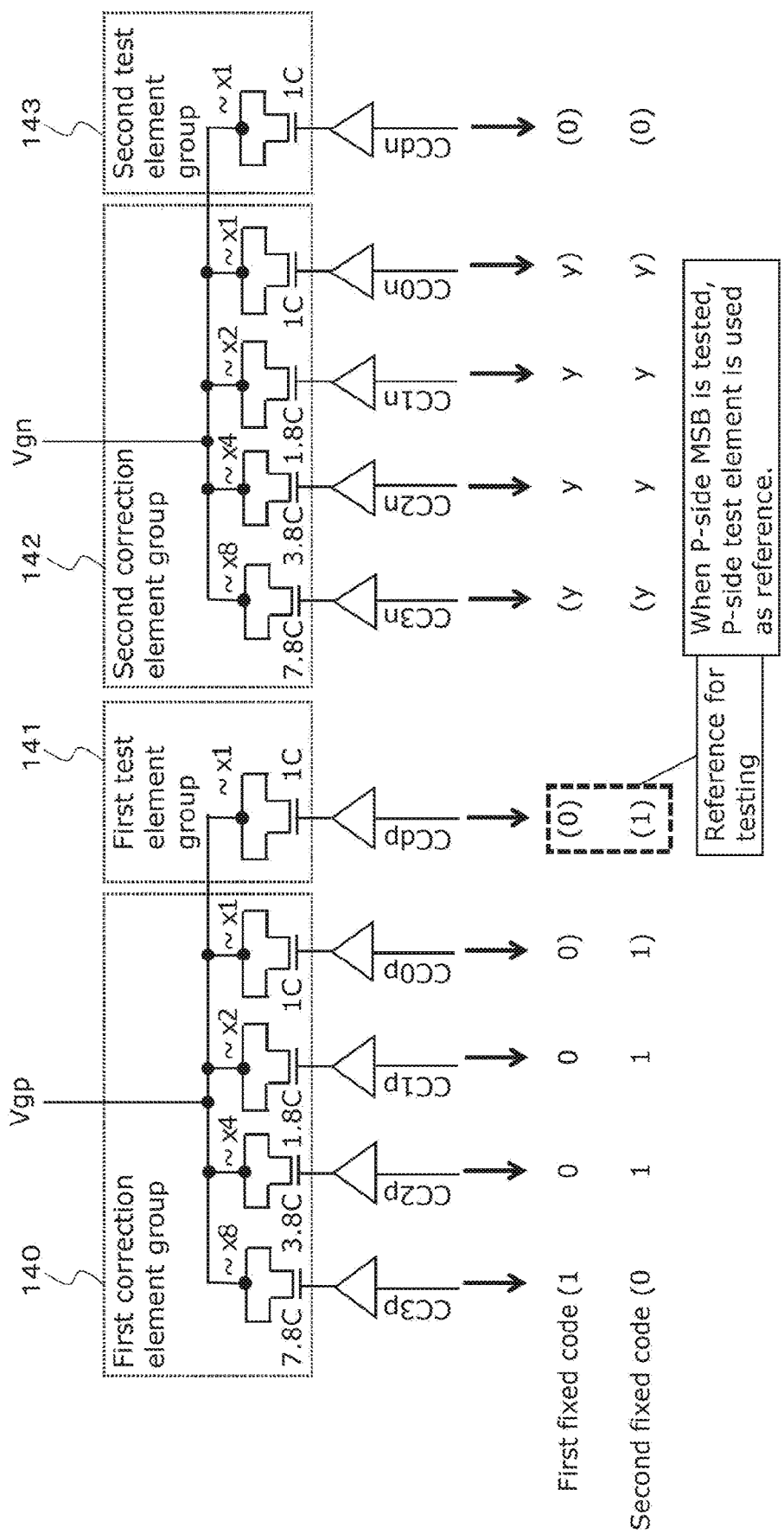
FIG. 43A is a diagram illustrating an example when test elements having a reverse polarity are controlled according to Embodiment 12.

FIG. 43A and FIG. 43B each show an example when test elements having a reverse polarity are controlled.

Although FIG. 43A and FIG. 43B each show an example when P-side MSB testing is performed, it is possible to generate codes for other bits using the same principle.

Although FIG. 43A shows Embodiment 2, a P-side test element is used as a reference for testing P-side correction elements in FIG. 43A.

In contrast, FIG. 43B shows Embodiment 12, and N-side correction elements are used in FIG. 43B.

In an offset of a comparator, since amount of P-side correction Vcalp and amount of N-side correction Vcalm "operate with a reverse sign," "1" is used for a N-side test bit in a first fixed code. This is equivalent to a P-side code subtracting a decimal number of 1 from a decimal number of 8.

Next, "0" is used for an N-side test bit in a second fixed code. This is equivalent to the P-side code subtracting a decimal number of 0 from a decimal number of 7 (doing nothing).

Accordingly, it is possible to test and diagnose the weight of the MSB of the P-side correction element by comparing a first integration result and a second integration result obtained using the first fixed code and the second fixed code.

In a circuit (FIG. 39) indicating an example of the capacitor corrector in Embodiment 9 intended for the DAC gain correction element, it is also possible to perform the same testing and diagnosis with reference to a test element on a reverse polarity side.

Figure 44A:
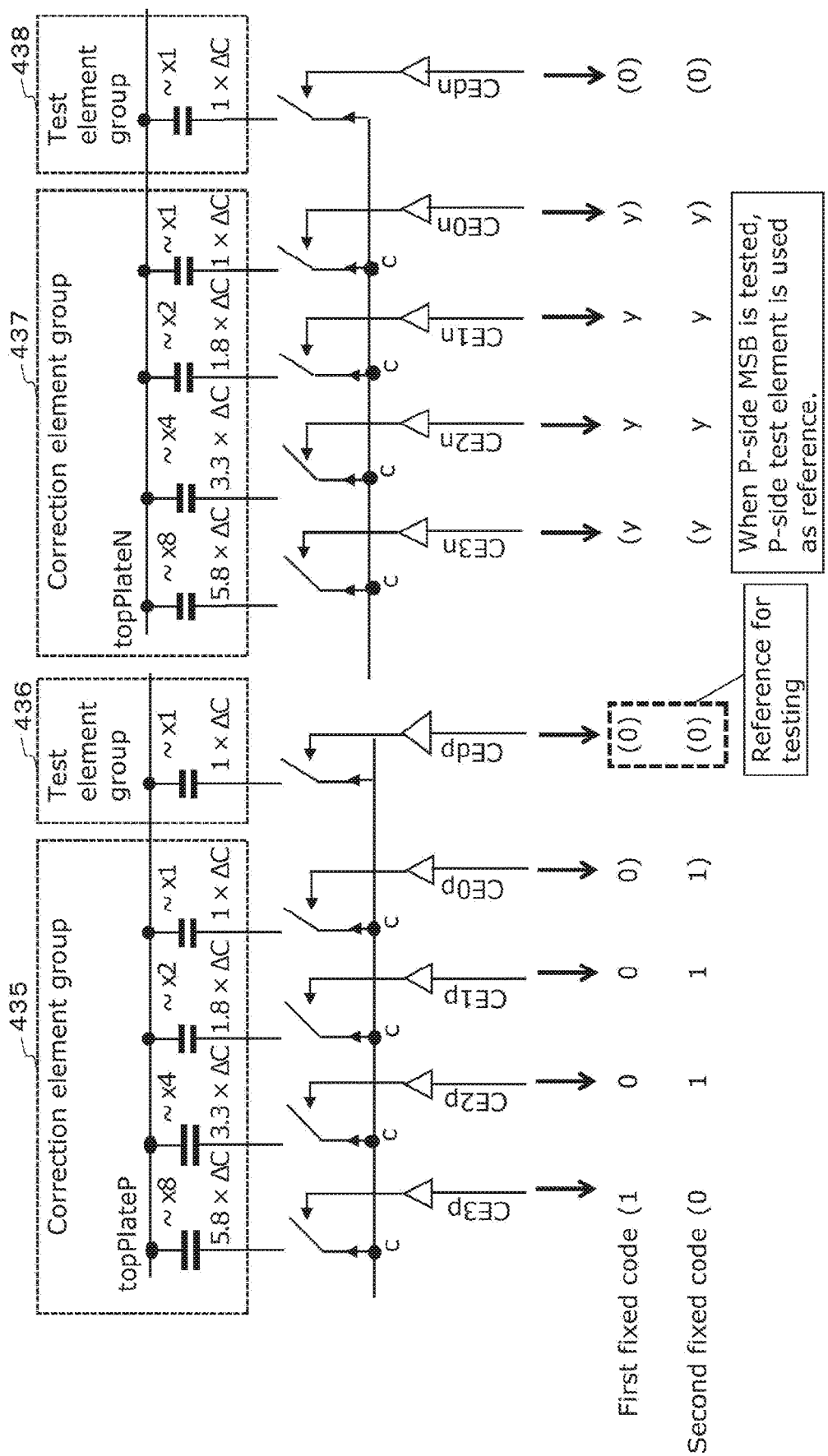
FIG. 44A is a diagram illustrating an example when the test elements having the reverse polarity are controlled according to Embodiment 12.
Figure 44B:
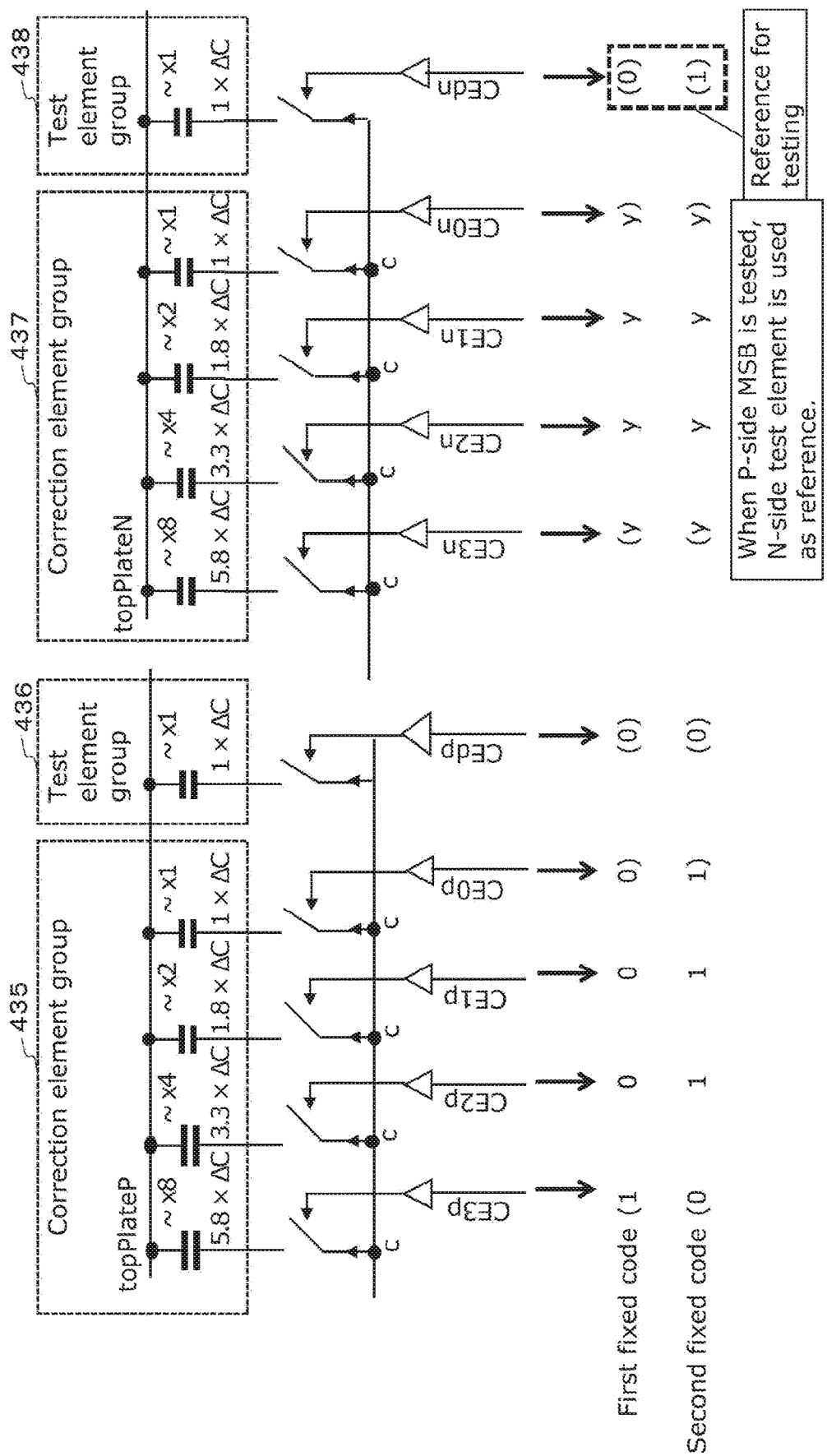
FIG. 44B is a continuation of FIG. 44A and is a diagram illustrating an example when the test elements having the reverse polarity are controlled.

FIG. 44A and FIG. 44B each show an example when test elements having a reverse polarity are controlled.

Although FIG. 44A and FIG. 44B each show an example when P-side MSB testing is performed, it is possible to generate codes for other bits using the same principle.

Although FIG. 44A shows Embodiment 9, a P-side test element is used as a reference for testing P-side correction elements in FIG. 44A.

In contrast, FIG. 44B shows Embodiment 12, and N-side correction elements are used in FIG. 44B.

When correction capacitors are included on the positive and negative sides of a differential such as DAC gain correction elements, the amount of P-side correction and the amount of N-side correction "operate with the same sign."

To put it another way, even when a correction capacitor of whichever polarity is increased, a DAC gain decreases.

Thus, when a method of controlling the test elements having the reverse polarity is employed, "0" is used for the N-side test bit in the first fixed code.

This is equivalent to the P-side code adding a decimal number of 0 to a decimal number of 8 (doing nothing).

Next, "1" is used for the N-side test bit in the second fixed code.

This is equivalent to the P-side code adding a decimal number of 1 to a decimal number of 7.

Accordingly, it is possible to test and diagnose the weight of the MSB of the P-side correction element by comparing a first integration result and a second integration result obtained using the first fixed code and the second fixed code.

As above, when correction elements and test elements are located on the both sides of a differential circuit, it is clear that whichever polarity may be used as a test element or a combination of the polarities may be used.

As stated above, in the semiconductor circuit according to Embodiment 12, the analog-to-digital converter is a pipelined analog-to-digital converter and includes a residue amplifier and one or more comparators, the residue amplifier is an open-loop integrating amplifier, the analog-to-digital converter includes, as a circuit configuration for adjusting a gain of the residue amplifier, a correction element group on each of a positive-side transmission path and a negative-side transmission path in each of the one or more comparators or a correction element group for adjusting the amount of delay used for adjusting an amplification time of the residue amplifier, and the digital circuit tests the correction element group using an integration result of each of the one or more comparators.

Embodiment 13

Hereinafter, a circuit configuration and an operation according to Embodiment 13 will be described with reference to the drawings.

Figure 45:
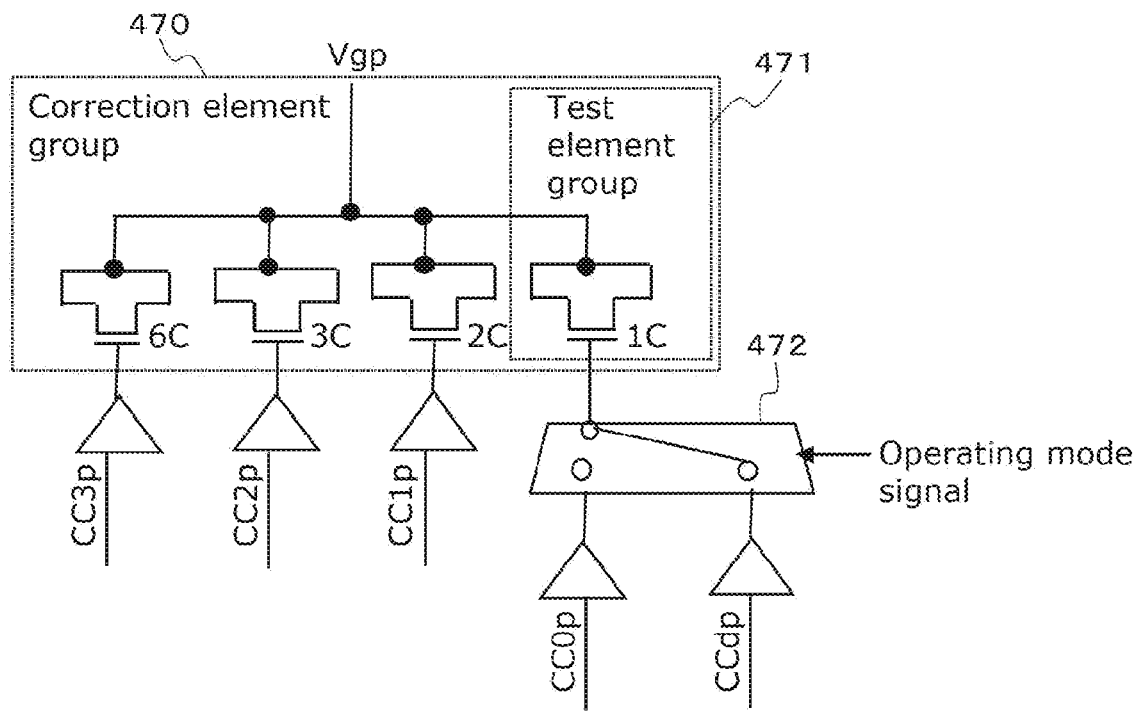
FIG. 45 is a diagram illustrating an example of an offset controller of a comparator according to Embodiment 13.

The offset correction element of the comparator according to Embodiment 2 is tested and diagnosed, and an example of the offset controller of the comparator shown by FIG. 45 is used.

In FIG. 45, 1 LSB of a correction element group doubles as a test element group.

In the example shown by the figure, there are no means to test 2C of (LSB+1), but it is possible to test and diagnose a capacitor weight of at least (LSB+2) (i.e., at least (MSB−1)).

However, since (6C, 3C, 2C, 1C) in the figure is equivalent to (3C, 1.5C, 1C, 0.5C) in a proportional relationship, (6C, 3C, 2C, 1C) can be considered as a correction capacitor array in which a test element is 0.5 C and which has a weight of at most 1.5.

Unfortunately, since the test element is equivalent to 0.5 C, the correction capacitor array is disadvantageous in that a correction range for a bit count is reduced.

The embodiments according to the present disclosure have been described above.

It should be noted that the present disclosure is not limited to the configurations of the afore-mentioned embodiments, and undoubtedly encompasses various modifications and changes conceivable by a person skilled in the art within the scope of the present disclosure.

As stated above, in the semiconductor circuit according to Embodiment 13, the one or more correction elements double as the one or more test elements.

Although one or more semiconductor circuits according to one or more aspects of the present disclosure have been described based on the embodiments, the present disclosure is not limited to these embodiments. Forms obtained by making various modifications conceived by a person skilled in the art to the embodiments or forms obtained by combining constituent elements in different embodiments may be included in the scope of the one or more aspects of the present disclosure, as long as they do not depart from the essence of the present disclosure.

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

A semiconductor circuit according to the present disclosure is applicable to a data converter such as an analog-to-digital converter and a time-to-digital converter.

The invention claimed is:

1. A semiconductor circuit including a data converter that outputs a digital output signal corresponding to a measured signal, the semiconductor circuit comprising:
   an analog circuit that quantizes the measured signal inputted; and
   a digital circuit that outputs the digital output signal,
   wherein the analog circuit includes:
      a correction element group including one or more correction elements each for correcting nonlinearity that occurs during a process of converting the measured signal into the digital output signal in the analog circuit; and
      a test element group including one or more test elements for testing the one or more correction elements,
   the digital circuit tests the correction element group using the test element group,
   the digital circuit includes:
      a self-diagnostic code generation circuit that generates a self-diagnostic code for (i) enabling or disabling each of the one or more correction elements included in the correction element group and (ii) enabling or disabling each of the one or more test elements included in the test element group;
      an error detection circuit that detects, as an error signal, a difference between a quantizer output signal of the analog circuit and a predetermined threshold value, the quantizer output signal being outputted in response to the self-diagnostic code; and
      a self-diagnostic circuit that generates a self-diagnostic signal indicating a diagnostic result of the correction element group, based on the error signal,
   the self-diagnostic code includes a first fixed code and an optimum code,
   the one or more correction elements are three or more correction elements,
   the first fixed code is for (i) enabling a single correction element selected as a test target from the correction element group and (ii) disabling other correction elements included in the correction element group and the one or more test elements, the optimum code is for minimizing the error signal relative to the first fixed code and is generated by binary search, and the self-diagnostic circuit:
calculates an integrated value of the error signal corresponding to a combination of the first fixed code and the optimum code; and
determines whether the integrated value falls within a predetermined range, and determines the correction element group as being faulty when the integrated value falls outside the predetermined range.

2. A semiconductor circuit including a data converter that outputs a digital output signal corresponding to a measured signal, the semiconductor circuit comprising:
an analog circuit that quantizes the measured signal inputted; and
a digital circuit that outputs the digital output signal,
wherein the analog circuit includes:
a correction element group including one or more correction elements each for correcting nonlinearity that occurs during a process of converting the measured signal into the digital output signal in the analog circuit; and
a test element group including one or more test elements for testing the one or more correction elements,
the digital circuit tests the correction element group using the test element group,
the digital circuit includes:
a self-diagnostic code generation circuit that generates a self-diagnostic code for (i) enabling or disabling each of the one or more correction elements included in the correction element group and (ii) enabling or disabling each of the one or more test elements included in the test element group;
an error detection circuit that detects, as an error signal, a difference between a quantizer output signal of the analog circuit and a predetermined threshold value, the quantizer output signal being outputted in response to the self-diagnostic code; and
a self-diagnostic circuit that generates a self-diagnostic signal indicating a diagnostic result of the correction element group, based on the error signal,
the self-diagnostic code includes a first fixed code, a second fixed code, and an optimum code,
the one or more correction elements are three or more correction elements,
the first fixed code is for (i) enabling a single correction element selected as a test target from the correction element group and (ii) disabling other correction elements included in the correction element group and the one or more test elements,
the optimum code is for minimizing the error signal relative to the first fixed code and is generated by binary search,
the measured signal is a differential signal including a first polarity signal and a second polarity signal,
the correction element group includes a first element group connected to a transmission path for the first polarity signal, and a second element group connected to a transmission path for the second polarity signal,
the first fixed code corresponds to the first element group and is for disabling the second element group, the second fixed code is for (i) disabling a single correction element selected as a test target from the first element group, (ii) enabling, among other correction elements included in the first element group, a correction element having a weight smaller than a weight of the single correction element selected, and (iii) enabling the one or more test elements, the optimum code corresponds to the second element group and is for disabling the first element group, and the self-diagnostic circuit:
calculates a first integrated value by integrating the error signal corresponding to a combination of the first fixed code and the optimum code;
calculates a second integrated value by integrating the error signal corresponding to a combination of the second fixed code and the optimum code; and
determines a magnitude relationship between the first integrated value and the second integrated value, and determines the single correction element selected as the test target as being faulty when the magnitude relationship fails to satisfy a predetermined condition.

3. The semiconductor circuit according to claim 1, wherein the self-diagnostic circuit sequentially selects a single correction element as a test target from the correction element group.

4. The semiconductor circuit according to claim 1, wherein the one or more correction elements double as the one or more test elements.

5. The semiconductor circuit according to claim 1,
wherein the correction element group includes a plurality of correction elements weighted, and
the one or more test elements each have a weight smaller than or equal to a smallest weight of a correction element included in the correction element group.

6. The semiconductor circuit according to claim 1, wherein the one or more correction elements and the one or more test elements each include at least one of a capacitive element, a resistive element, or a MOS transistor, and are used in correcting an analog voltage or time.

7. A semiconductor circuit including a data converter that outputs a digital output signal corresponding to a measured signal, the semiconductor circuit comprising:
an analog circuit that quantizes the measured signal inputted; and
a digital circuit that outputs the digital output signal,
wherein the analog circuit includes:
a correction element group including one or more correction elements each for correcting nonlinearity that occurs during a process of converting the measured signal into the digital output signal in the analog circuit; and
a test element group including one or more test elements for testing the one or more correction elements,
the digital circuit tests the correction element group using the test element group,
the digital circuit includes:
a self-diagnostic code generation circuit that generates a self-diagnostic code for (i) enabling or disabling each of the one or more correction elements included in the correction element group and (ii) enabling or disabling each of the one or more test elements included in the test element group;
an error detection circuit that detects, as an error signal, a difference between a quantizer output signal of the analog circuit and a predetermined threshold value, the quantizer output signal being outputted in response to the self-diagnostic code; and
a self-diagnostic circuit that generates a self-diagnostic signal indicating a diagnostic result of the correction element group, based on the error signal,
the digital circuit causes the self-diagnostic circuit to self-diagnose each of the one or more correction elements included in the correction element group,
the self-diagnostic code generation circuit has:
an optimum correction code output mode for outputting an optimum correction code in response to the error signal so that a quantization error of the quantizer becomes minimum; and
a logic inversion code output mode for outputting a logic inversion code obtained by logically inverting a first bit signal for controlling a single correction element selected as a test target from the correction element group, the first bit signal being included in the optimum correction code, and
at time of testing, the digital circuit:
enters the optimum correction code output mode, supplies the optimum correction code to the analog circuit, and generates a first error signal, based on the error signal from the error detection circuit;
enters the logic inversion code output mode, supplies the logic inversion code to the analog circuit, and generates a second error signal, based on the error signal from the error detection circuit; and
compares magnitudes of the first error signal and the second error signal, and performs a fault diagnosis on the single correction element selected as the test target.

8. A semiconductor circuit including a data converter that outputs a digital output signal corresponding to a measured signal, the semiconductor circuit comprising:
an analog circuit that quantizes the measured signal inputted; and
a digital circuit that outputs the digital output signal,
wherein the analog circuit includes:
a correction element group including one or more correction elements each for correcting nonlinearity that occurs during a process of converting the measured signal into the digital output signal in the analog circuit; and
a test element group including one or more test elements for testing the one or more correction elements,
the digital circuit tests the correction element group using the test element group,
the digital circuit includes:
a self-diagnostic code generation circuit that generates a self-diagnostic code for (i) enabling or disabling each of the one or more correction elements included in the correction element group and (ii) enabling or disabling each of the one or more test elements included in the test element group;
an error detection circuit that detects, as an error signal, a difference between a quantizer output signal of the analog circuit and a predetermined threshold value, the quantizer output signal being outputted in response to the self-diagnostic code; and
a self-diagnostic circuit that generates a self-diagnostic signal indicating a diagnostic result of the correction element group, based on the error signal,
the digital circuit causes the self-diagnostic circuit to self-diagnose each of the one or more correction elements included in the correction element group,
the self-diagnostic code generation circuit has a first weight test code output mode and a second weight test code output mode,
in the first weight test code output mode, the self-diagnostic code generation circuit:
sets a first bit signal to 1 or 0, the first bit signal being for controlling a first correction element selected as a test target from the correction element group;
causes a second correction bit signal group to have an inverted logical value of the first bit signal, the second correction bit signal group being for controlling a correction element having an adjustment weight smaller than an adjustment weight of the first correction element;
causes a test bit signal to have the inverted logical value of the first bit signal, the test bit signal being for controlling the one or more test elements; and
outputs one or more other bit signals as one or more predetermined fixed signals,
in the second weight test code output mode, the self-diagnostic code generation circuit:
causes the first bit signal to have an inverted logical value when the first weight test code output mode is set;
causes the second correction bit signal group to have the inverted logical value of the first bit signal;
causes the test bit signal to have the inverted logical value of the first bit signal; and
outputs one or more other bit signals as one or more predetermined fixed signals, and
at time of testing, the digital circuit:
enters the first weight test code output mode and generates a first error signal, based on the error signal from the error detection circuit;
enters the second weight test code output mode and generates a second error signal, based on the error signal from the error detection circuit; and
calculates a difference between the first error signal and the second error signal, and performs a weighted diagnosis on the correction element group.

9. A semiconductor circuit including a data converter that outputs a digital output signal corresponding to a measured signal, the semiconductor circuit comprising:
an analog circuit that quantizes the measured signal inputted; and
a digital circuit that outputs the digital output signal,
wherein the analog circuit includes:
a correction element group including one or more correction elements each for correcting nonlinearity that occurs during a process of converting the measured signal into the digital output signal in the analog circuit; and
a test element group including one or more test elements for testing the one or more correction elements,
the digital circuit tests the correction element group using the test element group,
the digital circuit includes:
a self-diagnostic code generation circuit that generates a self-diagnostic code for (i) enabling or disabling each of the one or more correction elements included in the correction element group and (ii) enabling or disabling each of the one or more test elements included in the test element group;
an error detection circuit that detects, as an error signal, a difference between a quantizer output signal of the analog circuit and a predetermined threshold value, the quantizer output signal being outputted in response to the self-diagnostic code; and a self-diagnostic circuit that generates a self-diagnostic signal indicating a diagnostic result of the correction element group, based on the error signal, the digital circuit causes the self-diagnostic circuit to self-diagnose each of the one or more correction elements included in the correction element group, the data converter includes an input switch that switches a signal to be inputted to the data converter between the measured signal and the reference signal, the self-diagnostic code generation circuit has an optimum correction code output mode for outputting an optimum correction code so that a quantization error of the quantizer becomes minimum, at time of testing, the digital circuit:

enters the optimum correction code output mode, selects a first reference signal using the input switch, and calculates the optimum correction code as a first optimum correction code;

enters the optimum correction code output mode, selects a second reference signal using the input switch, and calculates the optimum correction code as a second optimum correction code; and calculates a difference between the first optimum correction code and the second optimum correction code, and performs a correction range diagnosis on the correction element group.

10. The semiconductor circuit according to claim 7, wherein the analog circuit includes:

a differential circuit;

a first element group including one or more correction elements and one or more test elements connected to a positive-side input path of the differential circuit; and a second element group including one or more correction elements and one or more test elements connected to a negative-side input path of the differential circuit, the correction element group and the test element group include the first element group and the second element group, the self-diagnostic code generation circuit has a first set test mode for testing the first element group, and a second set test mode for testing the second element group, and the digital circuit tests the first element group and the second element group individually.

11. The semiconductor circuit according to claim 7, wherein the analog circuit has a redundant configuration that includes:

a first element group belonging to a single node and including the correction element group and the test element group; and a second element group having a same weight and a same configuration as the first element group, the self-diagnostic code generation circuit has a first set test mode for testing the first element group, and a second set test mode for testing the second element group, and the digital circuit tests the first element group and the second element group individually.

12. The semiconductor circuit according to claim 10, wherein in the first set test mode, the self-diagnostic code generation circuit:

sets, for the first element group, a first bit signal to 1 or 0, the first bit signal being for controlling the single correction element selected as the test target;

causes a second correction bit signal group to have an inverted logical value of the first bit signal, the second correction bit signal being for controlling a correction element included in the correction element group and having an adjustment weight smaller than an adjustment weight of a first correction element included in the correction element group;

causes a test bit signal to have the inverted logical value of the first bit signal, the test bit signal being for controlling the one or more test elements;

outputs other bit signals as predetermined fixed signals; and outputs, to the second element group, the optimum correction code so that the quantization error of the quantizer becomes minimum, in the first set test mode, the digital circuit:

generates a first error signal, based on the error signal from the error detection circuit;

causes, for a control code for the first element group, the first bit signal to have an inverted logical value of a bit signal at a first step;

causes the second correction bit signal group to have the inverted logical value of the bit signal at the first step;

causes the test bit signal to have the inverted logical value of the bit signal at the first step;

outputs other bit signals as predetermined fixed signals;

outputs the optimum correction code continuously to the second element group;

generates a second error signal as an output of the error detection circuit; and determines magnitudes of the first error signal and the second error signal at a transition point of the quantizer at which the quantization error is minimum, to test whether a weight is smaller than or equal to a predetermined value, and in the second set test mode, the digital circuit performs a process which is similar to a process in the first set test mode and in which the first element group and the second element group are interchanged in the first set test mode.

13. The semiconductor circuit according to claim 10, wherein when the one or more correction elements included in the first element group are tested, the one or more test elements included in the second element group are used, and when the one or more correction elements included in the second element group are tested, the one or more test elements included in the first element group are used.

14. The semiconductor circuit according to claim 1, wherein the data converter is an analog-to-digital converter.

15. The semiconductor circuit according to claim 14, wherein the analog-to-digital converter includes:

one or more comparators each of which includes a differential circuit; and a correction element group and a test element group on each of a positive-side transmission path and a negative-side transmission path in the differential circuit so that one or more offsets of the one or more comparators are corrected, and the analog-to-digital converter tests, individually, (i) one or more correction elements included in the correction element group on the positive-side transmission path and (ii) one or more correction elements included in the correction element group on the negative-side transmission path, based on the test element group.

16. The semiconductor circuit according to claim 2, wherein the self-diagnostic circuit sequentially selects a single correction element as a test target from the correction element group.

17. The semiconductor circuit according to claim 2, wherein the one or more correction elements double as the one or more test elements.

18. The semiconductor circuit according to claim 2,
wherein the correction element group includes a plurality of correction elements weighted, and
the one or more test elements each have a weight smaller than or equal to a smallest weight of a correction element included in the correction element group.

19. The semiconductor circuit according to claim 2, wherein the one or more correction elements and the one or more test elements each include at least one of a capacitive element, a resistive element, or a MOS transistor, and are used in correcting an analog voltage or time.

20. The semiconductor circuit according to claim 2, wherein the data converter is an analog-to-digital converter.

21. The semiconductor circuit according to claim 20 wherein the analog-to-digital converter includes:
one or more comparators each of which includes a differential circuit; and
a correction element group and a test element group on each of a positive-side transmission path and a negative-side transmission path in the differential circuit so that one or more offsets of the one or more comparators are corrected, and
the analog-to-digital converter tests, individually, (i) one or more correction elements included in the correction element group on the positive-side transmission path and (ii) one or more correction elements included in the correction element group on the negative-side transmission path, based on the test element group.

* * * * *